(12) United States Patent
Nagai et al.

(10) Patent No.: US 7,476,909 B2
(45) Date of Patent: Jan. 13, 2009

(54) LIGHT EMITTING DEVICE

(75) Inventors: Youichi Nagai, Itami (JP); Hiroyuki Kitabayashi, Itami (JP); Hirohisa Saito, Itami (JP); Ayako Ikeda, Pasadena, CA (US)

(73) Assignee: Sumitomo Electric Industries, Ltd., Osaka (JP)

( * ) Notice: Subject to any disclaimer, the term of this patent is extended or adjusted under 35 U.S.C. 154(b) by 111 days.

(21) Appl. No.: 11/311,638

(22) Filed: Dec. 20, 2005

(65) Prior Publication Data

US 2006/0157717 A1   Jul. 20, 2006

(30) Foreign Application Priority Data

Dec. 20, 2004   (JP) ............... 2004-368039

(51) Int. Cl.
   *H01L 33/00*   (2006.01)
(52) U.S. Cl. .......... 257/94; 257/E33.074; 257/99; 257/98; 257/95; 257/91
(58) Field of Classification Search .......... 257/95, 257/98, E33.066, 74, 91, 99
   See application file for complete search history.

(56) References Cited

U.S. PATENT DOCUMENTS

| | | | |
|---|---|---|---|
| 6,509,651 B1 * | 1/2003 | Matsubara et al. | 257/461 |
| 2002/0074561 A1 * | 6/2002 | Sawaki et al. | 257/103 |
| 2002/0189532 A1 * | 12/2002 | Motoki et al. | 117/99 |
| 2005/0184307 A1 * | 8/2005 | Li et al. | 257/100 |

FOREIGN PATENT DOCUMENTS

| | | |
|---|---|---|
| JP | 11-054801 | 2/1999 |
| JP | 11-220176 | 8/1999 |
| JP | 2000-012900 | 1/2000 |
| JP | 2000-044400 | 2/2000 |

(Continued)

OTHER PUBLICATIONS

Jaehee Cho et al. Recent development of patterned structure light-emitting diodes, Aug. 2002, SPIE vol. 5941.*

(Continued)

*Primary Examiner*—Minh-Loan T Tran
*Assistant Examiner*—Minchul Yang
(74) *Attorney, Agent, or Firm*—McDermott Will & Emery LLP

(57) ABSTRACT

A light emitting device having a simple structure that can be easily manufactured, attaining high light emitting efficiency stably for a long time is obtained, which light emitting device includes: a GaN substrate as a nitride semiconductor substrate and, on a first main surface of the nitride semiconductor substrate, an n-type $Al_xGa_{1-x}N$ layer, a p-type $Al_xGa_{1-x}N$ layer positioned further than the n-type $Al_xGa_{1-x}N$ layer viewed from the nitride semiconductor substrate, and a quantum well positioned between the n-type $Al_xGa_{1-x}N$ layer and the p-type $Al_xGa_{1-x}N$ layer. In the light emitting device, specific resistance of the nitride semiconductor substrate is at most 0.5 Ω·cm, the side of p-type $Al_xGa_{1-x}N$ layer is mounted face-down, and the light is emitted from the second main surface 1*a* that is opposite to the first main surface of the nitride semiconductor substrate. The second main surface 1*a* of nitride semiconductor substrate has trenches formed therein.

6 Claims, 35 Drawing Sheets

FOREIGN PATENT DOCUMENTS

| | | |
|---|---|---|
| JP | 2000-286457 | 10/2000 |
| JP | 2002-368263 | 12/2002 |
| JP | 2003-008083 | 1/2003 |
| JP | 2003-023176 | 1/2003 |
| JP | 2003-258301 | 9/2003 |
| JP | 2004-006718 | 1/2004 |
| JP | 2004-031655 | 1/2004 |

OTHER PUBLICATIONS

Japanese Office Action, with English translation, issued in Japanese Patent Application No. JP 2004-368039 on Sep. 30, 2008.

* cited by examiner

EXEMPLARY OFF-ANGLE DISTRIBUTION
OF GaN SUBSTRATE (20 mm × 20 mm)

PITCH 3 μm

86 % REFLECTION IN TOTAL

67 % REFLECTION IN TOTAL

LIGHT EMITTING DEVICE

BACKGROUND OF THE INVENTION

1. Field of the Invention

The present invention relates to a light emitting device and, more specifically, to a light emitting device formed of a nitride semiconductor. The light emitting device in accordance with the present invention may simply refer to a semiconductor device or a semiconductor chip mainly formed of a nitride semiconductor substrate and a semiconductor layer stacked thereon, or a device having the semiconductor chip mounted on a mounting component and resin-sealed. The term may also refer to both types of devices. The semiconductor chip may be simply referred to as a chip. Further, of the chip, the substrate and an epitaxial layer formed thereon may simply be referred to as a substrate.

2. Description of the Background Art

A white light emitting diode (LED) is at present popularly used for illumination for small electronic equipment such as a portable information terminal, and it will possibly be used for illuminating a large space or large area. For large space or large area illumination, the LED must have higher optical output. For this purpose, it is necessary to cause a large current to flow through the LED and to solve the problem of increased temperature inherent to heat generation.

FIG. 70 shows a currently proposed structure of a GaN-based LED (Japanese Patent Laying-Open No. 2003-8083). In the GaN-based LED, an n-type GaN layer 102 is formed on a sapphire substrate 101, and between the n-type GaN layer 102 and a p-type GaN layer 104, a quantum well structure 103 is formed. Light emission occurs in quantum well structure 103. On p-type GaN layer 104, a p-electrode 105 is formed to be in ohmic contact, and on n-type GaN layer 102, an n-electrode is formed to be in ohmic contact.

These p- and n-electrodes 105 and 106 are connected to a mounting component 109. The mounting component (sub-mount component) is formed from an Si substrate, and has a circuit for protection against external surge voltage formed thereon. Specifically, in view of the fact that main cause of circuit malfunctions of III-group nitride semiconductor containing Ga, Al, In or the like is a surge voltage such as transient current or electrostatic discharge, a power shunt circuit for protecting the light emitting device is formed by a zener diode or the like, so as to prevent a large forward or backward voltage from being applied to the light emitting device. Protection against the surge voltage will be described in detail later.

The GaN-based LED is characterized in that (a1) p-type GaN layer 104 is mounted face-down so that light is emitted from a back surface of sapphire substrate 101, and (a2) n-electrode layer 106 is formed on n-type GaN layer 102. The structure of GaN-based LED is very complicated, as can be seen from FIG. 70. The reason why (a2) the n-electrode layer 106 is formed on n-type GaN layer 102 is that the n-electrode cannot be provided on the sapphire substrate, as sapphire substrate 101 is an insulator.

Not only in the light emitting device employing a sapphire substrate described above but also in GaAs-based, GaP-based and GaN-based compound semiconductors used for light emitting device, proposals have been often made for providing a protection circuit against transient voltage and electrostatic discharge, within the light emitting device (Japanese Patent Laying-Open Nos. 2000-286457, 11-54801 and 11-220176). Particularly in a GaN-based compound semiconductor, breakdown voltage in the backward direction is as low as about 50 V, and breakdown voltage in the forward direction is no more than about 150 V. Therefore, provision of a power shunt circuit for protection is of much importance. Specifically, the chip of the above-described GaN or other base is formed on a sub-mount Si substrate, and a protection circuit including a zener diode or the like is formed on the Si substrate. Many proposals on protection circuits as described above indicate that the main cause of circuit malfunctions of III-group nitride semiconductor containing Ga, Al, In or the like is a surge voltage such as transient current or electrostatic discharge.

Other than the light emitting device having such a protection circuit as described above, an example has been known in which a GaN-based light emitting device is formed on an SiC substrate that is a conductor. Specifically, an LED having a stacked structure of (n-electrode on back surface of SiC substrate/SiC substrate/n-type GaN layer/quantum well stacked structure (light generating layer)/p-type GaN layer/p-electrode) in which light is emitted from the p-type GaN layer has also been widely used.

Further, an example has also been known in which lattice-like trenches are formed on a substrate to provide a plurality of convex projections, for highly efficient use of light emitted from the LED (Japanese Patent Laying-Open No. 2003-23176).

In the GaN-based LED using a sapphire substrate shown in FIG. 70 described above, the structure becomes complicated, inherently increasing the manufacturing cost. To enjoy increased demand for illumination of wide space, LEDs must be inexpensive. Therefore, such a complicated structure is undesirable. Further, arrangement of p-electrode 105 and n-electrode 106 on the surface of the face-down mounting imposes limits on the area of electrodes, particularly the area of p-electrode. In order to attain high output by causing a large current flow, the area of p-electrode should desirably be as large as possible. Such increase in area is limited in the structure shown in FIG. 70, and hence, the optical output is also limited. Further, from the viewpoint of releasing heat generated by the current, arrangement of two electrodes on one surface is undesirable.

Further, a current flowing through n-type GaN layer 102 in a direction parallel to the substrate meets much resistance, resulting in heat generation and increased driving voltage and hence increased power consumption. Particularly, when the n-type GaN layer is made thin to make shorter the step of film formation, production yield of exposure of the n-type GaN film significantly decreases, in addition to the above-described problems of heat generation and increased power consumption.

Light emitting devices including the above-described device using a sapphire substrate generally have limited area of heat radiation, and have large thermal resistance (increase in temperature caused by unit energy input per unit area), and therefore, it is impossible to inject a large current per one light emitting device. When the sapphire substrate is used, the p-electrode area is limited as described above, and therefore, thermal design usually has only a very narrow margin.

Further, in the GaN-based LED using the sapphire substrate, area for heat radiation is limited, and therefore, it becomes unavoidable to adopt a structure in which p- and n-electrodes are formed in a shape of a comb to increase the area of contact, so as to reduce electrical resistance as much as possible and to reduce heat generation. Processing of such a comb-shaped electrode is difficult and leads to an increased manufacturing cost.

As described above, design of thermal conditions is of fundamental importance in a light emitting device. To attain higher output, limits imposed by the above-described thermal conditions must be overcome, and to alleviate such conditions, complicated electrode shapes must be employed.

There is also the following problem. When the GaN-based light emitting device formed on a sapphire substrate is mounted face-down so that the back surface of the sapphire substrate is used as a light emitting surface, light beams of a prescribed incident angle or larger are totally reflected at an interface between the sapphire substrate and the GaN layer that generated and propagated the light beams, and do not go out, as refractive index of sapphire is about 1.8 and that of GaN is about 2.4. Specifically, light beams of which incident angle is in the range of $\theta \geq \sin^{-1}(1.8/2.4) \approx 42°$ are confined in the GaN layer and do not go out. This leads to lower light emission efficiency at the main surface of sapphire substrate. Though light emission efficiency is important, there is a still more problem. The totally reflected light beams propagate through the GaN layer and emitted from the side portion of GaN layer. The amount of totally reflected light is considerably large and the GaN layer is thin, so that the optical energy of the light beams emitted from the side portion has a quite high energy density. Sealing resin positioned at the side portion and irradiated with the light beams is damaged, making shorter the life of the light emitting device.

In a GaN-based LED having the structure of (n-electrode on back surface of SiC substrate/SiC substrate/n-type GaN layer/quantum well stacked structure (light generating layer)/p-type GaN layer/p-electrode) in which light is emitted from the side of p-type layer, it is impossible to efficiently emit light of large output to the outside, as the p-electrode has high optical absorption index. When the coverage ratio is decreased or aperture ratio is increased of the p-electrode in order to increase the amount of light to be emitted, it becomes impossible to cause the current flow thoroughly through the GaN layer, as the p-type GaN layer has high electrical resistance. Therefore, light emission cannot fully be activated in the quantum well structure, resulting in lower optical output. Further, electrical resistance increases, causing the problems of heat generation and electrical capacitance. When the p-type GaN layer is made thick in order to cause uniform current to flow entirely through the p-type GaN layer, the p-type GaN layer absorbs much light, limiting the output.

SUMMARY OF THE INVENTION

An object of the present invention is to provide a light emitting device having a simple structure and hence allowing easy manufacturing, assuring high emission efficiency stably for a long period of time.

The present invention provides a light emitting device including a nitride semiconductor substrate and, on a first main surface of the nitride semiconductor substrate, an n-type nitride semiconductor layer, a p-type nitride semiconductor layer positioned further than the n-type nitride semiconductor layer viewed from the nitride semiconductor substrate, and a light generating layer positioned between the n-type nitride semiconductor layer and the p-type nitride semiconductor layer. In the light emitting device, specific resistance of nitride semiconductor substrate is at most 0.5 Ω·cm, the side of p-type nitride semiconductor layer is mounted face-down, and the light is emitted from the second main surface that is opposite to the first main surface of the nitride semiconductor substrate. The second main surface of nitride semiconductor substrate has trenches formed therein.

In this arrangement, the n-type electrode is provided on the back surface (second main surface) of the nitride semiconductor substrate having low electrical resistance, and therefore, even when the n-electrode is formed with small coverage ratio or large aperture ratio, it is possible to cause current to flow uniformly and entirely through the nitride semiconductor substrate. Therefore, the ratio of light absorbed at the emitting surface can be reduced and light emission efficiency can be increased. Needless to say, the light may be emitted not only from the second main surface but also from side surfaces. This is the same in the light emitting devices described in the following.

Further, the side of p-type nitride semiconductor layer having high electrical resistance does not serve as a light emitting surface, and therefore, the p-type electrode layer can be formed entirely on the surface of the p-type nitride semiconductor layer. Thus, a structure suitable for causing large current flow, suppressing heat generation and releasing the generated heat by conduction can be obtained. Specifically, limitations imposed by thermal requirements can be reduced significantly. Consequently, it becomes unnecessary to form the p- and n-electrodes in a complicated comb-shape.

As the GaN substrate has superior conductivity, a protection circuit against surge voltage becomes unnecessary, and superior withstanding characteristic can be attained.

Complicated process steps are not involved, and therefore, manufacturing cost can easily be reduced.

Further, trenches are formed on the second main surface as the light emitting surface of the nitride semiconductor substrate, and therefore light can be taken out also from the side surfaces of the trenches. As a result, efficiency of use of light from the light emitting device can be improved.

Here, the nitride semiconductor "substrate" refers to a relatively thick plate-shaped object that can be carried independently, and it is distinguished from a "film" or a "layer" that tends to deform and is difficult to carry by itself The same applies to the GaN substrate and AlN substrate, which will be described below.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
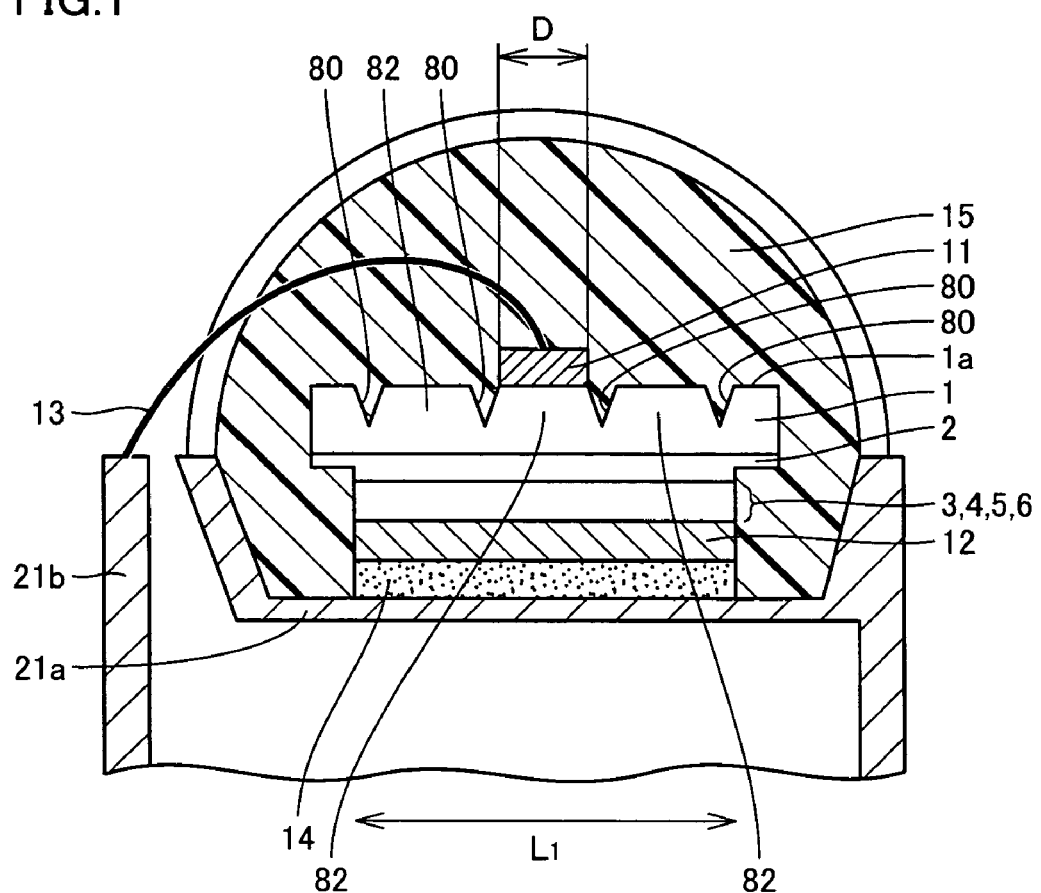
FIG. 1 shows Embodiment 1 of the LED as a light emitting device in accordance with the present invention.

Embodiments and examples of the present invention will be described in the following with reference to the figures. In the figures, the same or corresponding portions will be denoted by the same reference characters and description thereof will not be repeated.

Embodiment 1

Embodiment 1 of the LED in accordance with the present invention will be described with reference to FIGS. 1 and 2.

As shown in FIG. 1, a stacked structure including a light generating layer and the like, which will be described in detail later, is formed on the side of the first main surface of a GaN substrate 1, and a p-electrode 12 is provided. In the present embodiment, p-electrode 12 is mounted face-down on a lead frame mounting portion 21a by a conductive adhesive 14.

The second main surface 1a of GaN substrate 1 is a light emitting surface that emits light generated in the light generating layer, and an n-electrode 11 is formed on this surface. A plurality of trenches 80 extending in directions vertical to and parallel to the surface of the sheet of FIG. 1 are formed on the second main surface 1a. The n-electrode 11 is formed on a flat portion positioned between the trenches of the second main surface 1a, so as not to fully cover the second main surface. It is important to ensure that the ratio of the portion not covered by n-electrode 11 is sufficiently large. By enlarging the aperture ratio, the light intercepted by n-electrode can be reduced, and the emission efficiency for external emission of light can be improved.

The n-electrode 11 is electrically connected to a lead portion 21b of the lead frame, by a wire 13. Wire 13 and the stacked structure described above are sealed by an epoxy-based resin 15 as a sealing member. Of the above-described structure, the stacked structure from GaN substrate 1 to p-electrode 12 is shown in enlargement in FIG. 2. In FIG. 2, the stacked structure of FIG. 1 is shown up-side down.

Figure 2:
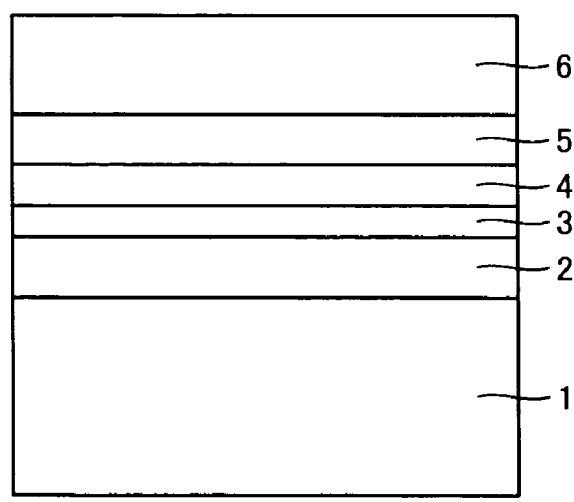
FIG. 2 shows a stacked structure including the light emitting layer of the LED shown in FIG. 1.

Referring to FIG. 2, on GaN substrate 1, an n-type GaN epitaxial layer 2 is positioned, and an n-type $Al_xGa_{1-x}N$ layer 3 is formed thereon. A quantum well (MQW: Multi-Quantum Well) 4 consisting of an $Al_xGa_{1-x}N$ layer and an $Al_xIn_yGa_{1-x-y}N$ layer is formed thereon. A p-type $Al_xGa_{1-x}N$ layer 5 is formed such that the quantum well 4 is sandwiched by this layer and $Al_xGa_{1-x}N$ layer 3. On p-type $Al_xGa_{1-x}N$ layer 5, a p-type GaN layer 6 is arranged. In the above-described structure, light is generated in quantum well 4. Further, as shown in FIG. 1, on p-type GaN layer 6, p-electrode 12 is formed to entirely cover the upper surface of p-type GaN layer 6, and mounted face-down.

Figure 3:
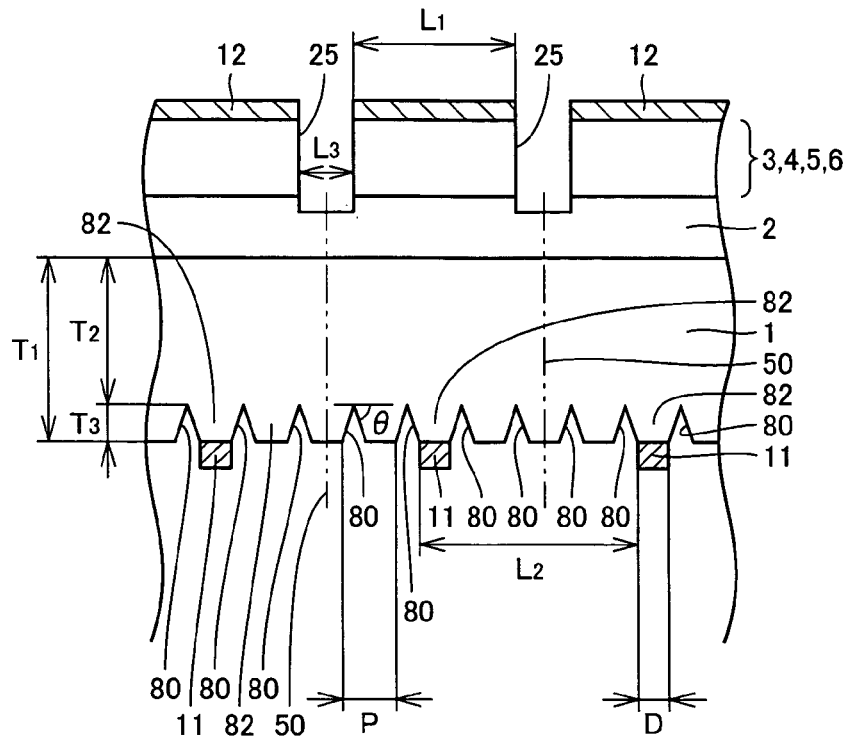
FIG. 3 shows a state of a wafer when a chip having the structure shown in FIG. 2 is taken from the wafer.
Figure 4:
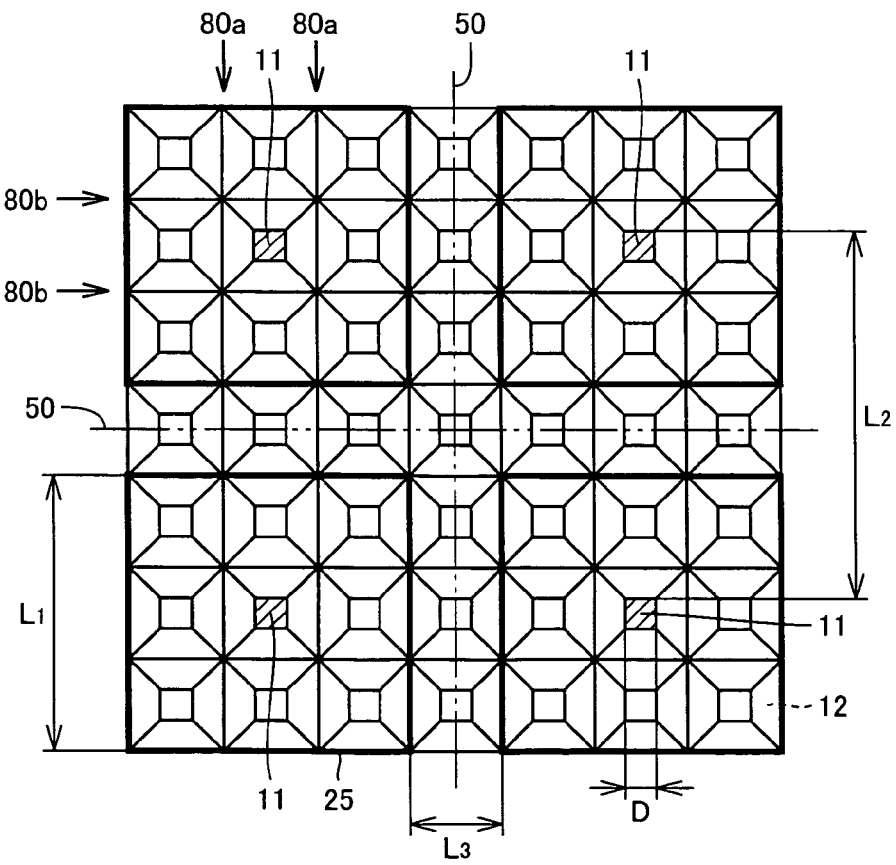
FIG. 4 shows electrode arrangement of FIG. 3.

Next, referring to FIGS. 3 and 4, the method of manufacturing the LED shown in FIGS. 1 and 2 will be briefly described.

First, a GaN substrate is prepared. On the first main surface of the GaN substrate, a stacked structure (Si-doped n-type GaN layer/Si-doped n-type $Al_{0.2}Ga_{0.9}N$ layer as a clad layer/ an MQW (Multi-Quantum Well) having a plurality of 2-layered structure of GaN layer and $In_{0.15}Ga_{0.85}N$ layer stacked/ Mg-doped p-type $Al_{0.2}Ga_{0.8}N$ layer as a clad layer/Mg-doped p-type GaN layer) is formed by a film forming technique such as MOCVD (Metal Organic Chemical Vapor Deposition). Thereafter, the wafer may be activated to reduce resistance of the Mg-doped p-type layer. The wafer is further subjected to etching with a Cl-based gas, from the side of Mg-doped p-type layer to the Si-doped n-type layer, by photolithography and RIE (Reactive Ion Etching). By this etching, element isolating trenches 25 are formed, so that elements are separated from each other.

Next, on the N surface as a back surface, that is, the second main surface of the GaN substrate, n-electrodes having a rectangular two-dimensional shape are formed each at the center of the chip, apart by a prescribed space (distance $L_2$), by photolithography, vapor deposition and lift-off method (see FIGS. 3 and 4). The n-electrode may have a stacked structure including (Ti layer/Al layer/Ti layer/Au layer) in this order from the lower side in contact with the GaN substrate. The GaN substrate is heated in a nitrogen ($N_2$) atmosphere, so that contact resistance between the n-electrode and the back surface of GaN substrate comes to have a prescribed value.

Next, as the p-electrode, a conductive layer having a prescribed thickness is formed in contact with the p-type GaN layer. As the conductive layer, an Ni layer having a prescribed thickness is formed to be in contact with the GaN layer, and an Au layer having a prescribed thickness may be formed on the entire surface thereof (see FIGS. 3 and 4). In that case, the GaN substrate may be subjected to heat treatment in an inert gas atmosphere, so that contact resistance between the p-electrode an the p-type GaN layer comes to have a prescribed value.

Next, on the back surface (N surface) of the GaN substrate, trenches 80 having a V-shaped cross section are formed by dicing. Trenches 80 include a plurality of longitudinal trenches 80a and lateral trenches 80b, as shown in FIG. 4. Here, n-electrodes 11 are positioned on flat surfaces between the trenches 80. Thereafter, as shown in FIGS. 3 and 4, scribing is performed such that a chip boundary 50 appears as a side surface, and the resulting chip is provided as the light emitting device. Referring to FIG. 1, the chip is mounted such that the side of p-type GaN layer is in contact with a mounting portion 21a of the lead frame, whereby a light emitting device is formed. By conductive adhesive 14 applied at the mounting portion, the light emitting device and the mount are fixed to each other and conduction is attained. Then, n-electrode 11 and the lead portion of lead frame are conducted by wire bonding, and an epoxy-based resin 15 is applied for resin seal, whereby a light emitting device as a lamp is provided. For better heat radiation characteristic of the light emitting device, the light emitting device may be mounted such that the entire surface of p-type GaN layer is in contact with the mounting portion. As conductive adhesive 14, an Ag-based adhesive having good thermal conductivity may be selected, and a lead frame formed of CuW based material having good thermal conductivity may be selected.

A first modification of Embodiment 1 of the LED in accordance with the present invention will be described with reference to FIGS. 5 and 6.

Figure 5:
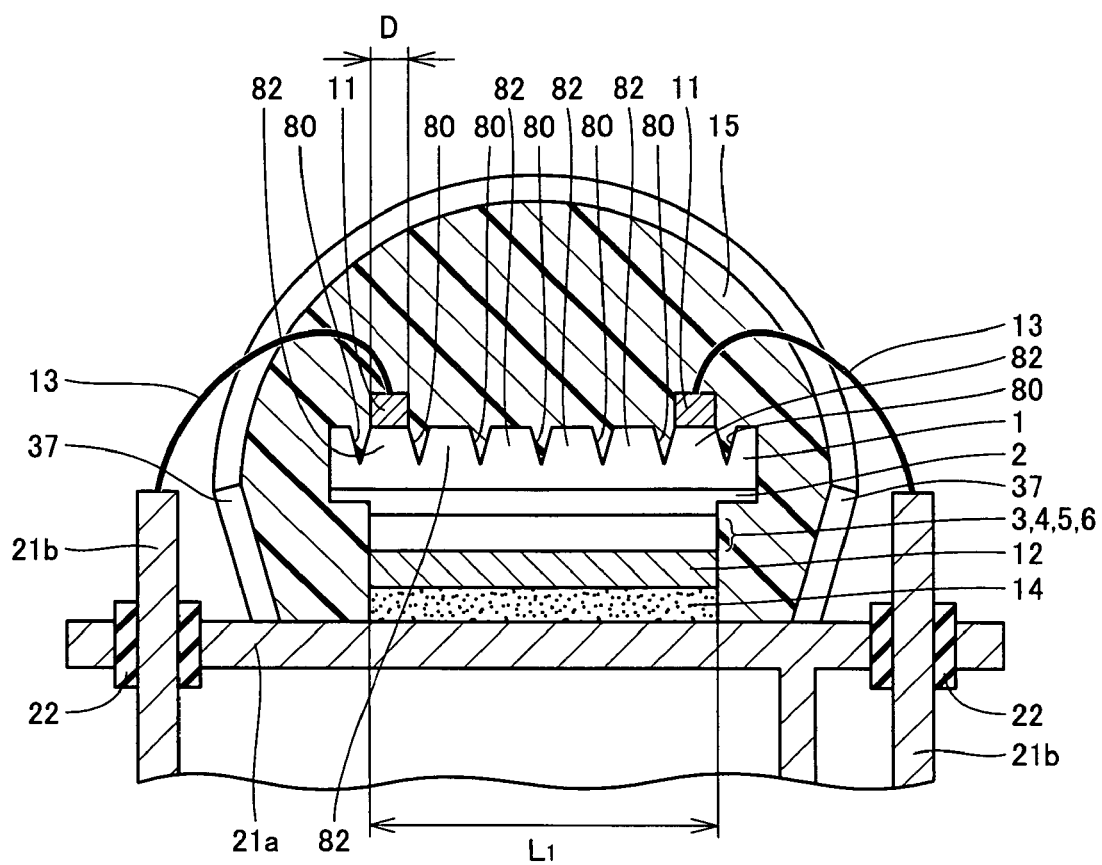
FIG. 5 shows a first modification of the LED in accordance with Embodiment 1 of the present invention shown in FIGS. 1 to 4.
Figure 6:
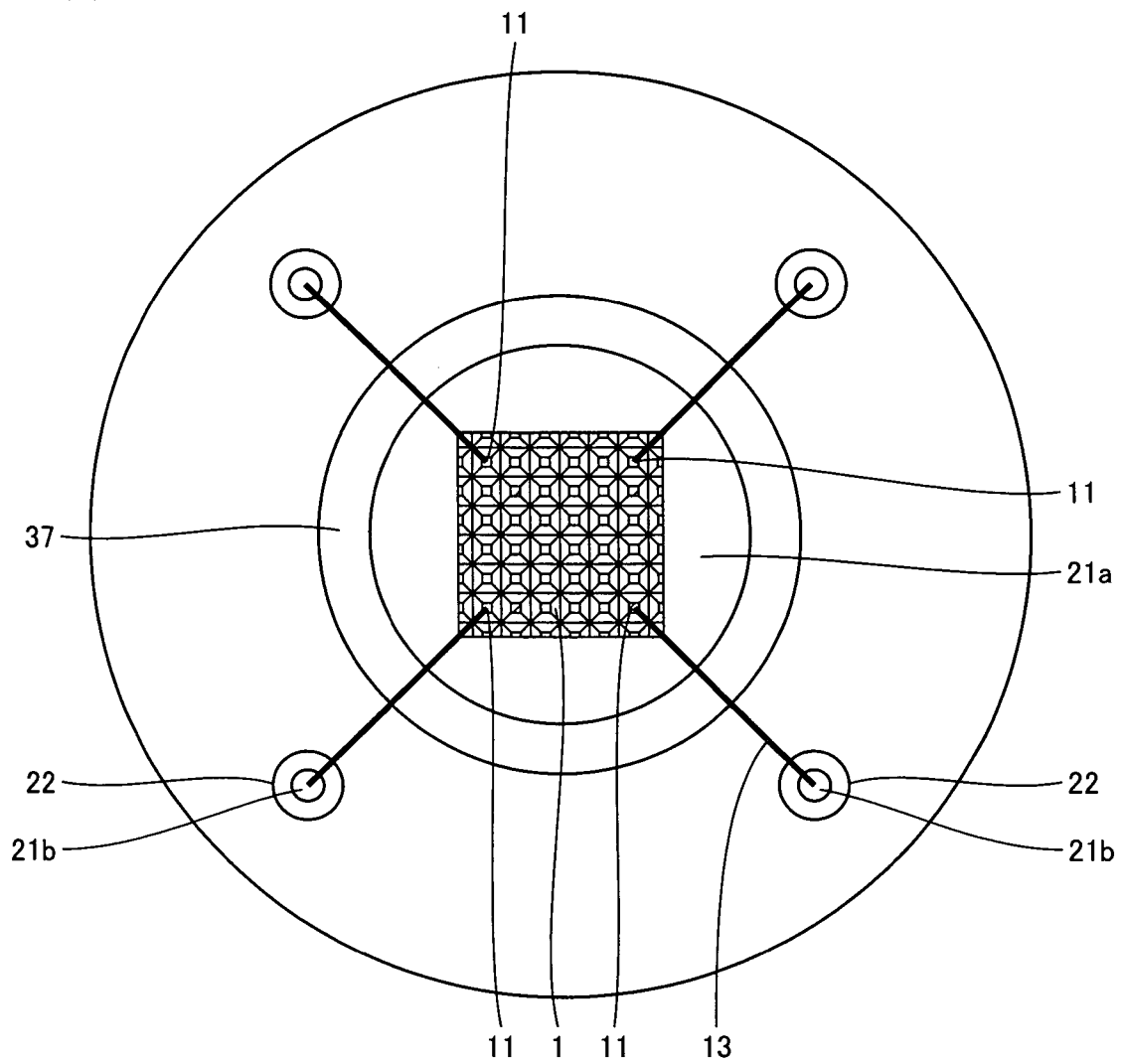
FIG. 6 shows a two-dimensional shape of the LED shown in FIG. 5.

The LED shown in FIGS. 5 and 6 is basically the same as the LED shown in FIGS. 1 and 2, except that n-electrodes 11 are arranged near four corners of the GaN substrate. Further, in the LED shown in FIGS. 5 and 6, a reflection cup 37 is arranged on the lead frame to surround the semiconductor chip, when the semiconductor chip is mounted.

The method of manufacturing the LED shown in FIGS. 5 and 6 is basically the same as the method of manufacturing the LED shown in FIGS. 1 and 2. It is noted, however, that the distance (pitch P) of adjacent trenches 80 is smaller than the pitch P shown in FIG. 3, and the number of trenches 80 per chip is larger than in the LED shown in FIGS. 1 and 2. Here, as the number of n-electrodes 11 is increased, the area of each n-electrode 11 can be made smaller than that of n-electrode 11 of the LED shown in FIGS. 1 and 2.

Figure 8:
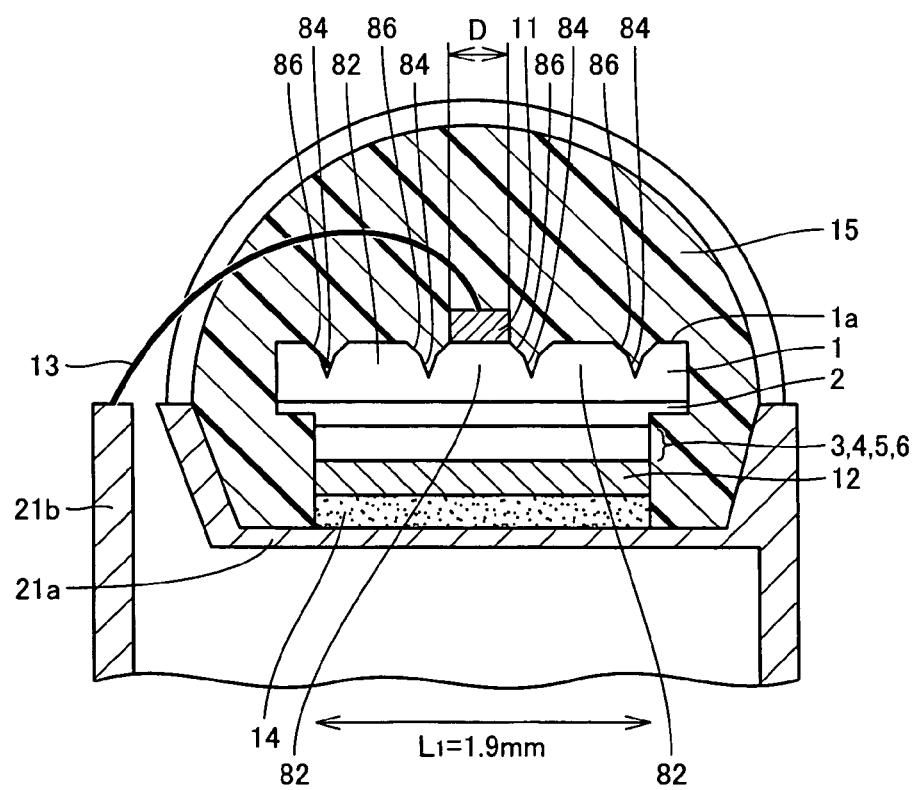
FIG. 8 shows a second modification of the LED in accordance with Embodiment 1 of the present invention shown in FIGS. 1 to 4.

Referring to FIG. 8, a second modification of Embodiment 1 of the LED in accordance with the present invention will be described.

The LED shown in FIG. 8 basically has the same structure as the LED shown in FIGS. 1 and 2, except that the trenches 80 formed on the second main surface 1a of GaN substrate 1 has a sidewall of different shape. Specifically, the sidewall of trench 80 includes a bottom-side sidewall 84 of which angle to the second main surface 1a is relatively large, and an opening-side sidewall 86 of which angle to the second main surface 1a is relatively small. Such a shape allows emission of larger amount of light from the second main surface than the LED shown in FIGS. 1 and 2.

Figure 9:
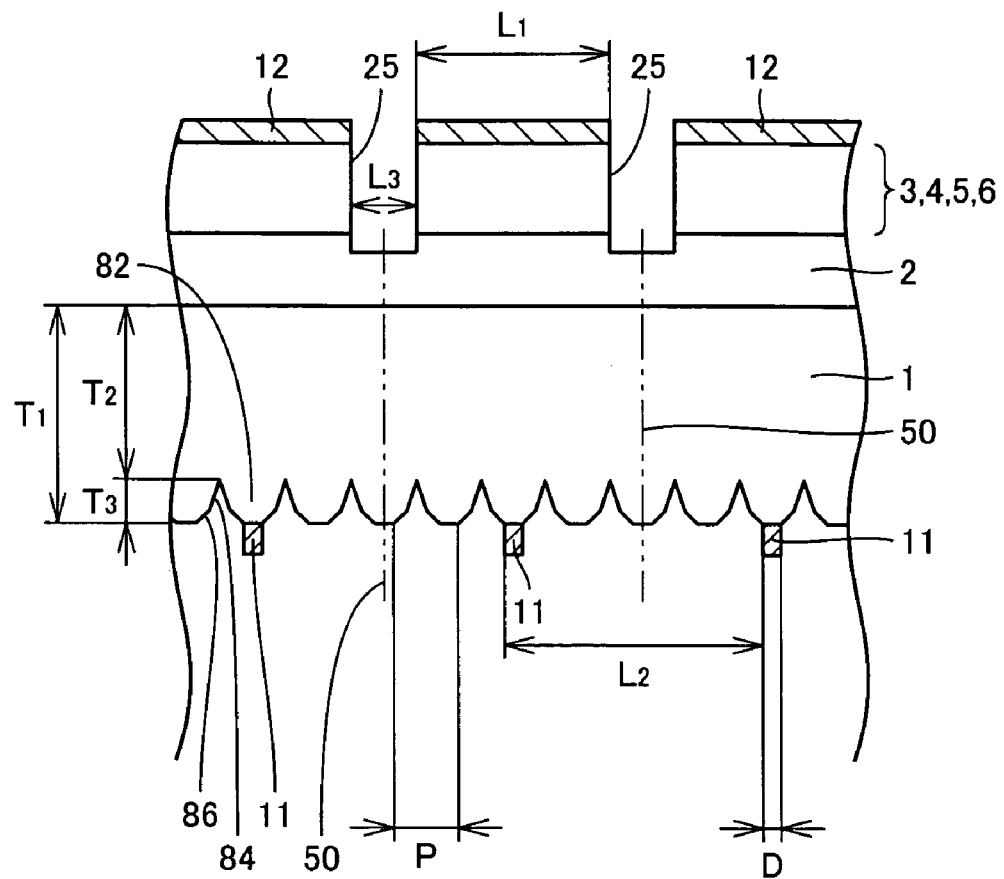
FIG. 9 shows a state of a wafer when a chip having the stacked structure forming the LED shown in FIG. 8 is taken from the wafer.
Figure 10:
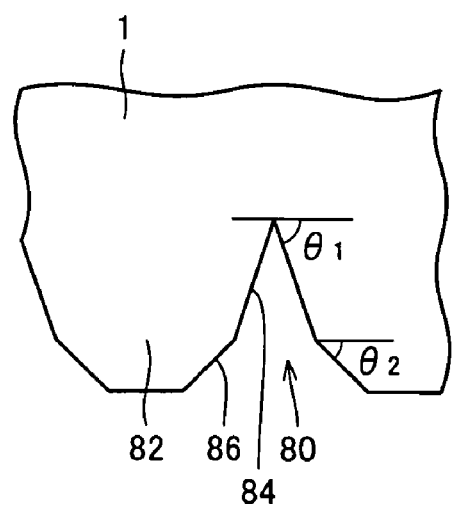
FIG. 10 is an enlarged schematic cross section of the second main surface of the GaN substrate shown in FIG. 9.

The method of manufacturing the LED shown in FIG. 8 is basically the same as that of the LED shown in FIGS. 1 and 2. It is noted, however, that in the step of forming the trenches 80 on the second main surface 1a of GaN substrate 1, dicing is performed twice. Specifically, by the first dicing using a blade having relatively small cutting edge angle, the bottom-side sidewall 84 is formed. Thereafter, the second dicing is performed on the traces of the first dicing, using a blade having relatively large cutting edge angle, to from the opening-side sidewall 86. At this time, cutting depth in the second main surface 1a of GaN substrate 1 cut by the blade is shallower in the second dicing than in the first dicing. In this manner, trenches 80 including bottom-side sidewall 84 of which angle to a plane parallel to the second main surface is $\theta 1$ and opening-side sidewall 86 of which angle to a plane parallel to the second main surface is $\theta 2$ (where $\theta 2 < \theta 1$) as shown in FIGS. 9 and 10 can be formed. From a different view point, trench 80 has a sidewall consisting of portions of two different angles (bottom-side sidewall 84 and opening-side sidewall 86). The first and second dicing operations may be performed in reverse order.

A third modification of Embodiment 1 of the LED in accordance with the present invention will be described with reference to FIG. 11.

Figure 11:
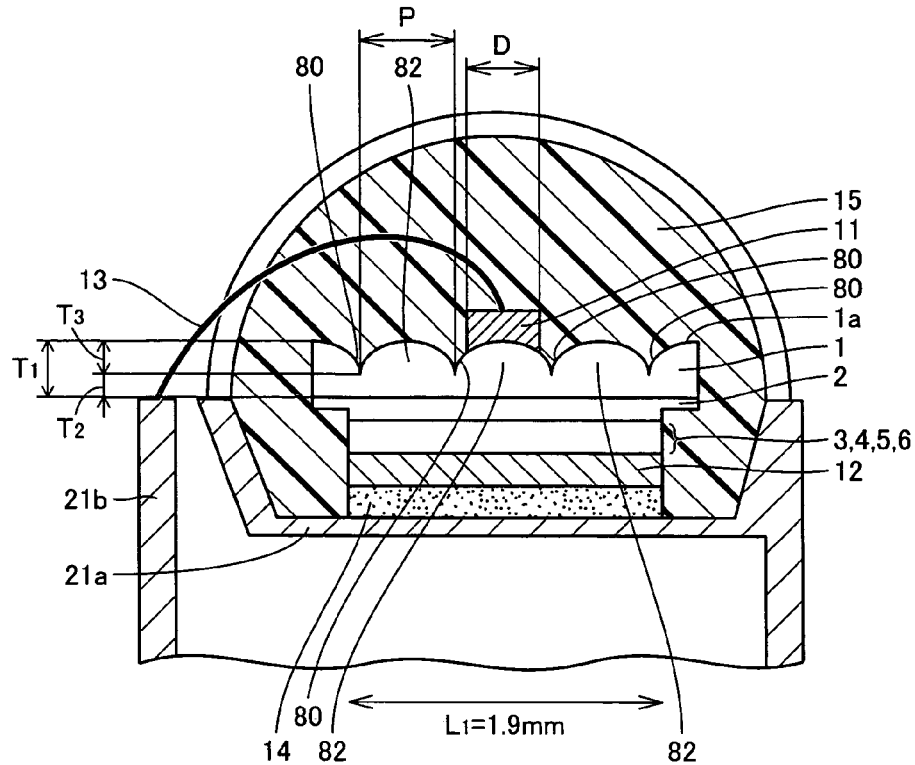
FIG. 11 shows a third modification of the LED in accordance with Embodiment 1 of the present invention shown in FIGS. 1 to 4.

The LED shown in FIG. 11 basically has the same structure as the LED shown in FIGS. 1 and 2, except that the trenches 80 formed on the second main surface 1a of GaN substrate 1 has a sidewall of a different shape. Specifically, in the LED shown in FIG. 11, the sidewall of trench 80 is a convex, curved surface protruding from the second main surface 1a of GaN substrate 1. A plurality of trenches 80 are formed extending in directions vertical to and parallel to the sheet of the figure. Convex portions 82 between adjacent trenches are semi-spherical. Therefore, trenches are formed such that the trench width increases/decreases periodically.

The method of manufacturing the LED shown in FIG. 11 is basically the same as that of the LED shown in FIGS. 1 and 2. It is noted, however, that in the step of forming the trenches 80 on the second main surface 1a of GaN substrate 1, machining such as dicing is performed such that the sidewall of trenches 80 comes to have a curved shape and the convex portions 82 between the trenches 80 come to have the semi-spherical shape.

The LED in accordance with the present invention utilizes a nitride semiconductor substrate as described above. In the following, specific structures and effects of the LED as a light emitting device will be described in greater detail.

Embodiment 1

First, a sapphire substrate and the GaN substrate as the nitride semiconductor substrate will be compared. Here, an LED as Example A of Embodiment 1 of the present invention has the same structure as the LED shown in FIG. 1. In the following, the LED of Example A will be described with reference to FIG. 1. As shown in FIG. 1, the LED of Example A has a stacked structure, which will be described in detail later, including a light generating layer and the like formed on the side of the first main surface of GaN substrate 1, and p-electrode 12 is provided. One characteristic of the present invention is that p-electrode 12 is mounted face-down on lead frame mounting portion 21a by conductive adhesive 14.

The second main surface 1a of GaN substrate 1 is a light emitting surface that emits light generated in the light generating layer, and an n-electrode 11 is formed on this surface. A plurality of trenches 80 extending in directions vertical to and parallel to the surface of the sheet of FIG. 1 are formed on the second main surface 1a. The n-electrode 11 is formed on a flat portion positioned between the trenches of the second main surface 1a, so as not to fully cover the second main surface. It is important to ensure that the ratio of the portion not covered by n-electrode 11 is sufficiently large. By enlarging the aperture ratio, the light intercepted by n-electrode can be reduced, and the emission efficiency for external emission of light can be improved.

The n-electrode 11 is electrically connected to a lead portion 21b of the lead frame, by a wire 13. Wire 13 and the stacked structure described above are sealed by an epoxy-based resin 15 as a sealing member. As described above, of the above-described structure, the stacked structure from GaN substrate 1 to p-electrode 12 is shown in enlargement in FIG. 2. In FIG. 2, the stacked structure of FIG. 1 is shown up-side down.

Next, the method of manufacturing the LED of Example A will be described.

(a1) An off-substrate of GaN shifted off by 0.5° from the c-plane was used. The substrate had specific resistance of 0.01 Ω·cm, dislocation density of 1E7/cm$^2$ and thickness of 400 μm.

(a2) By MOCVD (Metal Organic Chemical Vapor Deposition), the following stacked structure was formed on the Ga surface, that is, the first main surface of GaN substrate: (Si-doped n-type GaN layer/Si-doped n-type Al$_{0.2}$Ga$_{0.8}$N layer as a clad layer/an MQW (Multi-Quantum Well) having three sets of 2-layered structures of GaN layer and In$_{0.15}$GA$_{0.85}$N layer stacked/Mg-doped p-type Al$_{0.2}$Ga$_{0.8}$N layer as a clad layer/Mg-doped p-type GaN layer).

(a3) Emission wavelength was 450 nm, and internal quantum efficiency calculated conveniently by comparing PL (Photo Luminescence) intensity at a low temperature of 4.2 K and PL intensity at a room temperature 298 K was 40%.

(a4) The wafer was subjected to activation process, so as to reduce resistance of the Mg-doped p-type layer. The carrier concentration by hole measurement was 5E17/cm$^3$ in Mg-doped p-type Al$_{0.2}$Ga$_{0.8}$N layer and 1E18/cm$^3$ in Mg-doped p-type GaN layer.

(a5) The wafer was further subjected to etching with a Cl-based gas, from the side of Mg-doped p-type layer to the Si-doped n-type layer, by photolithography and RIE (Reactive Ion Etching). By this etching, element isolating trenches 25 were formed, so that elements were separated from each other. The width L3 of the element isolating trench was 100 μm.

(a6) On the N surface as the second main surface of GaN substrate, n-electrodes of which two-dimensional shape was a square with each side having the width (D) of 100 μm were provided at a distance L2=400 μm from each other, by photolithography, vapor deposition and lift-off method (see FIGS. 3 and 4). As the n-electrode, a stacked structure including (Ti layer of 20 nm/Al layer of 100 nm/Ti layer of 20 nm/Au layer Of 200 nm) in this order from the lower side was formed in contact with the GaN substrate. The resulting body was heated in a nitrogen (N$_2$) atmosphere, so that contact resistance was made to be at most 1E-5 Ω·cm$^2$.

(a7) As the p-electrode, an Ni layer having the thickness of 4 nm was formed in contact with the p-type GaN layer, and an Au layer having the thickness of 4 nm was formed on the entire surface thereof (see FIGS. 3 and 4). The resulting body was subjected to heat treatment in an inert gas atmosphere, so that the contact resistance was reduced to 5E-4 Ω·cm$^2$.

(a8) Next, on the N surface of the substrate, trenches 80 having a V-shaped cross section were formed by dicing. As shown in FIG. 3, the depth T$_3$ of the trench was 40 μm, the angle formed by the sidewall of trench 80 and the plane parallel to the second main surface of GaN substrate 1 was 60°, and the pitch P between adjacent trenches 80 was 150 μm.

(a9) Thereafter, as shown in FIGS. 3 and 4, scribing was performed such that a chip boundary 50 appears as a side surface, and the resulting chip is provided as the light emitting device. The light emitting device as a chip had a light emitting surface having the shape of a 300 μm square (a square each side of which had the length of 300 μm) and a light generating layer of a 300 μm square. Specifically, in FIG. 4, L1=300 μm, and L2=400 μm. The width L3 of the element isolating trench was L3=100 μm, and the width D of one side of n-electrode D=100 μm.

(a10) Referring to FIG. 1, the chip was mounted such that the side of p-type GaN layer of the chip was in contact with a mounting portion 21a of the lead frame, whereby the light emitting device was formed. By conductive adhesive 14 applied at the mounting portion, the light emitting device and the mount were fixed to each other and conduction was attained.

(a11) For better heat radiation characteristic of the light emitting device, the light emitting device was mounted such that the entire surface of p-type. GaN layer was in contact with the mounting portion. As conductive adhesive 14, an Ag-based adhesive having good thermal conductivity was selected, and a lead frame formed of CuW based material having good thermal conductivity was selected. The thermal resistance attained in this manner was 8° C./W.

(a12) Then, the n-electrode and the lead portion of lead frame were conducted by wire bonding, and an epoxy-based resin was applied for resin seal, whereby the light emitting device was provided as a lamp.

Figure 12:
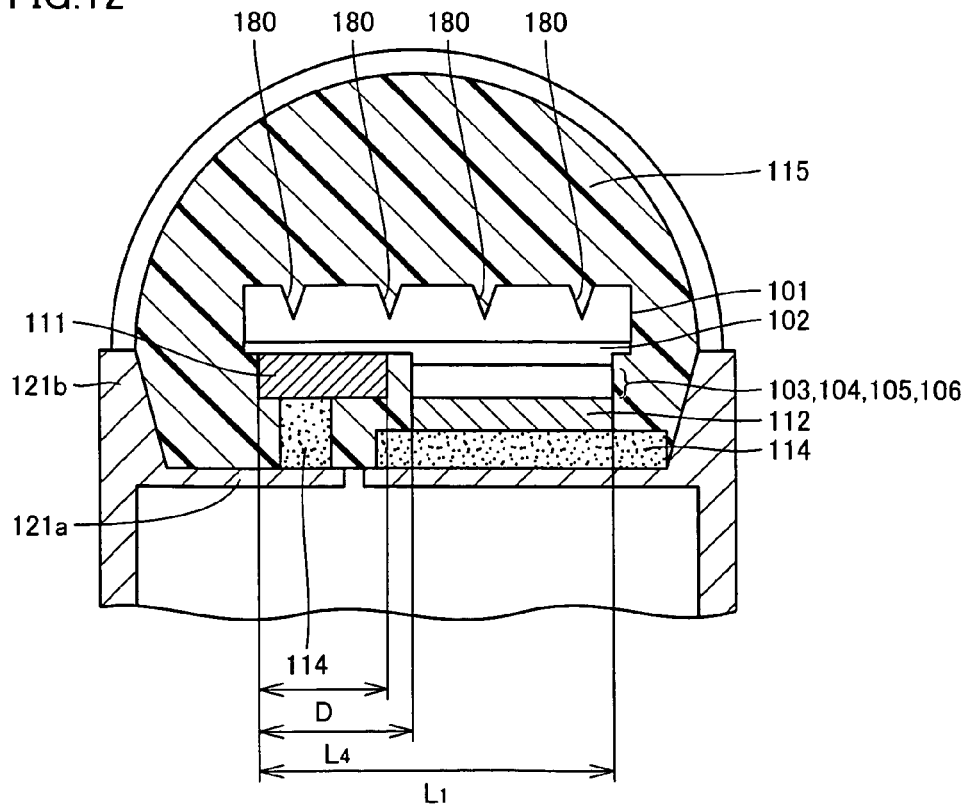
FIG. 12 shows Comparative Example B.

Next, Comparative Example B will be briefly described. Referring to FIG. 12, a p-electrode 112 is mounted face-down on the mounting portion of the lead frame by a conductive adhesive 114. Further, an n-electrode is mounted on a mounting portion 121a of the lead frame separate from the mounting portion of the lead frame where the p-electrode is connected, by conductive adhesive 114. A stacked structure including a light generating layer (FIG. 13) is formed thereon, to be in contact with a prescribed area of n-type GaN layer 102. The n-type GaN layer 102 is formed on a sapphire substrate 101, and an n-electrode 111 is formed outside the area that is in contact with the stacked structure. The n-electrode 111 is electrically connected to mounting portion 121a or lead portion 121b of the lead frame by a wire or by a conductive adhesive. On the surface of sapphire substrate 101 opposite to the surface on which the n-electrode 111 is formed (upper surface of sapphire substrate 101 shown in FIG. 12), trenches 180 having the same structure as trenches 80 formed on GaN substrate 1 shown in FIG. 1 are formed.

The light generated in the light generating layer is emitted to the outside through sapphire substrate 101. An epoxy-based resin 115 is applied for sealing, covering the above-described stacked structure including the sapphire substrate.

(b1) An insulating off-substrate of sapphire, shifted off by 0.2° from the c-plane was used. The sapphire substrate had the thickness of 400 μm.

(b2) to (b4) The same process steps as (a2) to (a4) of Example A were performed.

Figure 14:
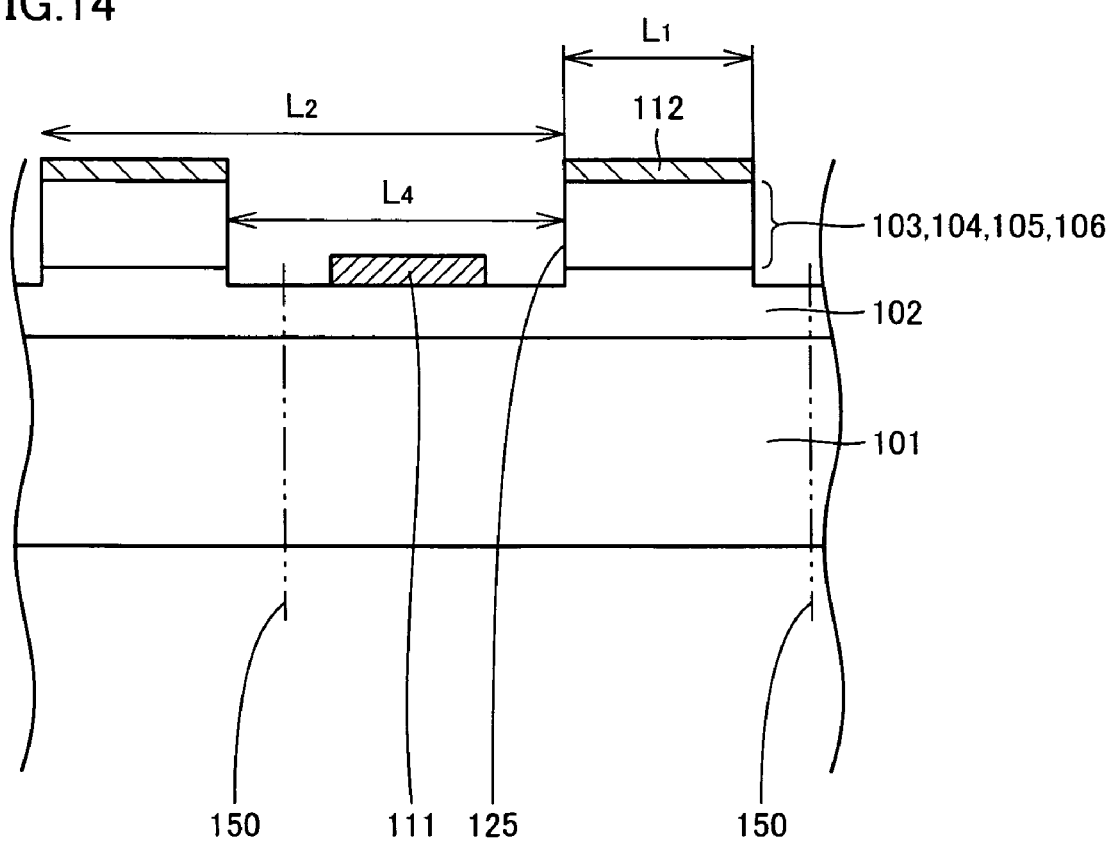
FIG. 14 shows a state of a wafer when a chip having the stacked structure of Comparative Example B is taken from the wafer.
Figure 15:
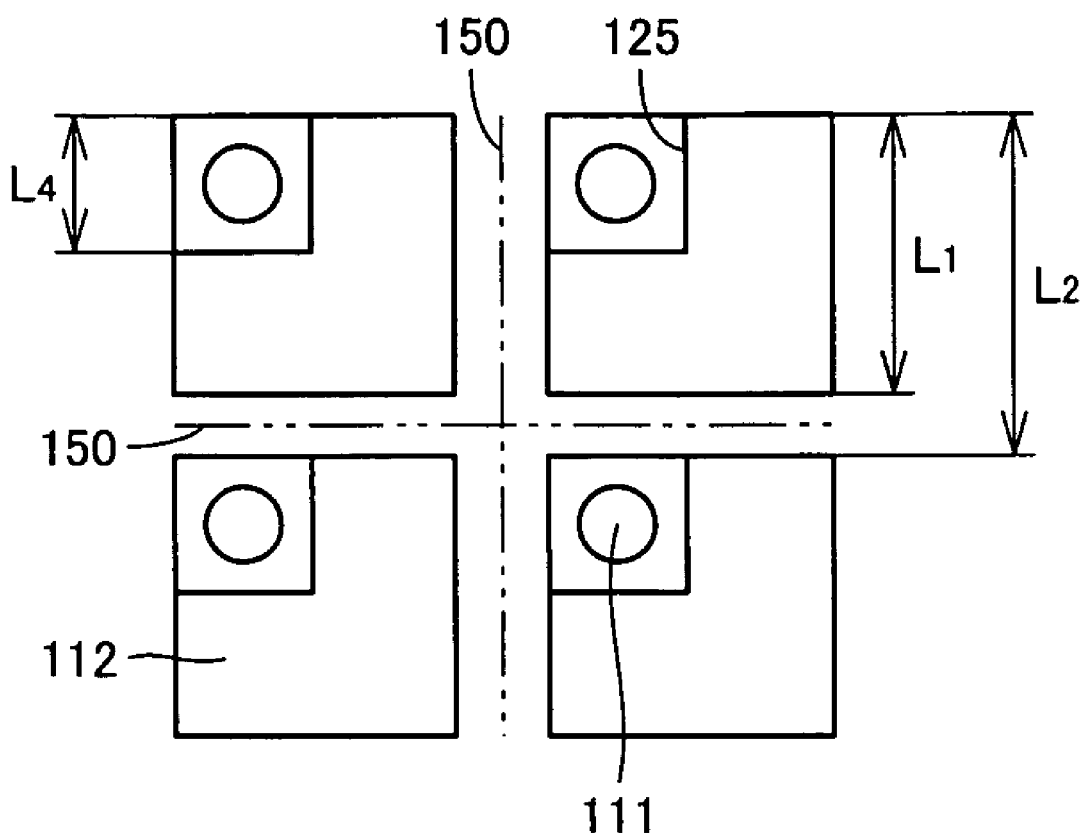
FIG. 15 shows electrode arrangement of FIG. 14.

(b5) In Comparative Example B, the sapphire substrate is an insulator, and therefore, the n-electrode must be provided on the same side of the grown film as the p-electrode. Therefore, the wafer was further subjected to etching with a Cl-based gas from the Mg-doped p-type layer to the Si-doped n-type layer by photolithography and etching, so that the n-type GaN layer for providing the n-electrode was exposed, and elements were separated from each other in the similar manner as in Example A (FIGS. 14, 15). The shape of the device was 300 μm square, and the area of n-type GaN exposed therein was 150 μm square per device. Specifically, the side of the rectangular step at the exposed portion had the length L4 of 150 μm.

(b6) On the exposed n-type GaN layer, an n-electrode having the diameter of 100 μm was provided, by photolithography, vapor deposition and lift-off method. Thickness, heat treatment and contact resistance were the same as those of Example A.

(b7) On the p-type GaN layer portion of the device having the size of 300 μm square, excluding the n-type GaN exposed area of 150 μm square, a p-electrode was provided. Thickness, heat treatment and contact resistance were the same as those of Example A.

(b8) Trenches 180 were formed by dicing, in the similar manner as in (a8) of Example A.

(b9), (b10) The process steps corresponding to those of Example A were performed.

(b11) As in Example A, for better heat radiation characteristic of the light emitting device, the light emitting device was mounted such that the entire surface of p-type GaN layer was in contact with the mounting portion. In FIG. 12, the contact area between p-type GaN layer 106 and p-electrode 112 was 0.0675 mm$^2$. In the light emitting device, heat is generated in quantum well layer 104 and p-type GaN layer 106, and therefore, the heat radiation is mainly determined by the area of p-electrode 112. In the example of FIG. 12, though n-electrode 111 is also connected to the mounting portion 121a of the lead frame by conductive adhesive 114, the heat radiating area is substantially the contact area of 0.0675 mm² mentioned above. The contact area between p-type GaN layer 6 and p-electrode 12 of Example A of the present invention is 0.09 mm². The adhesive and the lead frame material were the same as those of Example A. Reflecting the structure described above, thermal resistance of Comparative Example B was 10.4° C./W, that is, 1.3 times worse than Example A.

(b12) The process step corresponding to Example A was performed.

(Experiments and Results)

Figure 16:
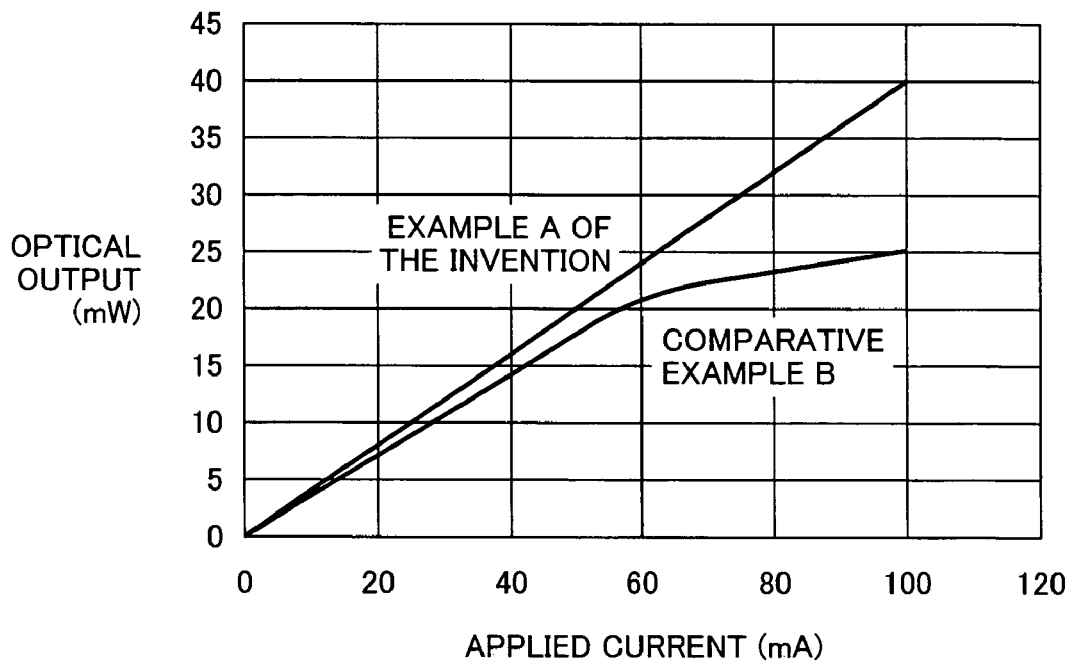
FIG. 16 shows relations between the applied current and optical output in Example A of the present invention and Comparative Example B.
Figure 17:
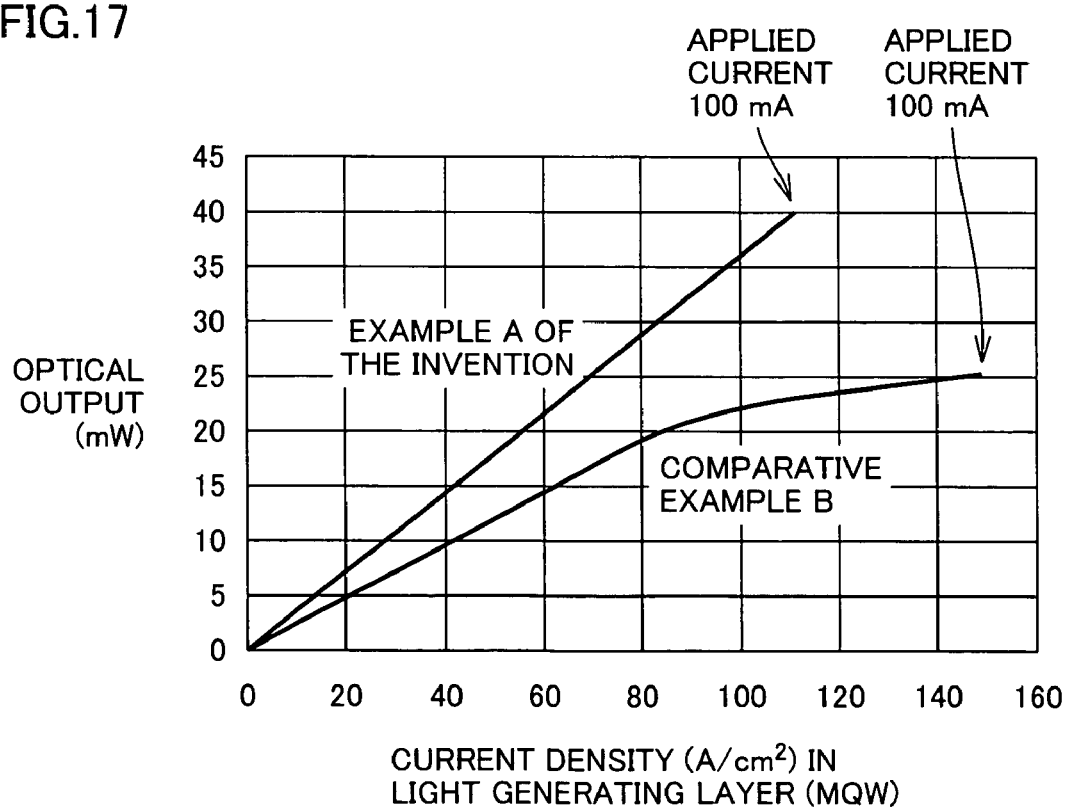
FIG. 17 shows relations between the current density and optical output in a light emitting layer of Example A of the present invention and Comparative Example B.

Example A of the present invention and Comparative Example B were put in an integrating sphere, a prescribed current was applied, and optical output values collected and output from a detector were compared. The results are as shown in FIG. 16. Referring to FIG. 16, in a relatively ideal state in which the current is injected to the MQW layer without leakage, non-radiative recombination hardly occurs in the MQW layer and chip temperature is not much increased by heat generation, the optical output value increases in proportion to the amount of applied current. When the current of 20 mA was applied, for example, the output of Example A was 8 mW and that of Comparative Example B was 7.2 mW.

When five times larger amount of current, that is, 100 mA was applied, the output of Example A of the present invention was increased five times to 40 mW, while the output of Comparative Example B was as low as 25.2 mW (see FIG. 16). At this time, the current density at the MQW light generating portion was 110 A/cm² in Example A, while it was 150 A/cm² in Comparative Example B. Specifically, the current density at the MQW light generating portion of Example A is larger than that of Comparative Example B.

This means that the heat radiation area of Example A of the present invention is sufficiently large for the generated heat, and that the structure does not have any portion where the current density becomes extremely high, as the n-electrode is provided on the side of the second main surface. By contrast, in Comparative Example B, the heat radiation area is smaller than Example A, and in addition, the current density of the current flowing in the n-type GaN layer in a direction parallel to the layer becomes too high, as the n-electrode is provided on the exposed n-type GaN layer. As a result, heat generation further increases in Comparative Example B.

Different from Comparative Example B, in Example A, the n- and p-electrodes are at opposite positions, and therefore, there is no possibility of short-circuit. Therefore, provision of a film for electrical insulation between the p- and n-electrodes, that would be required for preventing short-circuit in Comparative Example B having these electrodes on one same side, is unnecessary, and additional manufacturing cost can be avoided.

Test results on electrostatic discharge of Example A and Comparative Example B will be described. In the test, the light emitting devices are positioned opposite to a capacitor charged with static electricity, and discharge is caused therebetween. Here, Comparative Example B was broken at the electrostatic voltage of about 100 V. Example A of the present invention withstood until about 8000V. It was found that Example A has about 80 times higher electrostatic discharge resistance than Comparative Example B.

In Example A of the invention described above, the GaN-based light emitting device is formed on the GaN substrate, and therefore, even when the GaN-based light emitting chip is mounted face-down so that the light is emitted from the back surface of GaN substrate, total reflection does not occur and the light beams propagate from the GaN-based light emitting chip to the GaN substrate, as refractive index is not different in these materials. Therefore, as compared with the structure in which the GaN-based light emitting device is formed using a sapphire substrate, optical output at the main surface of GaN substrate can be improved. Further, the light beams are not concentrated and emitted at the side portion of GaN layer, and therefore, damages to the sealing resin can be avoided. Thus, the life of the device is not limited by the sealing resin.

Though only one example in which the emission wavelength is 450 nm has been described, the present invention provides the same effect even when emission wavelength or layer structure is changed. Further, in place of the GaN substrate, an $Al_xGa_{1-x}N$ substrate (where x is larger than 0 and not larger than 1) may be used to attain the same effect, provided that the substrate has comparable characteristics.

Embodiment 2

In Embodiment 2, Example C of the present invention having a larger area will be described. Example C of the present invention has the same structure as Example A shown in FIG. 1, except that the length L1, which is 0.3 mm (300 μm) in Example A, is made 3 mm in Example C, that is, ten times larger than Example A. Accordingly, the area is 100 times larger. The method of manufacturing Example C is as follows.

EXAMPLE C (c1) to (c5) Process steps corresponding to those of Example A of the present invention are performed, except that a large GaN substrate is used.

(c6) On the second main surface as the back surface of GaN substrate, n-electrodes having a square two-dimensional shape, with the width D of each side being 100 μm, were formed each at the center of the chip, apart by 3.1 mm, by photolithography, vapor deposition and lift-off method. As the n-electrode, a stacked structure including (Ti layer of 20 nm/Al layer of 100 nm/Ti layer of 20 nm/Au layer Of 200 nm) in this order from the lower side was formed in contact with the back surface of the GaN substrate. The resulting body then was heated in an inert atmosphere, so that contact resistance was made to be at most 1E-5 Ω·cm².

(c7) and (c8) Process steps corresponding to those of Example A of the present invention were performed.

(c9) Thereafter, scribing was performed to attain a prescribed shape, and the resulting chip was provided as a light emitting device. The light emitting device as a chip had the size of 3 mm square.

(c10) to (c12) Process steps corresponding to those of Example A of the present invention were performed. Next, Modification C1 in which n-electrode arrangement was made different from that of Example C was formed in the following manner.

EXAMPLE C1

Example C1, which is a modification of Example C of the present invention, basically has the same structure as the LED shown in FIGS. 5 and 6. As can be seen from FIGS. 5 and 6, in Example C1, n-electrodes 11 are arranged at four corners of the GaN substrate. It is noted, however, that in FIG. 5, n-electrode 11 is arranged partially overlapping the active layer when viewed two-dimensionally, while in Example C1, n-electrode is arranged outside the active layer when viewed two-dimensionally. Further, a reflection cup 37 is arranged on the lead frame to surround the semiconductor chip, when the semiconductor chip is mounted.

In the structure of Example C1 described above, the same processes are performed in the steps corresponding to those of Example A. It is noted, however, that four Au lines were used for wire bonding, of which cross sectional diameter was 25 μm. The n-electrodes at the four corners each have the shape of 45 μm square.

Next, Comparative Example D will be described. Comparative Example D has the same structure as that shown in FIG. 12. However, the length L1, which is 300 μm (0.3 mm) in Comparative Example B, is made 3 mm in Comparative Example D, that is, ten times larger. Further, the size L4 of the portion of n-type GaN layer forming the n-electrode is 150 μm, that is, the same as that of Comparative Example B shown in FIG. 12. Comparative Example D was manufactured in the following manner.

COMPARATIVE EXAMPLE D (d1) A large size, insulating off-substrate of sapphire, shifted off by 0.2° from the c-plane was used. The sapphire substrate had the thickness of 400 μm.

(d2) to (d4) Process steps corresponding to those of Example A of the present invention were performed.

(d5) In Comparative Example D, the sapphire substrate is an insulator, and therefore, the n-electrode must be provided on the same side of the grown film as the p-electrode. Therefore, the wafer was further subjected to etching with a Cl-based gas from the Mg-doped p-type layer to the Si-doped n-type layer by photolithography and etching, so that the n-type GaN layer for providing the n-electrode was exposed, and elements were separated from each other in the similar manner as in Example A. The shape of the device was as large as 3 mm square, and the area of n-type GaN layer exposed therein for arranging the n-electrode was 150 μm square per device.

(d6) On the exposed n-type GaN layer, an n-electrode having the diameter of 100 μm was provided, by photolithography, vapor deposition and lift-off method. Thickness, heat treatment and contact resistance were the same as those of Example A.

(d7) On the p-type GaN layer portion of the device having the size of 3.1 mm square, excluding the n-type GaN exposed area of 150 μm square for forming the n-electrode and element separating trench, a p-electrode was provided. Thickness, heat treatment and contact resistance were the same as those of Example A.

(d8) to (d12) Process steps corresponding to those of Example A of the present invention were performed.

Another Comparative Example E will be described. Comparative Example E is the same as Comparative Examples B and D in that a sapphire substrate is used and p- and n-electrodes 112 and 111 are mounted face-down. It is different, however, in that p-electrodes 112 are formed in a comb shape and n-electrodes 111 are arranged between the teeth of the comb, and insulators are arranged between p-electrodes 112 and n-electrodes 111, as is apparent from the plan view of FIG. 19. This is to make uniform the current flowing through the p- and n-electrodes to prevent generation of portions where current density becomes excessively high. Comparative Example E as such is manufactured in the following manner.

COMPARATIVE EXAMPLE E

Figure 18:
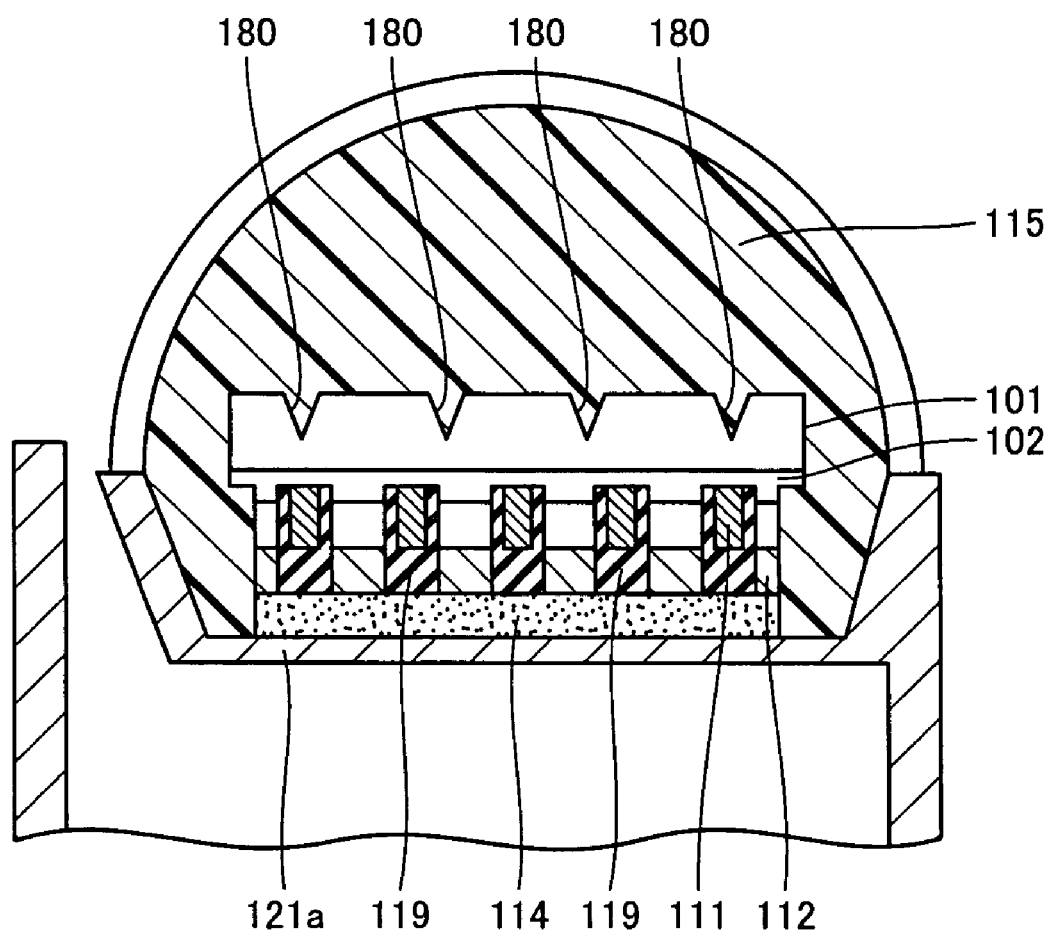
FIG. 18 shows an LED of Comparative Example E.
Figure 19:
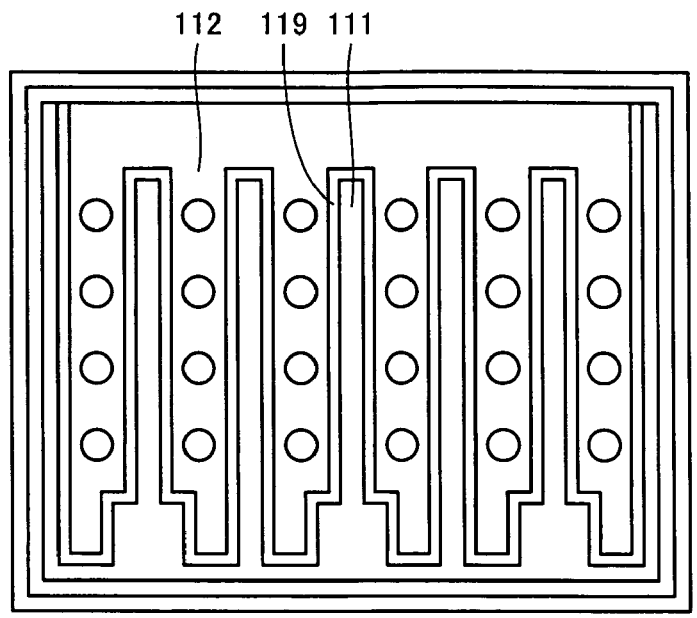
FIG. 19 is a plan view of the LED of Comparative Example E shown in FIG. 18.

By the similar method of manufacturing as Comparative Example D, n-electrodes 111 were formed as a comb having five teeth each having the width of 0.1 mm and apart from each other by 0.5 mm (see FIGS. 18 and 19). On the remaining portions of the back surface of n-type GaN layer 102, p-electrodes were formed while the n-electrodes 111 and p-electrodes 112 were kept apart by 0.1 mm. Further, an insulator 119 for surface protection was provided in the space between the n- and p-electrodes, so as to prevent short-circuit of the electrodes. Further, to prevent short circuit, conductive adhesive 114 is applied at portions corresponding to the electrodes of mounting portion 121a of the lead frame and the chip was mounted on the lead frame while lateral, longitudinal and rotational deviation between the chip and the lead frame was adjusted.

(Experiments and Results)

Example C of the present invention and Comparative Example D were put in an integrating sphere, a prescribed current was applied, and optical output values collected and output from a detector were compared. When the current of 20 mA was applied, for example, the output of Example C was 8 mW and that of Comparative Example D was 7.2 mW. When the current of 2 A (2000 mA) was applied, Example C of the present invention attained 100 times higher output of 800 mW, while Comparative Example D was damaged.

In view of the foregoing, device temperature of Comparative Example D without resin seal was measured using a thermo-viewer while applying a current. As a result, it was found that extreme heat builds up at a portion where the current flows concentrated in the n-type GaN layer from n-electrode to the MQW light generating portion in the direction parallel to the layer, damaging the device.

Therefore, an example similar to Comparative Example D but the current flowing in the n-type GaN layer from n-electrode to the MQW light generating portion in the direction parallel to the layer is dispersed was formed. This is Comparative Example E mentioned above. Comparative Example E attained the output of 7.2 mW with applied current of 20 mA and 720 mW at 2 A, that is, 0.9 times the output of Example C of the invention.

As described above, when performance close to that of Example C of the invention is to be attained, very complicated structure and complicated process are required, resulting in formidable manufacturing cost.

Next, a test on electrostatic discharge was conducted on Example C and Comparative Examples D and E. In the test, the light emitting devices were positioned opposite to a capacitor charged with static electricity, and discharge was caused therebetween. Here, Comparative Examples D and E were broken at the electrostatic voltage of about 100 V. Example C of the present invention withstood until about 8000V. It was found that Example C had about 80 times higher electrostatic discharge resistance.

In Example C1 of the invention, aperture ratio is far higher than 50% and almost 100%. Further, the positioning at the corners of GaN substrate dramatically reduces the possibility of hindering extraction of light as compared with the central positioning. As already described, in Example C1 of the present invention, the n-electrode is positioned outside the active layer when viewed two-dimensionally, and therefore, the n-electrode does not at all affect extraction of light. Thus, Example C1 can attain even higher output than Example C of the invention.

Embodiment 3

Figure 20:
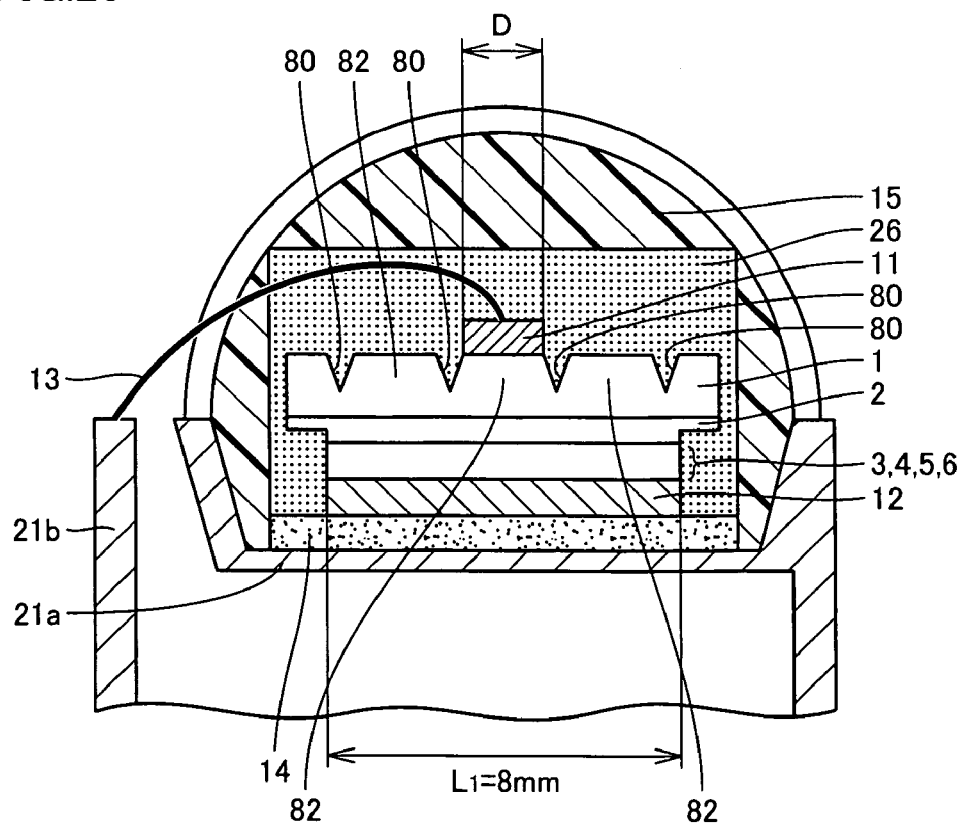
FIG. 20 shows an LED of Example F in accordance with Embodiment 3 of the present invention.

In Embodiment 3 of the present invention, the influence of aperture ratio of the light emitting surface and the electric resistance of GaN substrate on the optical output were measured. The aperture ratio was adjusted by changing the substrate area and the sizes of p- and n-electrodes. As test samples, LEDs having the structure shown in FIG. 1 were used. It is noted, however, that for some tests, samples of white LED with a fluorescent material 26 were used. Test samples included three types, that is, Example F of the invention and Comparative Examples G and H of which specific resistance of GaN substrate was out of the range of the invention. For each of the examples F, G and H, devices not including the fluorescent material and sealed with epoxy resin as shown in FIG. 1 and white LEDs having a fluorescent material shown in FIG. 20 were prepared, as will be described in the following. The aperture ratio was calculated by {(area of p-electrode−area of n-electrode)/area of p-electrode}×100 (%).

In Example F of the invention, L1=8 mm, D=100 μm, and aperture ratio was almost 100%. In Comparative Example G, L1=0.49 mm, D=100 μm, and aperture ratio was 97%. In Comparative Example H, L1=8 mm, D=7.51 μm, and aperture ratio was 31%. The method of manufacturing Example F and Comparative Examples G and H will be described in the following.

EXAMPLE F (f1) to (f8) Process steps corresponding to those of Example A of the present invention were performed.

Figure 21:
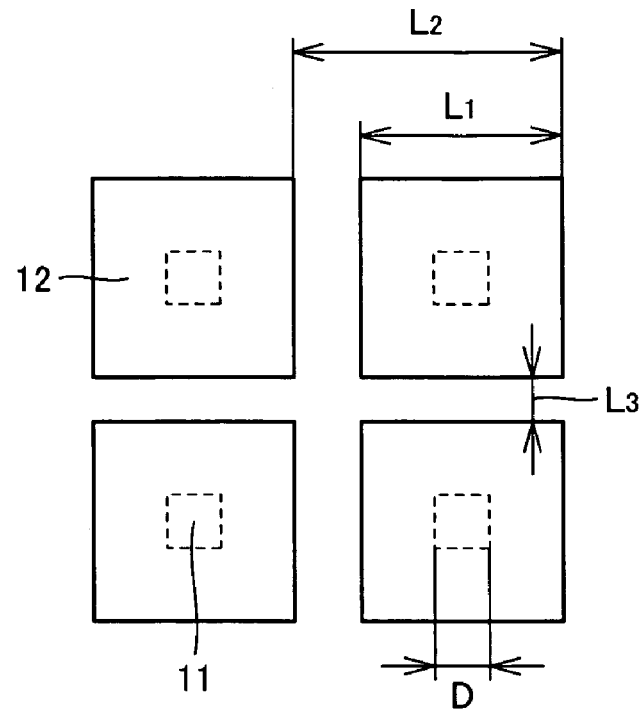
FIG. 21 shows an electrode arrangement when the chip having the stacked structure of Example F of the present invention is taken from a wafer.

(f9) Thereafter, scribing was performed to attain a prescribed shape as shown in FIG. 21, and the resulting chip was provided as a light emitting device. The light emitting device as a chip had the size of 8 mm square.

(f10) to (f12) Process steps corresponding to those of Example A of the present invention were performed.

(f13) Separate from (f12) above, in (f11), a fluorescent material was mounted on the n-electrode side of the device mounted on a mount of the lead frame, and the resulting device was resin-sealed with epoxy resin, to obtain a lamp emitting white light. For this device, a fluorescent material that attains 180 lm per 1 watt of optical output of 450 nm was used.

COMPARATIVE EXAMPLE G (g1) An off-substrate of GaN, shifted off by 0.5° from the c-plane was used. The specific resistance was 0.6 Ω·cm, which was higher than the invention, that is, at most 0.5 Ω·cm. The GaN substrate had dislocation density of $1E7/cm^2$ and the thickness of 400 μm.

(g2) to (g8) Process steps corresponding to those of Example F of the present invention were performed.

(g9) Thereafter, scribing was performed to attain a prescribed shape, and the resulting chip was provided as a light emitting device. The light emitting device had the size of 0.49 mm square.

(g10) to (g13) Process steps corresponding to those of Example F of the present invention were performed.

COMPARATIVE EXAMPLE H (h1) An off-substrate of GaN, shifted off by 0.5° from the c-plane was used. The specific resistance was 0.6 Ω·cm, which was higher than the invention, that is, at most 0.5 Ω·cm. The GaN substrate had dislocation density of $1E7/cm^2$ and the thickness of 400 μm.

(h2) to (h8) Process steps corresponding to those of Example F of the present invention were performed.

(h9) Thereafter, scribing was performed to attain a prescribed shape, and the resulting chip was provided as a light emitting device. The light emitting device had the size of 8 mm square.

(h10) to (h13) Process steps corresponding to those of Example F of the present invention were performed.

(Experiments and Results)

Figure 22:
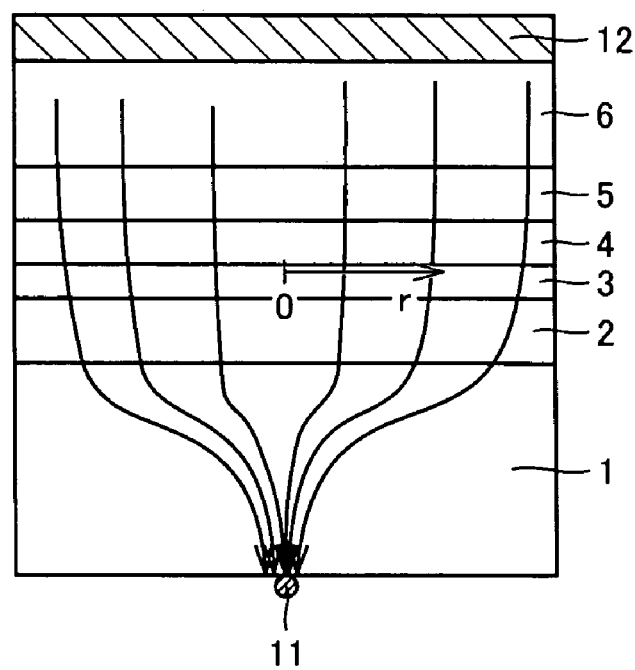
FIG. 22 schematically shows current flow in the LED chip obtained through computer simulation.
Figure 23:
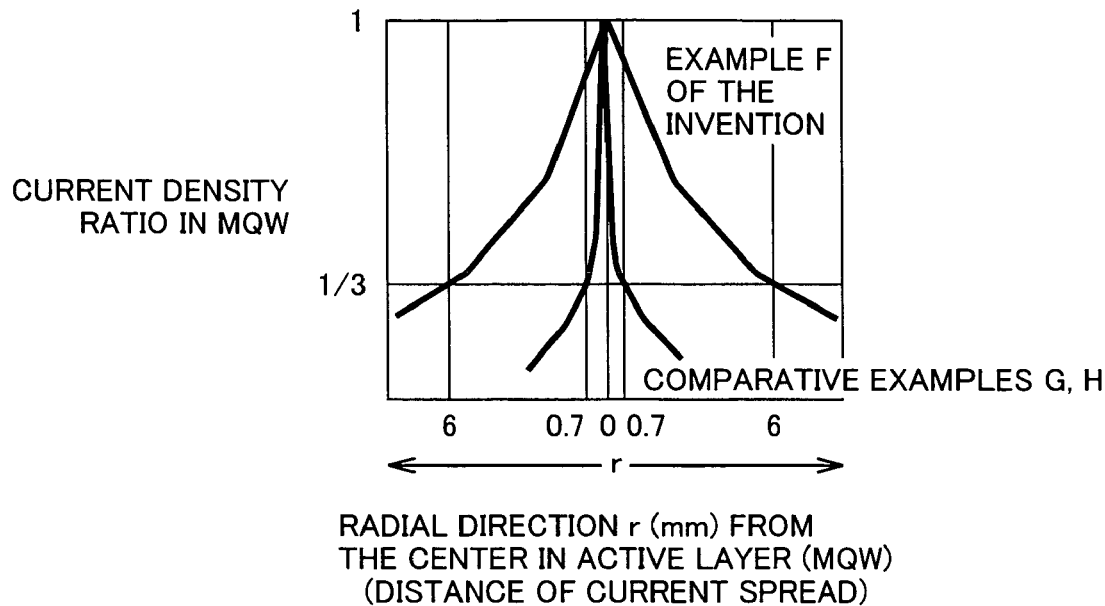
FIG. 23 represents current density ratio in the light generating layer of the LED in accordance with Embodiment 3 of the present invention.

(1) For Example F of the invention and Comparative Examples G and H, current distribution in a range where the current spread fairly uniform from the n-electrode to the MQW layer was calculated by simulation. The result of simulation was reflected on designing the devices of Example F of the invention and Comparative Examples G and H. FIG. 22 shows the image of the spread scope of current. In FIG. 22, current density at the center of n-electrode was assumed to be 1. (i) Result of Example F of the invention: Current density was the highest directly below the n-electrode, and became smaller away from the n-electrode. The scope in which current density of at least one third (⅓) of that obtained immediately below the n-electrode was 12 mm in diameter with the n-electrode being the center. Based on this result, the size of the light emitting device was set to 8 mm square, to be within this scope. On the N surface as the second main surface of GaN substrate, n-electrodes each having a square two-dimensional shape with each side having the width of 100 μm were provided at a distance of 8.1 mm from each other, each at the center of the chip, by photolithography, vapor deposition and lift-off method. Here, the ratio of the portion of N surface of GaN substrate where n-electrodes are not provided, that is, aperture ratio, is almost 100% per device. The thickness, heat treatment and contact resistance were the same as those in Example A. (ii) Result of Comparative Example G: The scope in which current density of at least one third (⅓) of that obtained immediately below the n-electrode was 0.7 mm in diameter with the n-electrode being the center. Therefore, the size of n-electrode was made the same as in Example E of the invention to have the width D of 100 μm, and the chip size was set to 0.49 mm square to be within this scope of 0.7 mm in diameter. On the N surface of GaN substrate, n-electrodes each having a square two-dimensional shape with each side having the width of 100 μm were provided at a distance of 0.5 mm from each other, each at the center of the chip, by photolithography, vapor deposition and lift-off method. Here, aperture ratio is almost 97% per device. The thickness, heat treatment and contact resistance were the same as those in Examples A to E of the invention. (iii) In Comparative Example H, the chip size was made the same as in Example E of the invention to be 8 mm square. The electric resistance of GaN substrate was the same as that of Comparative Example G, and the current spread in the scope of 0.7 mm in diameter. Therefore, when uniform current is to be provided in 8 mm square (at least ⅓ that obtained immediately below the n-electrode), the n-electrode must have the size of 7.51 mm in diameter. Therefore, on the second main surface of GaN substrate (light emitting surface), n-electrodes each having a square two-dimensional shape with each side having the width of 7.51 mm were provided at a distance of 8.1 mm from each other, by photolithography, vapor deposition and lift-off method, with the width of scribing set to 0.1 mm. Here, aperture ratio per device is about 31%.

Figure 24:
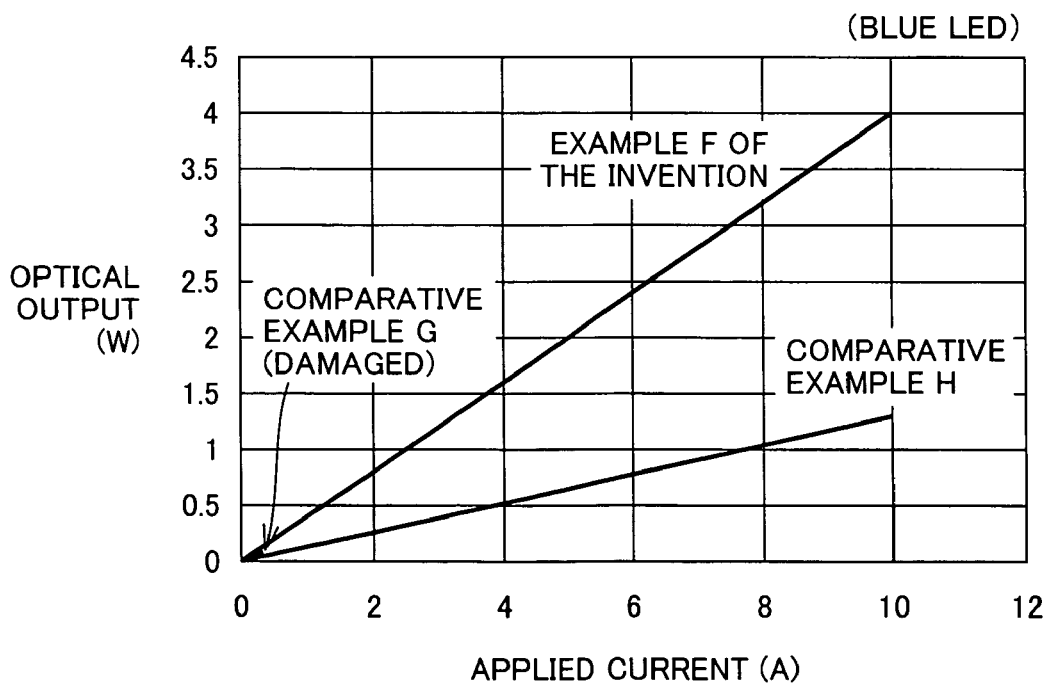
FIG. 24 shows a relation between the applied current and optical output of the LED (without fluorescent material) in accordance with Embodiment 3 of the present invention.
Figure 25:
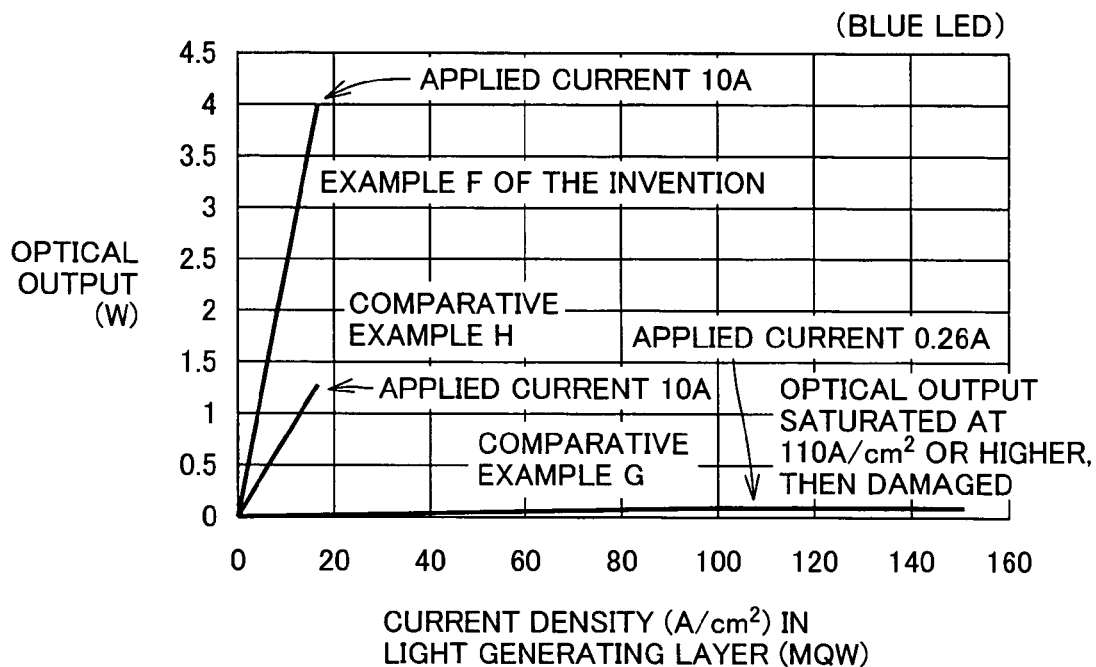
FIG. 25 shows a relation between the current density and optical output in the light generating layer of the LED (without fluorescent material) in accordance with Embodiment 3 of the present invention.

(2) Devices in accordance with Example F and Comparative Examples G and H without fluorescent materials were put in an integrating sphere, a prescribed current was applied, and optical output values collected and output from a detector were compared. The results are as shown in FIGS. 24 and 25.

When the current of 20 mA was applied, the outputs of Example F and Comparative Examples G and H were 8 mW, 7.8 mW and 2.5 mW, seemingly reflecting the area ratio of portions where electrodes were not provided. The highest optical output was attained by Example F of the present invention, and relatively high output, thought not as high as Example F, could be attained by Comparative Example G. When 500 times higher current, 10 A, was applied, Example F of the invention and Comparative Example H attained the output of 4 W and 1.3 W, respectively reflecting the area ratio of portions where electrodes were not provided.

In Comparative Example G, the output increased in proportion to the increase in applied current until it attained the output of 0.1 W with the applied current of 0.26 A and current density at the light generating portion of 110 A/cm$^2$. Thereafter, however, the output saturated as the temperature increased, and when the current of 10 A was applied, the device was broken.

Figure 26:
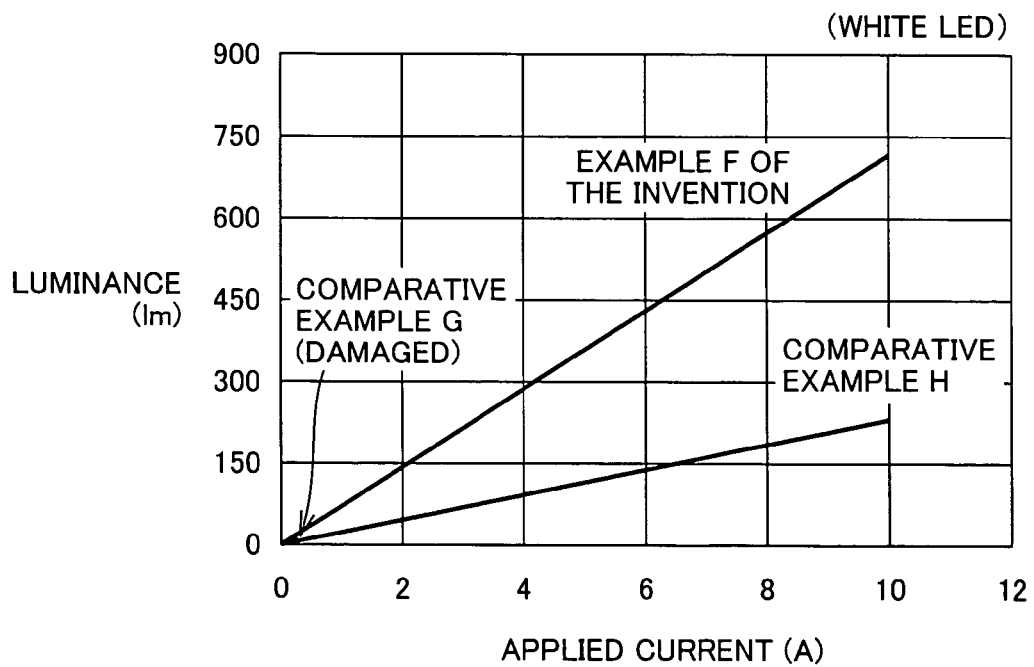
FIG. 26 shows a relation between the applied current and optical output of the LED (with white fluorescent material) in accordance with Embodiment 3 of the present invention.
Figure 27:
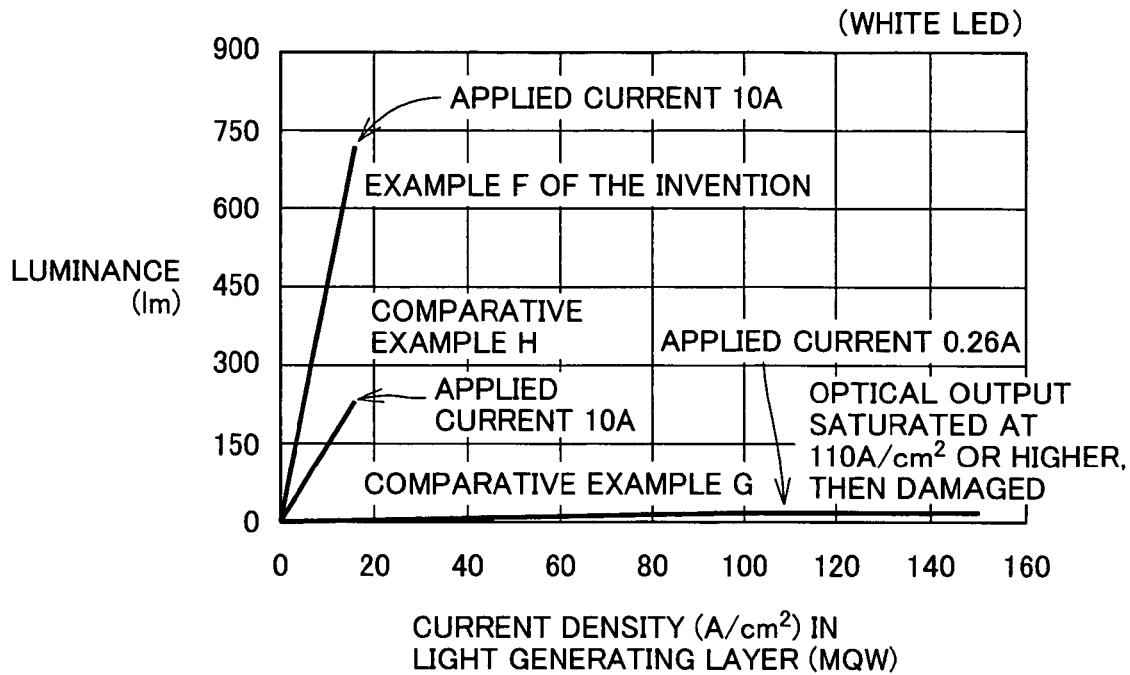
FIG. 27 shows a relation between the current density and optical output in the light generating layer of the LED (with white fluorescent material) in accordance with Embodiment 3 of the present invention.

FIGS. 26 and 27 show luminance measurements of the three test samples described above. Even when the same fluorescent material was used, luminance attained were different in Example F of the invention and Comparative Example H because of the area ratio of portions where electrodes were not provided, and the luminance measurements were 720 lm/chip and 234 lm/chip, respectively, when the current of 10 A was applied. In Comparative Example G, luminance of 18 lm/chip with the applied current of 0.26 A was the thermal limit, and when the current of 10 A was applied, the device was broken. As can be seen from FIGS. 26 and 27, high luminance was attained with high current only by Example F of the present invention.

In the present embodiment, the maximum applied current was set to 10 A, because higher current would result in too large Joule heat density at the n-electrode, causing too much heat build-up.

When the n-electrode is enlarged or contact resistance is made sufficiently lower, the same effect can be attained up to the maximum current of 70 A, which corresponds to the current density of 110 A/cm$^2$.

EXAMPLES F-2 AND F-3

In view of the foregoing, in Example F-2 of the invention, the n-electrodes were each adapted to have the width D of 1 mm (area: 1 mm$^2$) (1 mm square) and arranged at the center of the GaN substrate, through the same process steps as Example F. In Example F-3 of the invention, the n-electrodes were adapted to have the size of 450 μm square, and arranged at four corners of the GaN substrate (see FIGS. 28 and 29). As can be seen from FIGS. 28 and 29, n-electrodes arranged at four corners are electrically connected to the lead frame by bonding wires, respectively. The bonding wire is an Au line having the cross-sectional diameter of 300 μm. In both examples, aperture ratio is almost 100%. Further, as in Example C1 of the present invention, a reflection cup 37 as a cup-shaped reflector was arranged.

Similar to Example F of the invention, the samples without fluorescent material were put in an integrating sphere, and a prescribed current was applied to cause light emission. Optical output values collected and output from a detector were measured. When the current of 20 mA was applied, the output was 8 mW, and when the 500 times higher current of 10 A was applied, the output was 4 W, and when 70 A was applied, the output was 28 W.

From the LED provided with the fluorescent material to emit white light, luminance of 5040 lm/chip was attained.

It is naturally possible to arrange a large number of light emitting devices to which relatively small current is applied to attain comparable output. In that case, however, a prescribed distance is necessary to avoid electrical short-circuit or to attain positional accuracy of device arrangement, and as a result, the size of the entire device would be too large. Further, providing conduction to each device would result in very high cost and hence impractical. According to the present invention, such problems can be avoided, and high optical output can be attained through the same number of process steps as the prior art and approximately at the same cost, with the minimum necessary size.

Similar effects can be attained when an $Al_xGa_{1-x}N$ substrate (where x is larger than 0 and not larger than 1) is used in place of the GaN substrate, when the substrate characteristics are comparable, even when the emission wavelength or layer structure is different.

Figure 28:
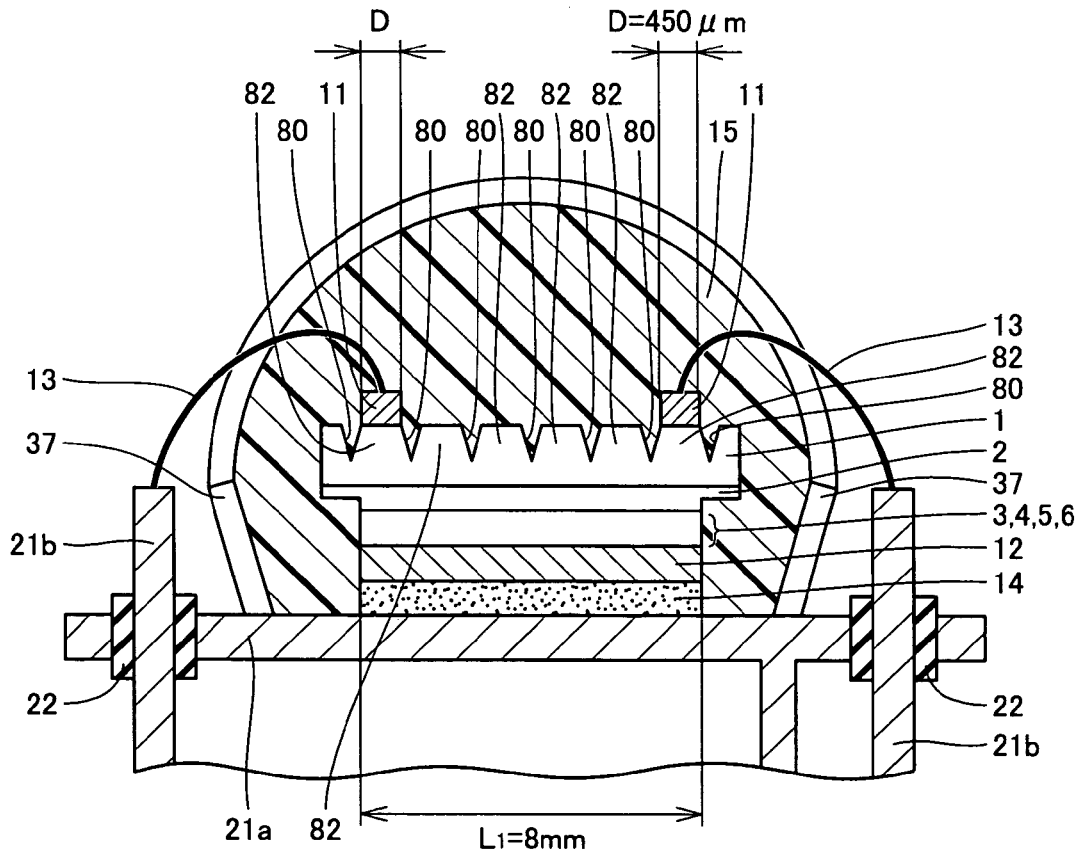
FIG. 28 shows Modification F-3 of the LED in accordance with Embodiment 3 of the present invention.
Figure 29:
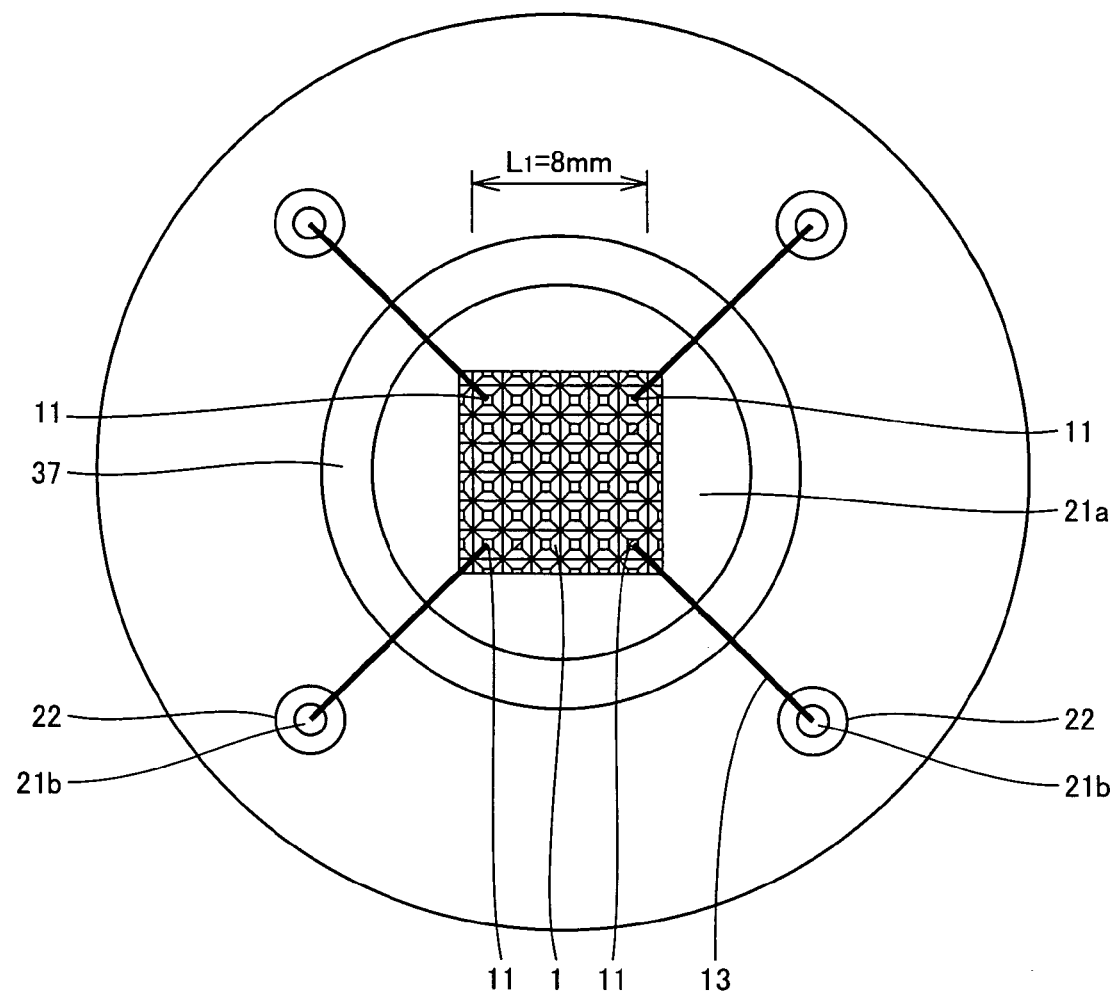
FIG. 29 is a plan view of the LED shown in FIG. 28.

As shown in FIGS. 28 and 29, as the n-electrodes positioned at corners of the GaN substrate are electrically connected to the lead frame by four Au lines having the radius of 150 μm, the electrodes and the wires do not hinder extraction of light, and hence, it is possible to further enhance optical output.

Embodiment 4

In Embodiment 4 of the present invention, the influence of the thickness of GaN substrate on the optical output will be described. Using three test samples, Examples I, J and K of the invention having the same structure as the LED shown in FIG. 1, light absorption of the GaN substrate was measured. The method of manufacturing the test samples will be described.

EXAMPLE I (i1) An off-substrate of GaN shifted off by 0.5° from the c-plane was used. The substrate had specific resistance of 0.01 Ω·cm, dislocation density of 1E7/cm$^2$ and thickness of 100 μm.

(i2) By MOCVD, the following stacked structure was formed on the first main surface of GaN substrate: (GaN buffer layer/Si-doped n-type GaN layer/Si-doped n-type $Al_{0.2}Ga_{0.8}N$ layer as a clad layer/an MQW layer having three sets of 2-layered structure of GaN layer and $In_{0.05}Ga_{0.95}N$ layer stacked/Mg-doped p-type $Al_{0.2}Ga_{0.8}N$ layer as a clad layer/Mg-doped p-type GaN layer).

(i3) Emission wavelength was 380 nm, and internal quantum efficiency calculated conveniently by comparing PL intensity at a low temperature of 4.2 K and PL intensity at a room temperature of 298 K was 40%.

(i4) and (i5) Process steps corresponding to those of Example A of the present invention were performed.

(i6) First, by simulation, the scope in which the current spread fairly uniform from the n-electrode as a point to the MQW layer was calculated. As a result, it was found that current density was the highest directly below the n-electrode, and became smaller away from the n-electrode. The scope in which current density of at least one third (⅓) of that obtained immediately below the n-electrode was 3 mm in diameter with the n-electrode being the center. Based on this result, the size of the light emitting device was set to 1.6 mm square, to be within this scope. On the N surface of GaN substrate, n-electrodes each having a square two-dimensional shape with each side having the width of 100 μm (100 μm square) were provided at a distance of 1.7 mm from each other, by photolithography, vapor deposition and lift-off method. Here, the ratio of the portion of N surface of GaN substrate where n-electrodes are not provided, that is, aperture ratio, is almost 100% per device. The thickness, heat treatment and contact resistance were the same as those in Example A.

(i7) and (i8) Process steps corresponding to those of Example A of the present invention were performed.

(i9) Thereafter, scribing was performed to attain a prescribed shape, and the resulting chip was provided as a light emitting device. The light emitting device had the size of 1.6 mm square.

(i10) to (i12) Process steps corresponding to those of Example A of the present invention were performed.

EXAMPLE J (j1) An off-substrate of an $Al_xGa_{1-x}N$ shifted off by 0.5° from the c-plane was used. The substrate had specific resistance of 0.01 Ω·cm and dislocation density of $1E7/cm^2$. The thickness of n-type $Al_xGa_{1-x}N$ substrate was 100 μm. Three different substrates with atomic ratio x of Al being 0.2, 0.5 and 1 were used.

(j2) By MOCVD, the following stacked structure was formed on the first main surface of $Al_xGa_{1-x}N$ substrate: (Si-doped n-type $Al_{0.2}Ga_{0.8}N$ layer as a clad layer/an MQW layer having three sets of 2-layered structures of GaN layer and $In_{0.05}Ga_{0.95}N$ layer stacked/Mg-doped p-type $Al_{0.2}Ga_{0.8}N$ layer as a clad layer/Mg-doped p-type GaN layer).

(j3) to (j5) Process steps corresponding to those of Example I of the present invention were performed.

(j6) On the second main surface of $Al_xGa_{1-x}N$ substrate, n-electrodes each having a square two-dimensional shape with each side having the width of 100 μm (100 μm square) were provided at a distance of 400 μm from each other, by photolithography, vapor deposition and lift-off method. The n-electrode was formed by forming a stacked structure including (Ti layer of 20 nm/Al layer of 100 nm/Ti layer of 20 nm/Au layer Of 200 nm) in this order from the lower side, formed in contact with the second main surface of $Al_xGa_{1-x}N$ substrate. The resulting body was subjected to heat treatment in an inert gas atmosphere, so that the contact resistance was reduced to 1E-4 Ω·cm² or lower.

(j7) to (j12) Process steps corresponding to those of Example I of the present invention were performed.

EXAMPLE K (k1) An off-substrate of GaN shifted off by 0.5° from the c-plane was used. The substrate had specific resistance of 0.01 Ω·cm, dislocation density of $1E7/cm^2$ and thickness of 1 mm (1000 μm).

(k2) to (k5) Process steps corresponding to those of Example I of the present invention were performed.

(k6) The chip size was set to 1.6 mm square, to be the same as Example G of the present invention. On the second main surface of GaN substrate, n-electrodes each having a square two-dimensional shape with each side having the width of 100 μm (100 μm square) were provided at a distance of 1.7 mm from each other, by photolithography, vapor deposition and lift-off method. Here, the ratio of the portion of the second main surface (light emitting surface) of GaN substrate where n-electrodes are not provided, that is, aperture ratio, is almost 100% per device. The thickness, heat treatment and contact resistance were the same as those in Example I.

(k7) to (k12) Process steps corresponding to those of Example I of the present invention were performed.

(Experiments and Results)

Figure 30:
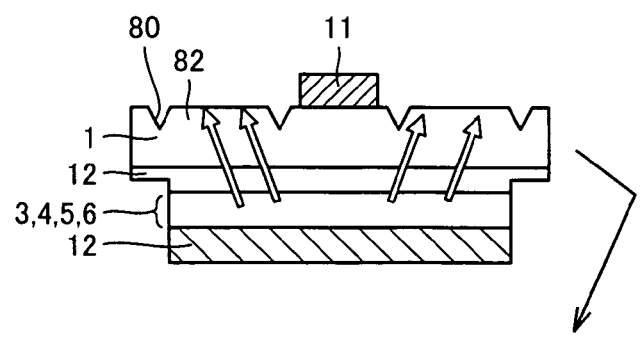
FIG. 30 is a schematic illustration of a transmittance measurement test of the LED in accordance with Embodiment 4 of the present invention.
Figure 31:
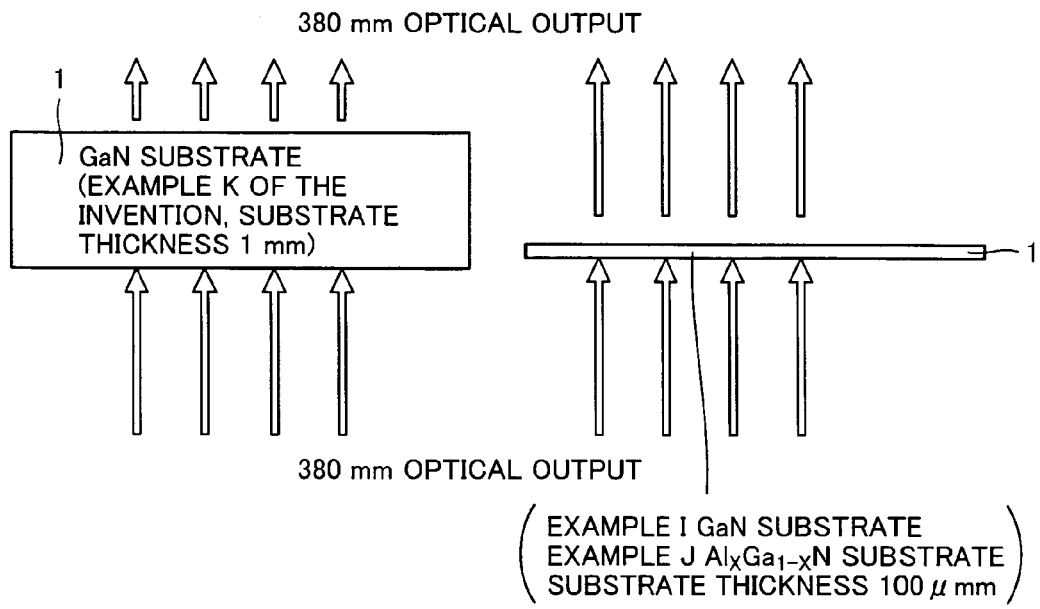
FIG. 31 shows the manner how light beams pass through the substrate, in the transmittance measurement test shown in FIG. 30.

First, substrates 1 of Examples I, J and K having different thicknesses were prepared, and transmittance of incident light having the wavelength of 380 nm was measured. FIGS. 30 and 31 are illustrations schematically showing the concept of transmittance measuring test. Examples I and J have the thickness of 100 μm, while Example K is thicker, that is, 1 mm (1000 μm). The test results are generally shown in FIG. 32.

Figure 32:
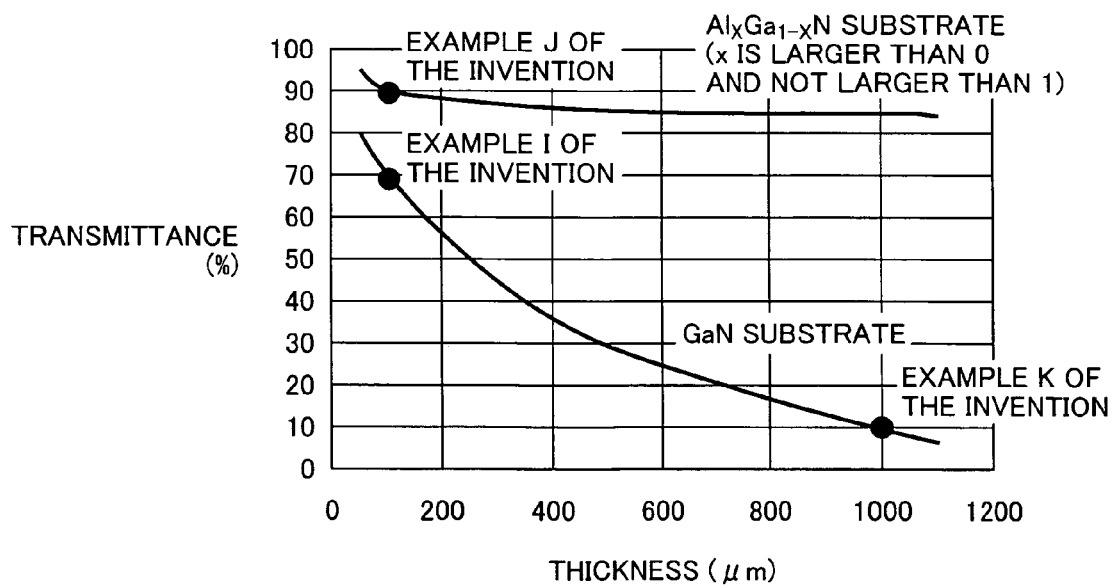
FIG. 32 shows influence of substrate thickness on transmittance.

Referring to FIG. 32, Examples I, J and K exhibited the transmittance of 70%, 90% and 10%, respectively. For Example J of the invention, three different substrates having Al atomic ratio x of 0.2, 0.5 and 1 were prepared, and all exhibited the transmittance of 90%.

Examples I, J and K provided with a fluorescent materials to be white LEDs were put in an integrating sphere, a prescribed current was applied, and optical output values collected and output from a detector were compared. When the current of 20 mA was applied, the outputs of Examples I, J and K were 4.2 mW, 5.4 mW (in any of the tree substrates) and 0.6 mW, respectively. The difference comes from different transmittance of the substrates. In case of the GaN substrate, light transmittance significantly decreases when the wavelength becomes shorter than 400 nm. Therefore, higher output of light can be attained by using the $Al_xGa_{1-x}N$ substrate as in the present invention.

Further, high optical output can be attained by making the GaN substrate thinner. When it is too thin, scope of current distributed from the n-electrode to the MQW becomes too small, and if it is too thick, efficiency of taking out the light degrades, as described above. Though it depends on emission wave length, preferable thickness is 50 μm to 500 μm. When a thin GaN substrate having the thickness of about 100 μm is used as in the present embodiment, cost of manufacturing the GaN substrate can be reduced, and a light emitting device can be manufactured at a lower cost. Needless to say, the cost can be reduced by decreasing the thickness of the substrate regardless of the emission wavelength.

Embodiment 5

In Embodiment 5 of the present invention, production yield of the thickness of n-type GaN layer formed on the substrate will be described. Three test samples were used, that is, Example L of the invention having the same structure as Example A of the invention using a GaN substrate, and Comparative Examples M and N having the same structure as Comparative Example B using a sapphire substrate.

EXAMPLE L (l1) Process step corresponding to that of Example A of the present invention was performed.

(l2) By MOCVD, the following stacked structure was formed (see FIG. 2): (GaN substrate/GaN buffer layer/Si-doped n-type GaN layer 2/Si-doped n-type $Al_{0.2}Ga_{0.8}N$ layer as a clad layer/an MQW layer having three sets of 2-layered structure of GaN layer and $In_{0.1}Ga_{0.9}N$ layer stacked/Mg-doped p-type $Al_{0.2}Ga_{0.8}N$ layer as a clad layer/Mg-doped p-type GaN layer). Referring to FIG. 2, thickness t of Si-doped n-type GaN layer 2 was set to 100 nm.

Figure 33:
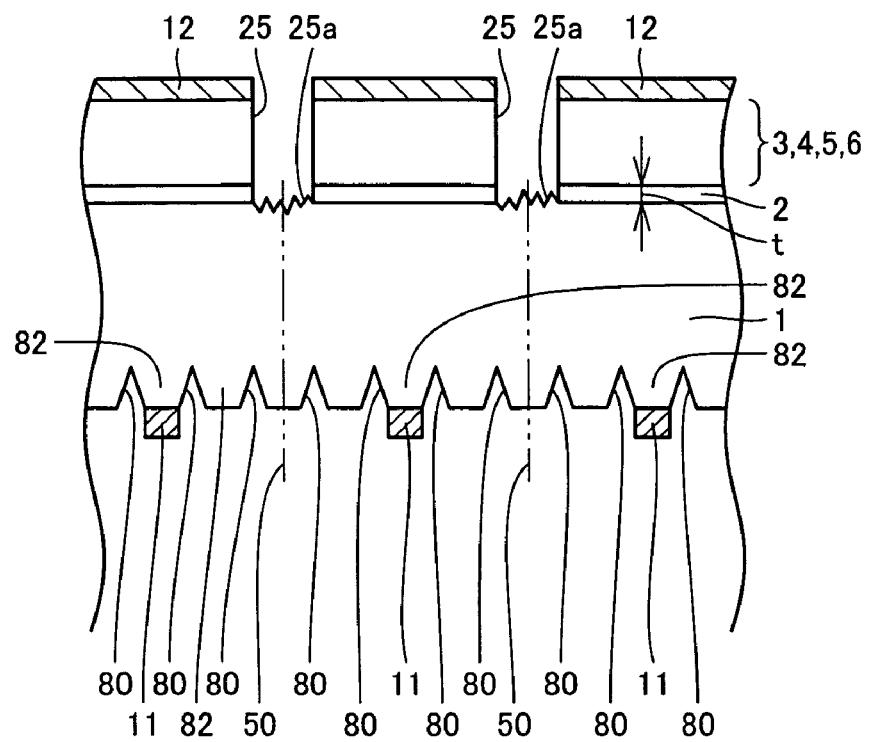
FIG. 33 shows a state after etching for element separation, in order to take an LED of Example L of the present invention from a wafer, in accordance with Embodiment 5 of the present invention.

(l3) to (l12) Process steps corresponding to those of Example A of the present invention were performed. Here, when a trench 25 is formed by etching for element separation, the bottom portion 25a of the etched trench is not perfectly flat but has some ups and downs, as shown in FIG. 33. In Example L of the present invention, even when the central portion attains to the GaN substrate or the buffer layer, production yield is not much influenced by the variation of depth or bottom flatness at this portion, as the electrode or the like is not formed here.

COMPARATIVE EXAMPLE M (m1) Process step corresponding to that of Comparative Example B was performed.

Figure 13:
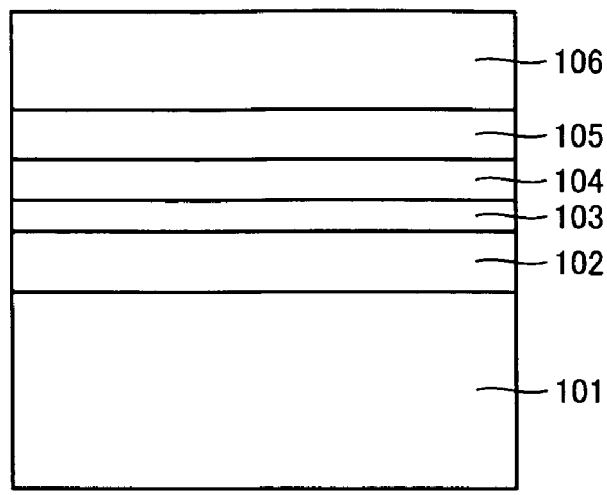
FIG. 13 shows a stacked structure including a light emitting layer of the LED of Comparative Example B.

(m2) By MOCVD, the following stacked structure was formed on the sapphire substrate (see FIG. 13): (sapphire substrate/GaN buffer layer/Si-doped n-type GaN layer/Si-doped n-type $Al_{0.2}Ga_{0.8}N$ layer as a clad layer/an MQW layer having three sets of 2-layered structure of GaN layer and $In_{0.1}Ga_{0.9}N$ layer stacked/Mg-doped p-type $Al_{0.2}Ga_{1.8}N$ layer as a clad layer/Mg-doped p-type GaN layer). Referring to FIG. 13, thickness of Si-doped n-type GaN layer 102 was set to 3 µm.

Figure 34:
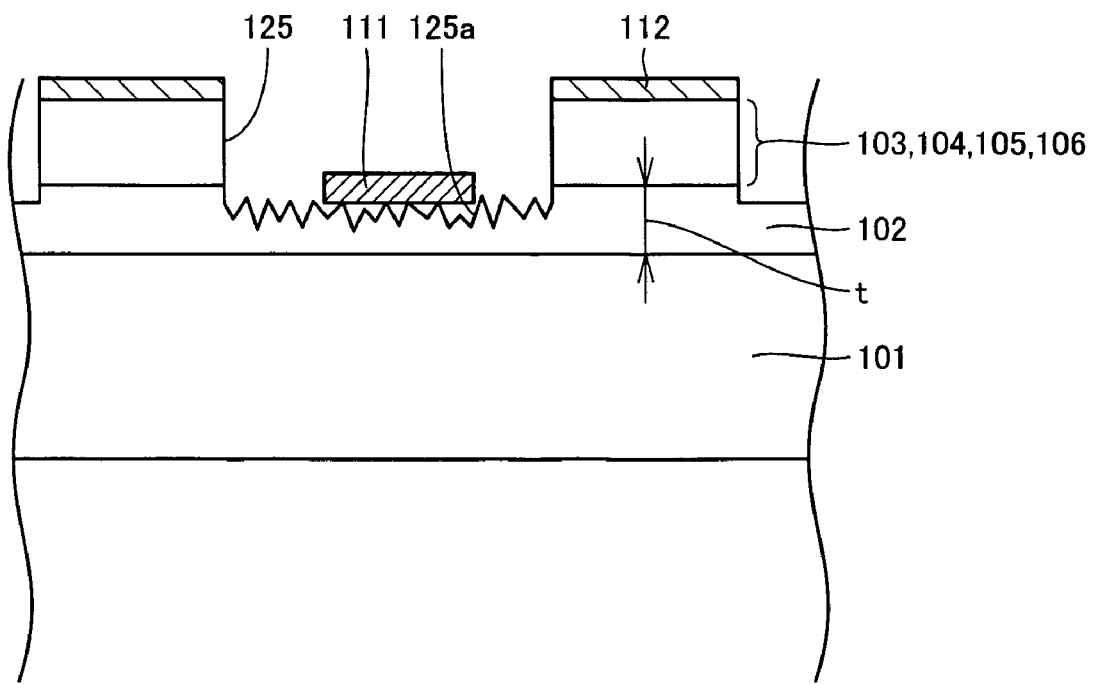
FIG. 34 show a state when etching for element separation is performed to take a LED of Comparative Example M from the wafer and an n-electrode is formed at a bottom portion of etched trench, in accordance with Embodiment 5 of the present invention.

(m3) to (m12) Process steps corresponding to those of Comparative Example B were performed. Here, when a trench 125 is formed by etching for element separation, the bottom portion 125a of the etched trench is not perfectly flat but has some ups and downs, as shown in FIG. 34. In Comparative Example M, Si-doped n-type GaN layer 102 is as thick as 3 µm, and therefore, the central portion does not reach the buffer layer or the sapphire substrate. As a result, production yield is not much influenced by the variation of depth or bottom flatness at this portion.

COMPARATIVE EXAMPLE N (n1) Process step corresponding to that of Comparative Example B was performed.

(n2) By MOCVD, the following stacked structure was formed on the sapphire substrate (see FIG. 13): (GaN buffer layer/Si-doped n-type GaN layer/Si-doped n-type $Al_{0.2}Ga_{0.8}N$ layer as a clad layer/an MQW layer having three sets of 2-layered structure of GaN layer and $In_{0.1}Ga_{0.9}N$ layer stacked/Mg-doped p-type $Al_{0.2}Ga_{0.8}N$ layer as a clad layer/Mg-doped p-type GaN layer). Referring to FIG. 13, thickness of Si-doped n-type GaN layer 102 was set to 100 nm.

(n3) and (n4) Process steps corresponding to those of Comparative Example B were performed.

(n5) In Comparative Example N, on a sapphire substrate, a GaN-based multi-layered film having a lattice constant different from that of sapphire is formed, and therefore, if the n-type GaN layer is as thin as 100 nm, a multi-layered film of satisfactory quality cannot be obtained, and as a result, optical output becomes extremely low.

Figure 35:
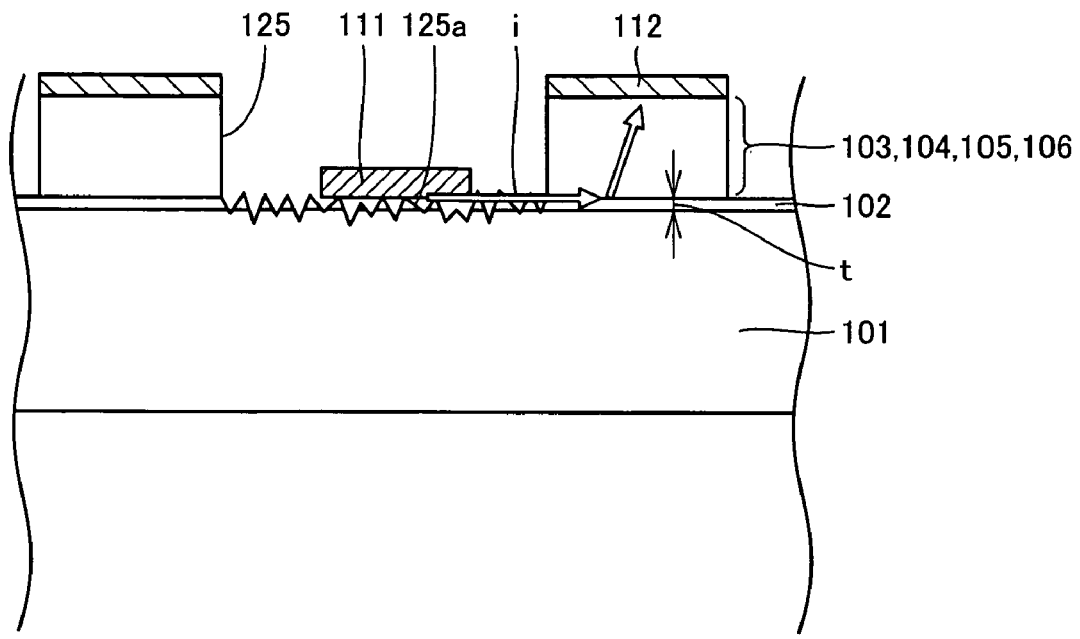
FIG. 35 show a state when etching for element separation is performed to take a LED of Comparative Example N from the wafer and an n-electrode is formed at a bottom portion of etched trench, in accordance with Embodiment 5 of the present invention.

Further, in Comparative Example N, the sapphire substrate is an insulator, and therefore, the n-electrode must be provided on the side of the same grown film as p-electrode. Therefore, the wafer was further etched by using a Cl-based gas from the side of Mg-doped p-type layer to the Si-doped n-type GaN layer, by photolithography and etching, so as to expose the n-type GaN layer to provide the n-type electrode. As shown in FIG. 35, however, in Comparative Example N, the Si-doped n-type GaN layer was as thin as 100 nm (0.1 µm), and therefore, the n-type GaN layer could not uniformly be exposed in the wafer. Consequently, the exposed surface was n-type $Al_xGa_{1-x}N$ substrate at some portion and GaN buffer at the other. Though wet etching was performed using hot phosphoric acid or the like, the result was similarly dissatisfactory no matter what etchant was used.

(Result of Experiment)

The optical output was measured in the similar manner as Embodiment 1. When the current of 20 mA was applied, Example L of the invention attained the output of 8 mW. The output of Comparative Example M was 7.2 mW when the same current was applied. In the structure of Example L of the invention, similar output could be attained when the thickness of n-type GaN layer was reduced from 3 µm to 100 nm. As the n-electrode can be formed on the N surface of conductive GaN substrate, it is unnecessary to expose the Si-doped n-type GaN layer.

Though it depends on intended wavelength or output, typically the thickness of a film of a light emitting device formed on a substrate is at most 6 µm, and in the example of the present invention, thickness of the Si-doped n-type GaN layer, which is most dominant, can be reduced from 3 µm to 100 nm. As a result, the cost of film formation can remarkably be reduced by the examples of the present invention.

As described with reference to the process step (n5) of test sample of Comparative Example N, if the n-type GaN layer is made as thin as 100 nm (0.1 µm), production yield of exposing the n-type GaN layer becomes too low and hence, it is impractical. Even if uniform exposure becomes possible in the future by advance in technology, the layer would be too thin, so that as in Comparative Example B of Embodiment 1, current density of the current flowing in the n-type GaN layer in a direction parallel to the layer would be too high and would cause increased heat generation. Thus, practical optical output would not be obtained (see FIG. 35). It is needless to say that similar effects can be attained when a fluorescent material is used to emit white light or when emission wavelength is changed.

Embodiment 6

In Embodiment 6, the influence of dislocation density of the GaN substrate on the optical output will be described. The test samples used are Example 0 of the present invention, of which dislocation density is $1E6/cm^2$ and Comparative Example P of which dislocation density is $1E9/cm^2$, both having the same structure as Example A of the invention.

EXAMPLE O (o1) An off-substrate of GaN shifted off by 0.5° from the c-plane was used. The substrate had specific resistance of 0.01 Ω·cm, dislocation density of $1E6/cm^2$ and thickness of 400 µm.

(02) to (012) Process steps corresponding to those of Example A of the invention were performed.

COMPARATIVE EXAMPLE P (p1) An off-substrate of GaN shifted off by 0.5° from the c-plane was used. The substrate had specific resistance of 0.01 Ω·cm and dislocation density of $1E9/cm^2$. The thickness of GaN substrate was set to be the same as Example O, that is, 400 µm.

(p2) to (p12) Process steps corresponding to those of Example A of the invention were performed.

(Results of Experiment)

The optical output was measured in the similar manner as in Embodiment 1. When the current of 20 mA was applied, Example 0 of the invention and Comparative Example P both attained the output of 8 mW, and when the current of 100 mA was applied, attained the outputs of 40 mW and 30 mW, respectively. Namely, Example 0 can attain higher optical output than Comparative Example P.

Example O of the invention and Comparative Example P have the same specific resistance and same thickness, and therefore, heat build-up and heat radiation from these samples are the same. In order to confirm that the difference in optical output described above does not come from the influence of heat, outputs were compared while applying pulse current with the duty ratio of 1%, application time of 1 μs and the cycle of 100 μs. The test result was the same as described above, and outputs of 40 mW and 30 mW were obtained when the current of 100 mA was applied, respectively.

Accordingly, we can conclude that optical output at high current density is made different by the different dislocation density, not by the influence of heat, though the mechanism thereof is not very clear. The inventors confirmed through experiments that similar effects could be attained when emission wavelength or layered structure was changed, or when a fluorescent material was used to emit white light.

Embodiment 7

In Embodiment 7 of the present invention, the influence of roughening of the surface and end surface on the optical output will be described. Test samples used were Examples Q and R of the present invention. Example Q is the LED shown in FIG. 36 with its surfaces an end surfaces made rough, while Example R is the LED shown in FIG. 37 not subjected to roughening.

EXAMPLE Q (q1) to (q8) Process steps corresponding to those of Example F of the invention were performed.

(Process step to be inserted between q8 and q9) The N surface of GaN substrate and end surfaces of the device were made rough. The method of such roughening may be wet etch or dry etch such as RIE. Other than etching, mechanical polishing may be adopted. In the present embodiment, wet etching was performed, using KOH solution as the etchant. The KOH solution of 4 mol/l was sufficiently stirred at a temperature of 40° C., the wafer was then dipped in stirrer for 30 minutes, so that the N surface of the GaN substrate and the end surfaces of the device were made rough.

(q9) to (q12) Process steps corresponding to those of Example F of the invention were performed.

EXAMPLE R

This is the same example as Example F of the invention.
(Results of Experiment)

Figure 36:
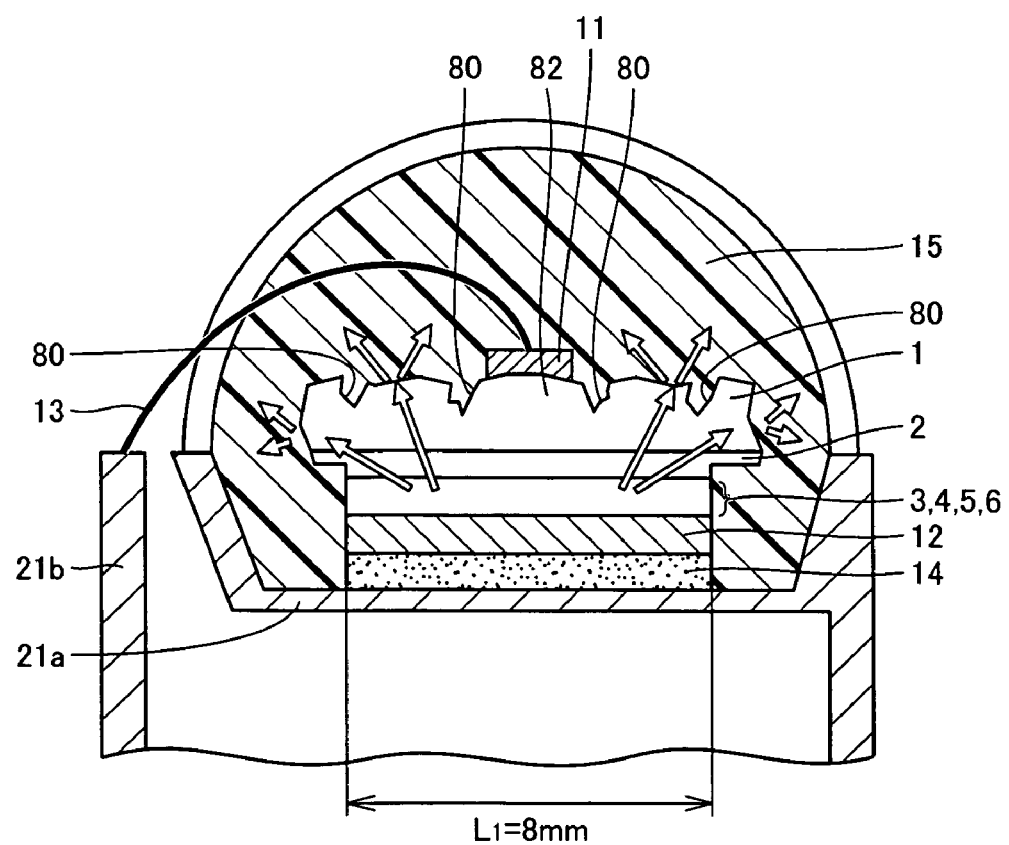
FIG. 36 shows an LED of Example Q in accordance with Embodiment 7 of the present invention.
Figure 37:
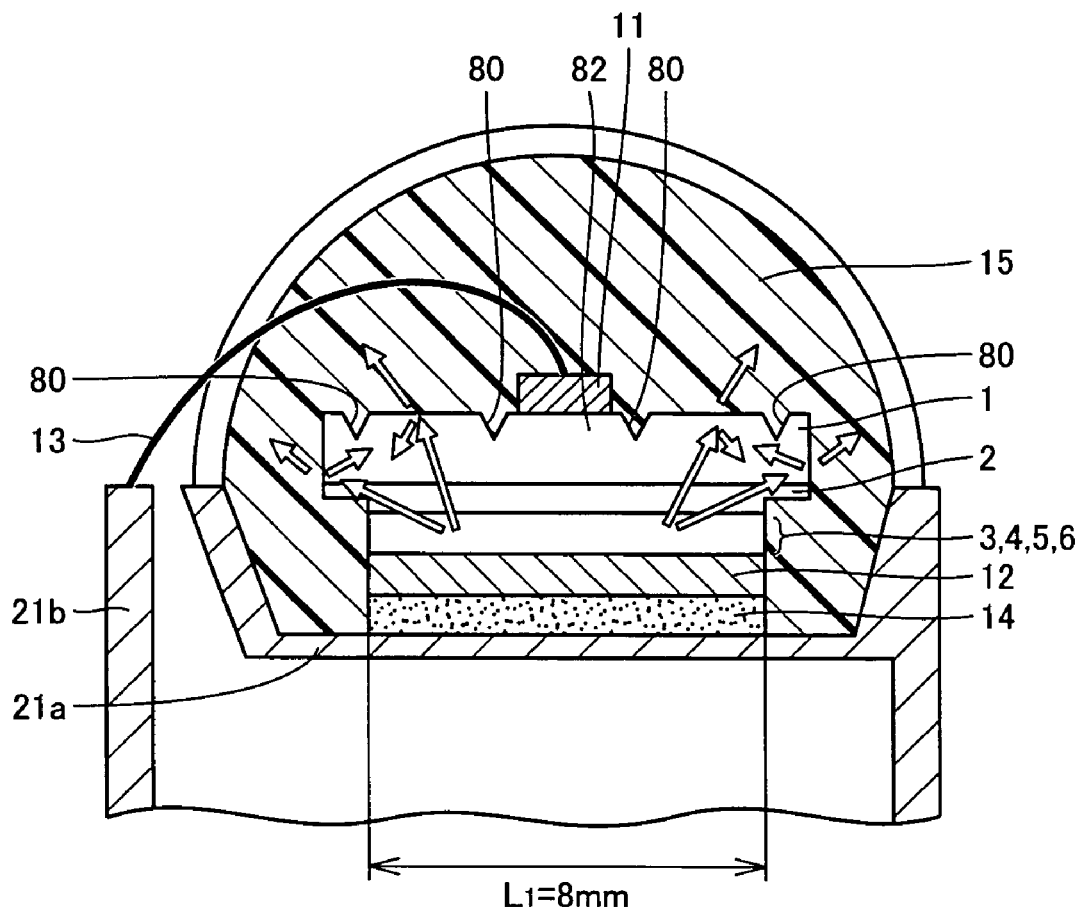
FIG. 37 shows an LED of Example R in accordance with Embodiment 7 of the present invention.

The optical output was measured in the similar manner as in Embodiment 1. When the current of 10 mA was applied, Example Q and R attained the output of 4.8 mW and 4 mW, respectively. When a fluorescent material was provided to attain white light emission and the current of 10 mA was applied, Example Q and R attained the output of 1150 lm and 960 lm, respectively. Specifically, Example Q of the invention attained higher optical output. It is needless to say that similar effects can be attained when emission wavelength is changed. The reason for this is that if the surface and the end surfaces of n-type GaN layer are mirror-finished, total reflection tends to occur at the surface of GaN layer having high refractive index, and the light beams do not easily go out, as shown in FIG. 37. In contrast, if the surfaces are made rough as shown in FIG. 36, efficiency of light emission to the outside becomes higher.

The inventors confirmed through experiments that, when the KOH solution was used for roughening, similar effects could be attained by setting the concentration to be in the range of 0.1 to 0.8 mol/l and the temperature in the range of 20 to 80° C.

Embodiment 8

In Embodiment 8 of the present invention, the influence of reflectance of p-type electrode on the optical output will be described. Text samples used were Examples S, T, U, V and W.

EXAMPLE S (s1) to (s6) Process steps corresponding to those of Example F of the invention were performed.

(s7) The p-electrode was formed by the following method. In contact with the p-type GaN layer, an Ni layer of 4 nm in thickness and an Au layer of 4 nm in thickness were formed in this order from the lower side. Then, the resulting body was heat-treated in an inert atmosphere. Then, an Ag layer having the thickness of 100 nm was formed on the Au layer. The p-electrode formed in this manner had the contact resistance of 5E-4 $\Omega \cdot cm^2$.

The structure of p-electrode described above (Ni layer of 4 nm/Au layer of 4 nm) was formed in this order from the lower side on a glass plate and subjected to the same heat treatment, and thereafter, transmittance was measured. As a result, transmittance of incident light having the wavelength of 450 nm from the side of Ni layer was 70%. Further, an Ag layer of 100 nm in thickness was placed on the glass plate and reflectance was measured. As a result, reflectance of 88% was obtained for the incident light of 450 nm. Then, (Ni layer of 4 nm/Au layer of 4 nm/Ag layer of 100 nm) was formed on a glass plate with the Ni layer being the lowest layer, the same heat treatment was performed, and reflectance was measured. The reflectance was 44% for the incident light of 450 nm. The reflectance is the same as that obtained when the incident light of 450 nm is passed through (Ni layer of 4 nm in thickness/Au electrode layer of 4 nm in thickness) at the transmittance of 70%, reflected by the Ag layer at the reflectance of 88% and again passed through (Ni layer of 4 nm in thickness/Au electrode layer of 4 nm in thickness) at the transmittance of 70%.

(s8) to (s12) Process steps corresponding to those of Example F of the invention were performed.

EXAMPLE T (t1) to (t6) Process steps corresponding to those of Example F of the invention were performed.

(t7) The p-electrode was formed in the following manner. On a p-type GaN layer, an Ni layer of 4 nm in thickness and an Au layer of 4 nm in thickness were formed in this order from the lower side. Then, the resulting body was heat-treated in an inert atmosphere. Then, on the Au layer, an Al layer of 100 nm in thickness and an Au layer of 100 nm in thickness were formed. The p-electrode formed in this manner had contact resistance of 5E-4 $\Omega \cdot cm^2$.

A stacked film of (Ni layer of 4 nm/Au layer of 4 nm) of the electrode was placed on a glass plate, the same heat treatment was performed and transmittance was measured. The transmittance of incident light of 450 nm from the side of Ni was 70%. Further, an Al layer of 100 nm in thickness was placed on the glass plate, and reflectance was measured, which was 84% for the incident light of 450 nm. Further, a stacked film of (Ni layer of 4 nm in thickness/Au layer of 4 nm in thickness/Al layer of 100 nm in thickness) was formed on a glass plate, the same heat treatment was performed and reflectance was measured. The reflectance was 42% for the incident light of 450 nm. The reflectance is the same as that obtained when the incident light of 450 nm is passed through (Ni layer of 4 nm in thickness/Au electrode layer of 4 nm in thickness) at the transmittance of 70%, reflected by the Al layer at the reflectance of 42% and again passed through (Ni layer of 4 nm in thickness/Au electrode layer of 4 nm in thickness) at the transmittance of 70%.

(t8) to (t12) Process steps corresponding to those of Example F of the invention were performed.

EXAMPLE U (u1) to (u6) Process steps corresponding to those of Example F of the invention were performed.

(u7) As the p-electrode, Rh having the thickness of 100 nm, which was an ohmic electrode to the p-type GaN layer and had high reflectance, was formed on the entire surface of p-type GaN layer. The contact resistance was 5E-4 $\Omega \cdot cm^2$. The Rh of this electrode was placed on a glass plate and transmittance was measured, which was 60% for the incident light of 450 nm.

(u8) to (u12) Process steps corresponding to those of Example F of the invention were performed.

EXAMPLE V (v1) to (v8) Process steps corresponding to those of Example S of the invention were performed.

(Process step to be inserted between v8 and v9) Process step corresponding to that inserted between q8 and q9 of Example P of the invention was performed.

(v9) to (v12) Process steps corresponding to those of Example S of the invention were performed.

EXAMPLE W

Example W is the same as Example F of the invention.
(Results of Experiment)

Figure 38:
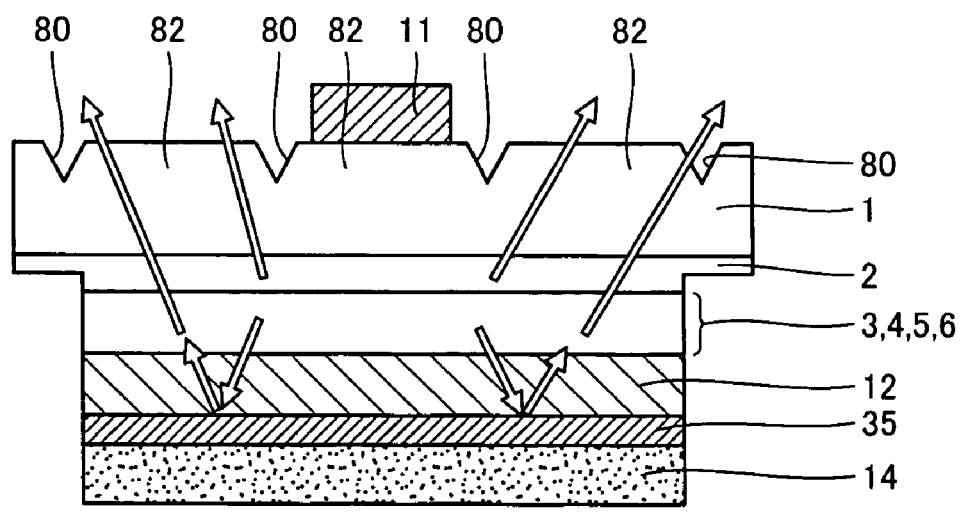
FIG. 38 shows LEDs of Examples S and T in accordance with Embodiment 8 of the present invention.
Figure 39:
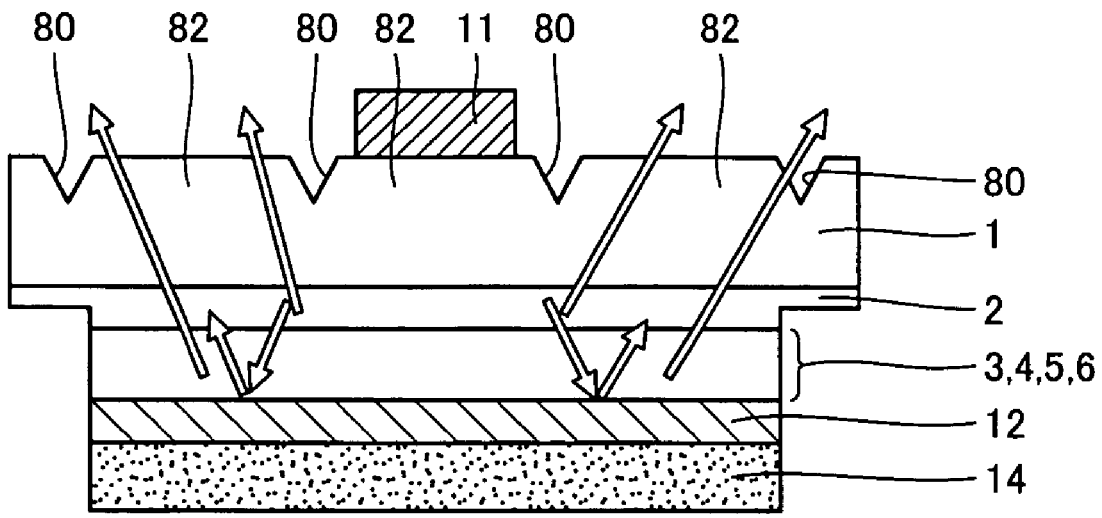
FIG. 39 shows an LED of Example U in accordance with Embodiment 8 of the present invention.
Figure 40:
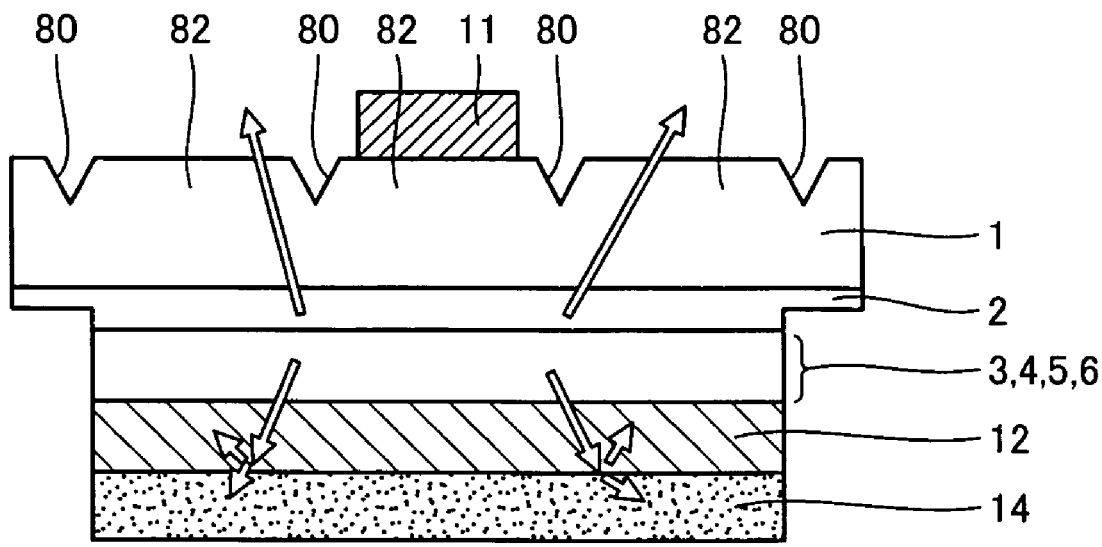
FIG. 40 shows an LED of Example W in accordance with Embodiment 8 of the present invention.

Optical outputs were measured in the similar manner as in Embodiment 1. When the current of 10 A was applied, Examples S, T, U, V and W of the invention attained the outputs of 4.8 W, 4.8 W, 5.2 W, 5.8 W and 4 W. The reflection on the mounting side of Examples S and T of the invention is schematically shown in FIG. 38, reflection on the mounting side of Example U is schematically shown in FIG. 39 and reflection on the mounting side of Example W is schematically shown in FIG. 40. In Examples S and T of the invention, a high reflectance layer 35 is arranged between p-electrode 12 and conductive adhesive 14, in Example U, p-electrode 12 itself is made of a material having high reflectance, and further in Example V, the surfaces are made rough. In Example W, reflectance on the mounting side is not specifically considered.

When fluorescent materials were provided in Examples S, T, U and V of the Invention to form white LEDs and a current of 10 A was applied, optical outputs were 864 lm, 864 lm, 963 lm and 1044 lm, respectively. From these results, it can be understood that by forming the p-electrode from a material having high reflectance, or by arranging a high reflectance material between the p-electrode and the conductive adhesive, the light can efficiently be utilized and optical output can be enhanced. Specifically, by inserting a reflective film of Ag, Al or Rh to the electrode layer of p-electrode itself or between the p-electrode and the conductive adhesive, the optical output could further be enhanced. Further, by making rough the N surface and end surfaces of the GaN substrate as in Example V of the invention, further improvement could be attained.

These effects can be attained at any wavelength, though it is difficult to specify how effective, as reflectance of Ag layer or Al layer and absorption in Au or Ni layer vary when emission wavelength is changed. Further, in place of Rh, an element having comparable or higher work function and comparable or higher reflectance may be used to attain the comparable or higher effect.

Embodiment 9

In Embodiment 9, a relation between oxygen concentration and specific resistance of GaN substrate and light transmittance was studied. Based on the relation, a relation between the oxygen concentration and the optimal thickness of GaN substrate for a prescribed area of light emission is established in a p-down-mounted type light emitting device, that is a device having the GaN substrate as the light emitting surface. As described above, when p-side is mounted face-down, the GaN substrate serves as the light emitting surface, and therefore, the oxygen concentration having significant influence on the specific resistance and light transmission is of critical importance.

Figure 41:
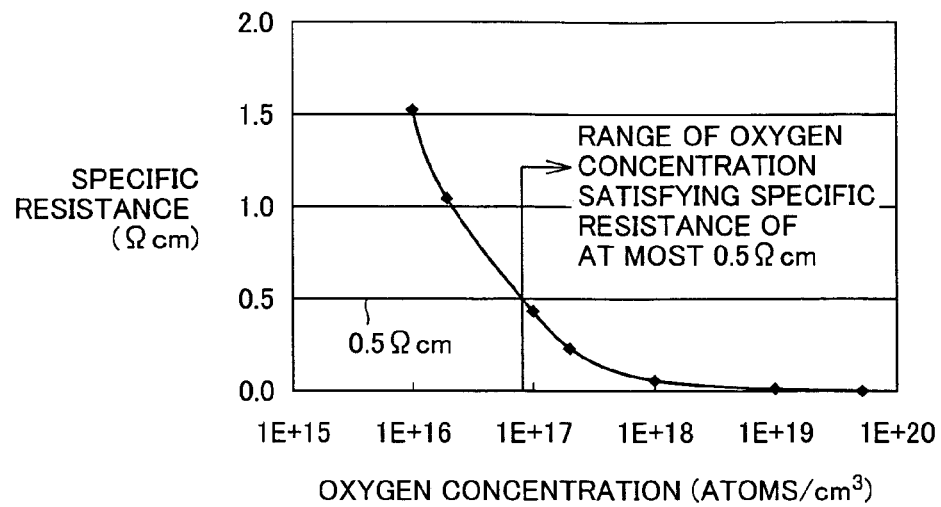
FIG. 41 represents an influence of oxygen concentration on specific resistance of the GaN substrate in accordance with Embodiment 9 of the present invention.
Figure 42:
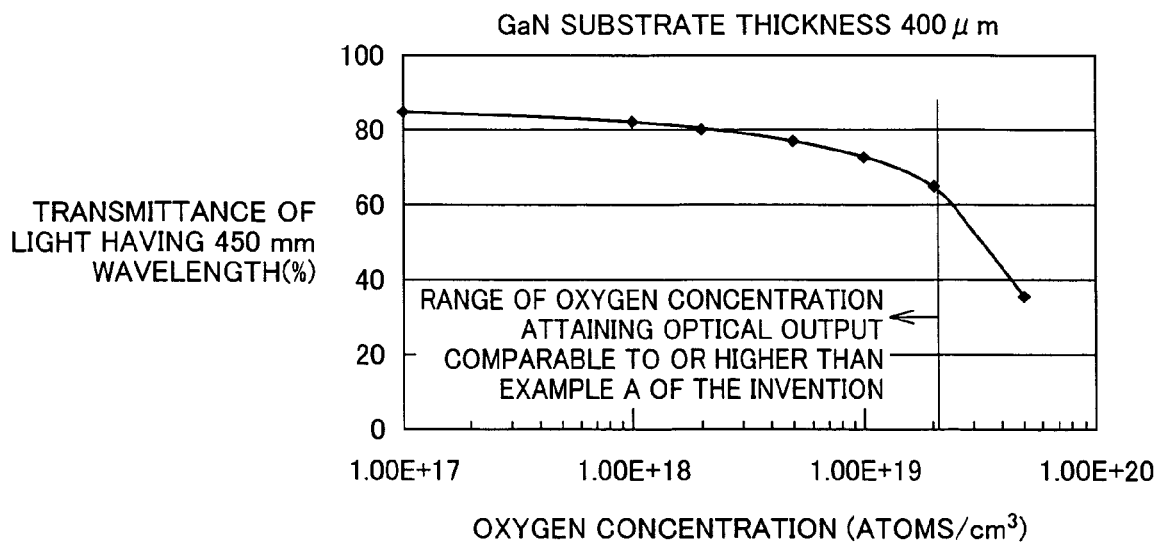
FIG. 42 represents influence of oxygen concentration on transmittance of light (wavelength: 450 nm) of the GaN substrate in accordance with Embodiment 9 of the present invention.

It can be seen from FIG. 41 that specific resistance of 0.5 $\Omega cm$ or lower can be attained when the oxygen concentration is set to $1E17/cm^3$ or higher. Further, it can be seen from FIG. 42 that transmittance of light having the wavelength of 450 nm abruptly decreases when the oxygen concentration exceeds $2E19/cm^3$. FIGS. 41 and 42 show that increase in oxygen concentration is effective to decrease the specific resistance of GaN substrate and to enlarge the light emitting surface, while it decreases the light transmittance. Therefore, it is very important how to set the oxygen concentration, thickness and two-dimensional size of light emitting surface of the GaN substrate when the substrate is used for the p-down-mounted type light emitting device.

Figure 43:
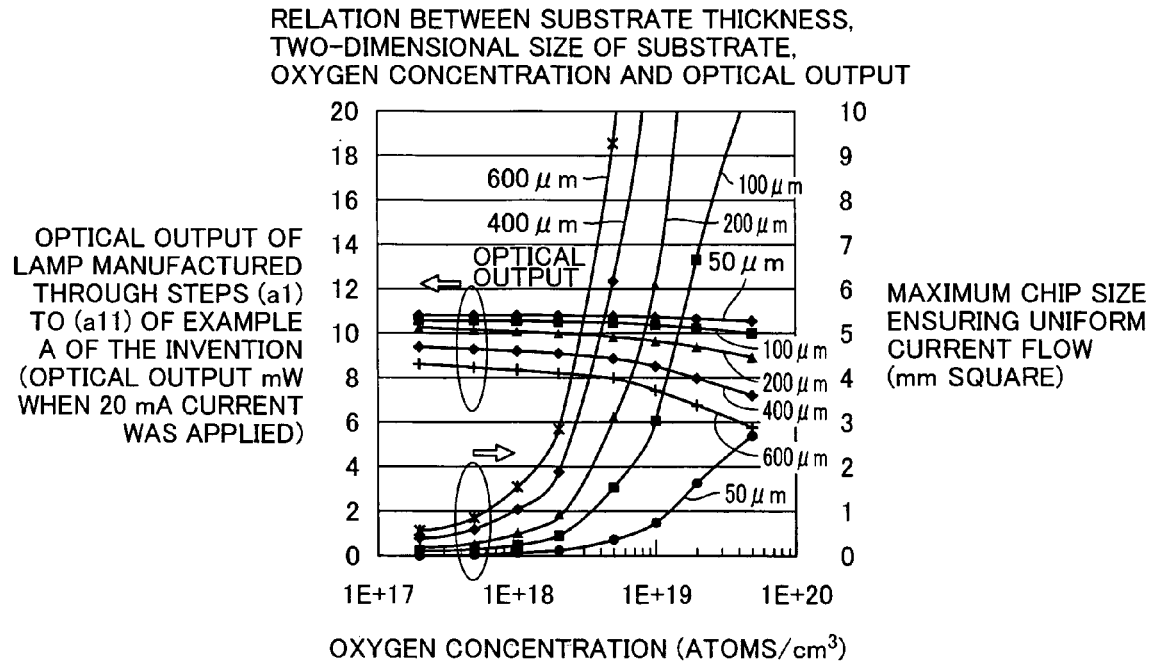
FIG. 43 shows optical outputs and two-dimensional size assuring uniform current flow of light emitting devices formed from GaN substrates with thickness and oxygen concentration varied.

Referring to FIG. 43 plotting the optical output of the lamp, it can be seen that the thicker the substrate and the higher the oxygen concentration, the lower becomes the optical output. As for the maximum two-dimensional size over which the current flows uniformly, the size becomes larger if the substrate is thicker and the oxygen concentration is higher.

Referring to FIG. 43, assume that the two-dimensional size over which the current flows uniformly is a square of 4 mm×4 mm (5 mm×5 mm), and the optical output of 8 mW or higher is to be attained with the applied current of 20 mA by a device having the size of Example A of the invention. In that case, when the GaN substrate having the thickness of 200 μm is used, uniform light emission can be attained while optical output of 8 mW or higher can be ensured with applied current of 20 mA, by setting the oxygen concentration of $6E18/cm^3$ or higher (for the size of 5 mm×5 mm, $8E18/cm^3$ or higher). Specifically, considering the current density and the application of 20 mA to the square of 300 μm×300 μm of Example A, it corresponds to application of 3.6 A (5.6 A) in a square of 4 mm×4 mm (5 mm×5 mm), and therefore, when a current of 3.6 A (5.6 A) is applied, uniform light emission is realized maintaining optical output of 1.4 W (2.3 W) or higher in proportion to the applied current.

When the same target performance as that attained by the thickness of 200 μm is to be attained by using a GaN substrate having the thickness of 400 μm, the oxygen concentration may be $3E18/cm^3$ or higher for a square of 4 mm×4 mm (for a square of 5 mm×5 mm, $4E18/cm^3$ or higher). It is noted, however, that optical output comparable to 8 mW or higher cannot be attained by a device having the size of Example A when the current of 20 mA is applied, unless the oxygen concentration is set to at most $2E19/cm^3$, if the thickness is 400 μm.

For a GaN substrate having the thickness of 600 μm, the oxygen concentration that ensures uniform current flow over the square area of 4 mm×4 mm is $2.5E18/cm^3$, and the limit value of oxygen concentration when the optical output of 8 mW or higher is attained with the applied current of 20 mA for the size of Example A is only slightly higher than $2.5E18/cm^3$. Therefore, the range of oxygen concentration that satisfies the two conditions above is quite narrow. The oxygen concentration that ensures uniform current flow over the square area of 3 mm×3 mm is about $2E18/cm^3$ or higher, and therefore, the tolerable range of oxygen concentration becomes slightly wider than for the square area of 4 mm×4 mm.

It is understood from FIG. 43 that using the GaN substrate having the thickness of 200 μm to 400 μm, the practical range of oxygen concentration is sufficiently large to ensure the optical output of 8 mW or higher with the applied current of 20 mA for the size of Example A, when a uniform current is caused to flow over a square of 10 mm×10 mm. If the thickness is 200 μm, oxygen concentration as low as $2E19/cm^3$ is possible and if the thickness is 400 μm, oxygen concentration as low as $8E18/cm^3$ is possible.

Specific examples will be described in the following. Test samples used are as follows.

EXAMPLE S1

A GaN substrate having the thickness of 400 μm, adapted to have n-type conductivity with the oxygen concentration of $1E19/cm^3$ was used. The oxygen concentration was measured by SIMS (Secondary Ion Mass Spectroscopy). The GaN substrate had the specific resistance of 0.007 Ωcm and transmittance of 72% for the light having the wavelength of 450 nm. The device was formed using the GaN substrate as such, under the same condition as Example A of the invention, except for the points described above. Specifically, the two-dimensional size of GaN substrate was set such that the light emitting surface was a square of 0.3 mm×0.3 mm (see (a1) of Embodiment 1), and (a2) by MOCVD, the following stacked structure was formed on the Ga surface, that is, the first main surface of GaN substrate: (Si-doped n-type GaN layer/Si-doped n-type $Al_{0.2}Ga_{0.8}N$ layer as a clad layer/an MQW having three sets of 2-layered structure of GaN layer and $In_{0.15}Ga_{0.85}N$ layer stacked/Mg-doped p-type $Al_{0.2}Ga_{0.8}N$ layer as a clad layer/Mg-doped p-type GaN layer).

COMPARATIVE EXAMPLE T1

A GaN substrate having the thickness of 400 μm, adapted to have n-type conductivity with the oxygen concentration of $5E19/cm^3$ was used. The GaN substrate had the specific resistance of 0.002 ≠cm and transmittance of 35% for the light having the wavelength of 450 nm. Other conditions were the same as those of Example S1 of the invention.

COMPARATIVE EXAMPLE T2

A GaN substrate having the thickness of 400 μm, adapted to have n-type conductivity with the oxygen concentration of $2E16/cm^3$ was used. The GaN substrate had the specific resistance of 1.0 ≠cm and transmittance of 90% for the light having the wavelength of 450 nm. Other conditions were the same as those of Example S1 of the invention.

(Tests and Results): Light emitting devices having p-side mounted face-down were formed using the test samples, and a current of 20 mA was applied. Example S1 of the invention attained the optical output of 8 mW, whereas Comparative Examples T1 and T2 attained the optical output as low as 4 mW and 5 mW, respectively. The optical output of 4 mW of Comparative Example T1 is in accordance with the transmittance of GaN substrate. For Comparative Example T2, the state of light emission from the second surface of GaN substrate as the light emitting surface was observed, and it was found that light emission was uneven in the plane. Specifically, emission intensity was extremely high around the n-electrode, and the emission intensity degrades abruptly as the distance from the n-electrode increases. The reason for this was that the GaN substrate had high specific resistance, and therefore, the current flowing through the n-electrode did not sufficiently spread over the surface of the light emitting device. Therefore, light was emitted only around the p-electrode at which the current concentrates. As a result, the optical output of light emitting device according to Comparative Example 2 was lower than that of Example S1 of the invention.

Embodiment 10

Embodiment 10 of the present invention is characterized in that the dislocation flux density in the GaN substrate in the p-down-mounted type light emitting device is limited to enhance optical output. When the GaN substrate is formed, in order to enhance crystal characteristic of most areas, unavoidable dislocations are concentrated and collected so that dislocation fluxes are distributed in discrete manner, whereby crystal characteristic of most of the portions therebetween can be enhanced. In the p-down-mounted type light emitting device, the GaN substrate is arranged on the light emitting side, and it was confirmed that dislocation flux density had dramatic influence beyond estimate on production yield of the light emitting device, when the density exceeded a prescribed value (dislocation flux density of $4E2/cm^2$).

Figure 44:
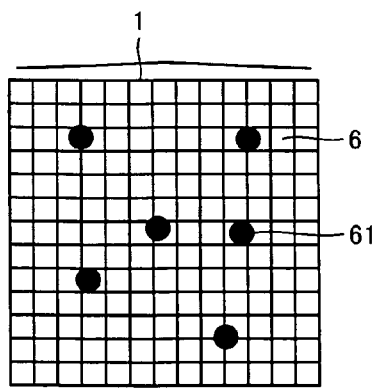
FIG. 44 shows cores in the GaN substrate taken over to the epitaxial layer in accordance with Embodiment 10 of the present invention.
Figure 45:
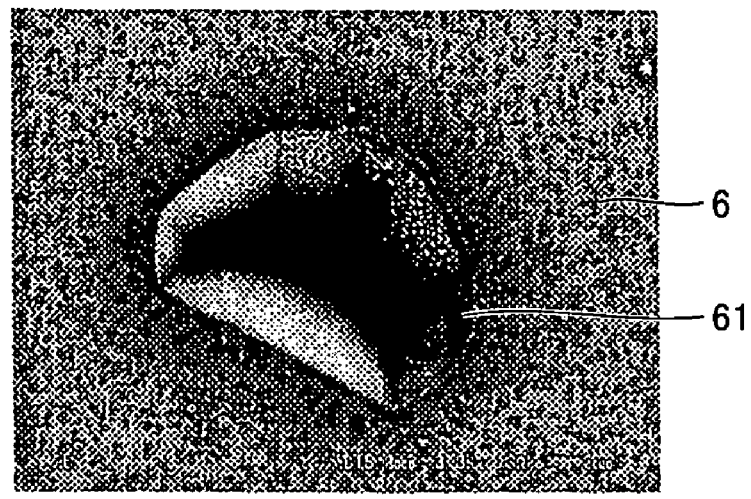
FIG. 45 shows a core taken over to an epitaxial layer, as a concave hole.

The dislocation flux of GaN substrate is taken over to the epitaxial p-type GaN layer 6 such as the p-type GaN layer shown in FIG. 44, and appears as a core 61 on the epitaxial film. Therefore, dislocation flux density is approximately the same as the core density. Dependent on the film forming condition of the epitaxial film, the core comes to be a concave hole such as shown in FIG. 45. The density of such concave holes has dramatic influence on the production yield of p-down-mounted type light emitting devices.

The test samples used are as follows.

EXAMPLE S2

A GaN substrate having one dislocation flux per 500 μm×500 μm in average was used. This corresponds to dislocation flux density of $4E2/cm^2$. Other conditions are the same as those of Example S1 of the invention.

COMPARATIVE EXAMPLE T3

A GaN substrate having one dislocation flux per 10 μm×10 μm was used. This corresponds to dislocation flux density of $1E6/cm^2$. Other conditions are the same as those of Example S2 of the invention.

(Tests and Results): A plurality of light emitting devices were formed using the GaN substrates described above, on actual production basis. A current of 20 mA was applied to each test sample, to find the production yield that ensured optical output of 8 mW. As a result, the production yield of Example S2 of the invention was 95%, while the production yield of Comparative Example T3 was 50%. Specifically, when the dislocation flux density was at most 4E/cm2, the production yield remains practical, and if the density becomes higher, continuous production on commercial basis becomes difficult.

A light emitting device of which optical output was lower than 8 mW was decomposed and the chip was taken out for inspection. From the chip taken out in this manner, electrodes were removed by an appropriate acid solution, and the chip was observed from the side of p-type semiconductor layer. As a result, in a plurality of samples, epitaxial layer was not formed at portions where dislocation fluxes were distributed, on the GaN substrate. At a portion where a dislocation flux was distributed, a concave hole having the diameter of about 1 μm was observed. Such a concave hole was not observed in a device of which optical output was 8 mW.

To the test samples described above, a current of 20 mA was caused to flow in the step corresponding to step (a7) of manufacturing Sample A of Embodiment 1. Light emitting devices including the concave holes all had driving voltage smaller than 1V. The reason for this may be that the concave hole was filled with the electrode so that layers on the sides of n- and p-electrodes were short-circuitted, and the current could not spread over the entire active layer and hence sufficient amount of current was not supplied. This led to low optical output.

Embodiment 11

Figure 46:
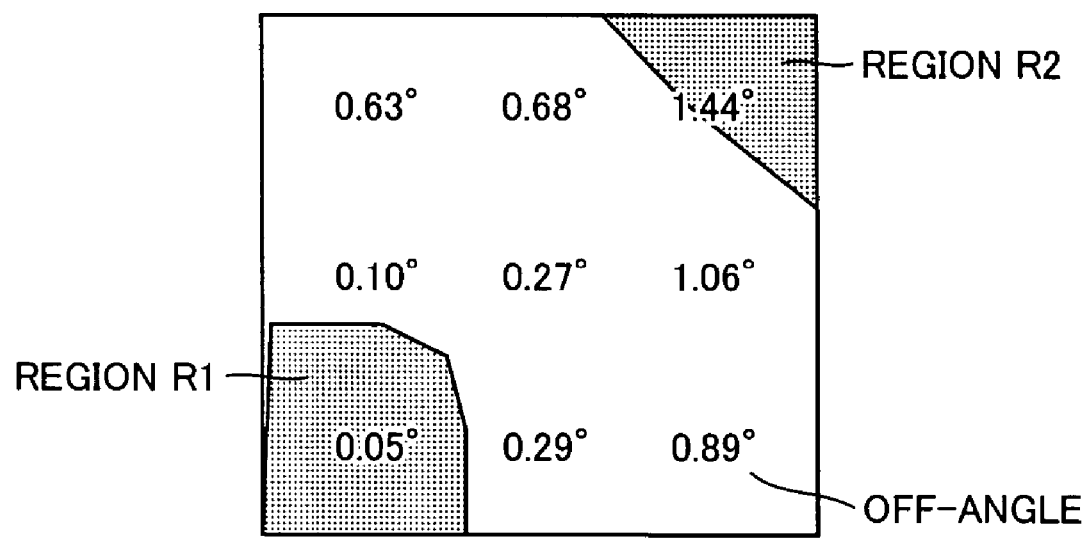
FIG. 46 shows distribution of off-angles from a c-plane of GaN substrate having the size of 20 mm×20 mm, in accordance with Embodiment 11 of the present invention.

Embodiment 11 of the present invention is characterized in that between the GaN substrate and the n-type AlGaN clad layer 3, an n-type AlGaN buffer layer and an n-type GaN buffer layer are arranged. Typically, a substrate is warped, and GaN substrate is particularly so. Therefore, in the GaN substrate, the off-angle also much fluctuates in the plane of the substrate, as shown in FIG. 46. FIG. 46 shows an exemplary off-angle distribution in a GaN substrate of 20 mm×20 mm. An epitaxial film was formed on the GaN substrate, and the resulting body was cut into light emitting elements, of which optical outputs were measured. The light emitting devices formed from the region R1 positioned at a corner and having a small off-angle at the level of 0.05°, and the light emitting devices formed from the region R2 having a large off-angle at the level of 1.5° could not attain the optical output exceeding 8 mW when a current of 20 mA was applied. The reason for this is that the epitaxial film formed on the GaN substrate has poor the crystal characteristic. In view of this, between GaN substrate 1 and AlGaN clad layer 3, an n-type AlGaN buffer layer 31 and an n-type GaN buffer layer 32 having lattice constants intermediate between these two layers were arranged, so as to mediate the difference in lattice constant. Specifically, the embodiment is characterized in that the n-type AlGaN buffer layer 31 is arranged at that position.

The test samples used were as follows.

EXAMPLE S3

Figure 47:
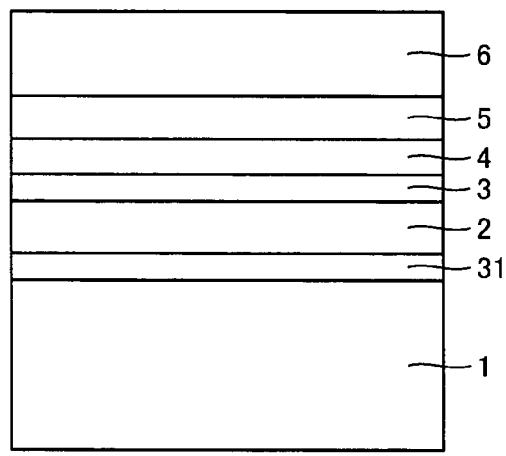
FIG. 47 shows a structure having a buffer layer arranged between the GaN substrate and an AlGaN clad layer, in accordance with Embodiment 11 of the present invention.

In the GaN substrate used, the off-angle from the c-plane in the 20 mm×20 mm plane continuously varies from the region of 0.05° to the region of 1.5°. The GaN substrate had the specific resistance of 0.01 Ω·cm, dislocation density of 1E7/ cm$^2$ and thickness of 400 μm. Using the GaN substrate having such off-angle distribution, light emitting devices were formed from various positions of the 20 mm×20 mm substrate, in accordance with the steps (a1) to (a12) of manufacturing Example A of Embodiment 1. At this time, as shown in FIG. 47, an Al$_{0.15}$Ga$_{0.85}$N buffer layer having the thickness of 50 nm was arranged between GaN substrate 1 and n-type GaN buffer layer 2.

COMPARATIVE EXAMPLE T4

In the GaN substrate used, the off-angle from the c-plane in the 20 mm×20 mm plane continuously varies from the region of 0.05° to the region of 1.5°. The GaN substrate had the specific resistance of 0.01 Ω·cm, dislocation density of 1E7/ cm$^2$ and thickness of 400 μm. Light emitting devices were formed from various positions of the substrate, in accordance with the steps (a1) to (a12) of manufacturing Example A of Embodiment 1. In Comparative Example T4, the n-type GaN layer was formed in contact with the GaN substrate 1, and the Al$_{0.15}$Ga$_{0.85}$N buffer layer was not formed between the GaN substrate and n-type GaN layer.

Figure 48:
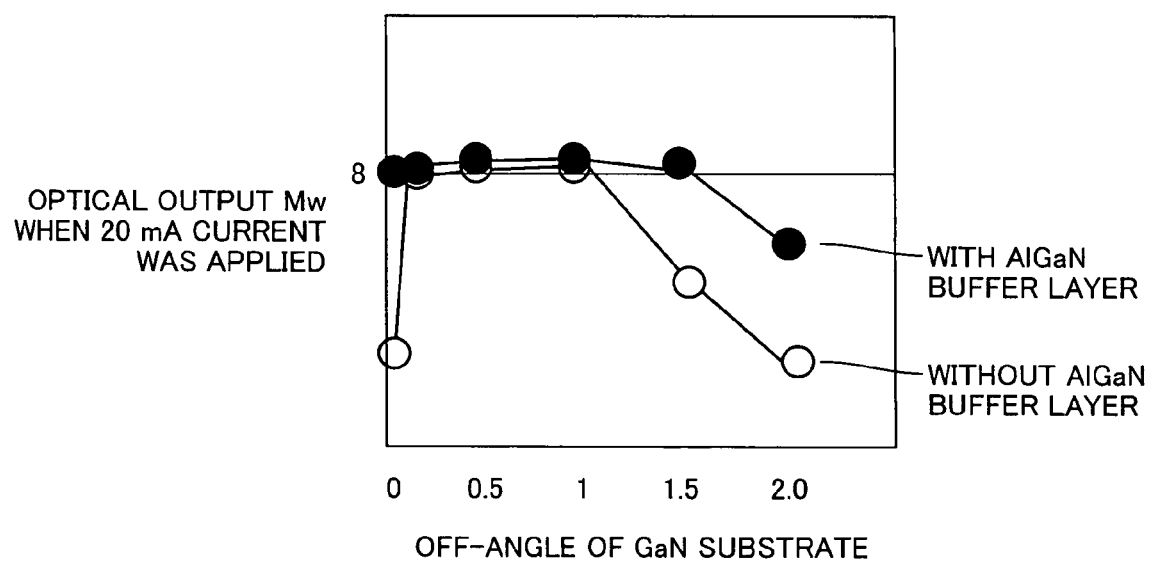
FIG. 48 shows results of widened off-angle range at which optical output of at least 8 mW can be attained, in accordance with Embodiment 11 of the present invention.

(Tests and Results): When a current of 20 mA was applied, in Example S3 of the invention, the optical output of 8 mW or higher could be obtained from the regions having the off-angle of 0.05° to 1.5°, including the regions R1 and R2 mentioned above, of the 20 mm×20 mm GaN substrate (see FIG. 48). In Comparative Example T4, however, the optical output of 8 mW or higher could be obtained only from the light emitting devices formed on the regions having the off-angle of 0.1° to 1.0°. With the off-angle of 0.05° and 1.5°, optical output was lower than 8 mW.

The reason for this is that in Example S3 of the invention, even when a GaN substrate having much fluctuating off-angle, an epitaxial layer having superior crystal characteristic can be formed because of the arrangement of Al$_{0.15}$Ga$_{0.85}$N buffer layer.

Embodiment 11-2

Similar to Embodiment 11, Embodiment 11-2 of the present invention is characterized in that an n-type AlGaN buffer layer and an n-type GaN buffer layer are arranged between the GaN substrate and the n-type AlGaN clad layer 3, so as to eliminate the concave hole shown in FIG. 45 that is generated when the epitaxial layer is formed at a the portion of dislocation flux of the GaN substrate in Embodiment 10.

EXAMPLE S2-2

Similar to Comparative Example T3, a GaN substrate having the diameter of 2 inches and one dislocation flux per 10 μm×10 μm was used. This corresponds to dislocation flux density of 1E6/cm$^2$. As shown in FIG. 47, between the GaN substrate 1 and the n-type buffer layer 2, an Al$_{0.15}$Ga$_{0.85}$N buffer layer having the thickness of 50 nm was arranged. Other conditions were the same as those of Example S2 of the invention.

(Tests and Results)

After formation of the epitaxial layer, the wafer plane of the side of the epitaxial layer was observed using a differential interference microscope and an SEM (scanning electron microscope). As a result, it was confirmed that there was no concave hole such as shown in FIG. 45. Light emitting devices were formed entirely on the GaN substrate having the diameter of 2 inches, except for the outer periphery of about 5 mm. One device was sampled out from every 50 resulting light emitting devices, a current of 20 mA was applied, and yield of devices that attain the optical output of 8 mW or higher was studied. The production yield was 100%. This means that if a larger number of products were manufactured, the production yield lower than but very close to 100% could be attained, because of manufacturing factors other then the concave holes. The test focused only on the concave holes resulted in the uniquely high production yield of 100%.

Embodiment 12

Embodiment 12 of the present invention is characterized in that a p-type AlGaN layer with increased conductivity is arranged outside the MQW4/p-type AlGaN clad layer 5/p-type GaN layer 6, and only the Ag electrode layer having high reflectance is arranged as the p-electrode on the entire surface. Therefore, other metal electrode considering the work function and the like is not provided. This arrangement provides high reflectance at the bottom of the down side, and light absorption that would otherwise occur when other electrode is used becomes smaller, resulting in higher efficiency of light emission.

The test samples used were as follows.

Figure 49:
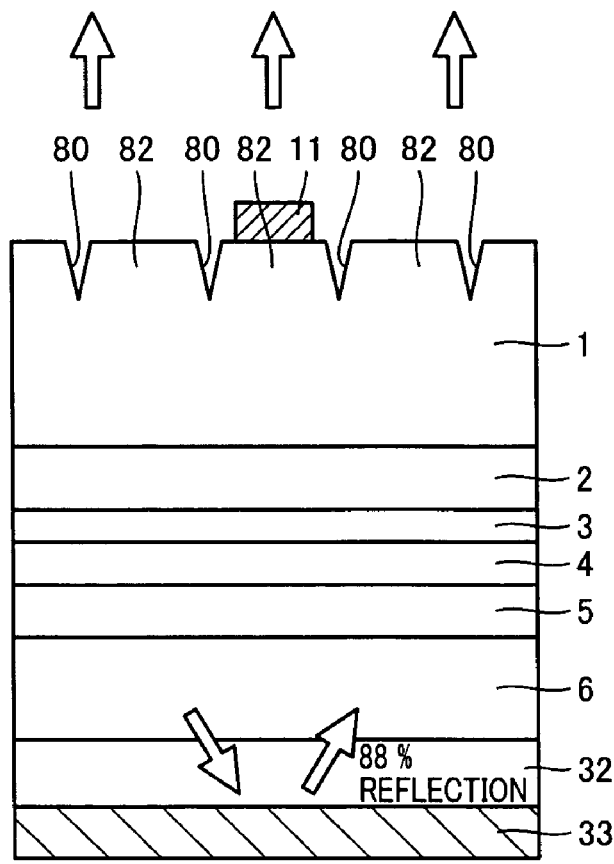
FIG. 49 shows a light emitting device in accordance with Embodiment 12 of the present invention.

(Sample S4 (see FIG. 49)): This sample has, on the Ga surface, that is, the first main surface of the GaN substrate, the following stacked structure: /MQW 4/Mg-doped p-type $Al_{0.2}Ga_{0.8}N$ layer 5 as a clad layer/Mg-doped p-type GaN layer 6/Mg-doped InGaN layer 32 having the thickness of 5 nm. The stacked structure above is characterized in that it has a Mg-doped InGaN layer 32 having the thickness of 5 nm in contact with the Mg-doped p-type GaN layer 6. Further, different from Example A of the present invention in which an Ni/Au electrode layer was formed in process step (a7), the process step of (a7) was not performed, and an Ag electrode layer 33 having the thickness of 100 nm was formed instead.

COMPARATIVE EXAMPLE T5

In the structure of Example A of Embodiment 1, an Ag electrode layer having the thickness of 100 nm was additionally arranged to be in contact with the Ni/Au electrode layer.

(Tests and Results): In Example S4, the acceptor level becomes lower as the p-type InGaN layer 32 exists in contact with the p-type GaN layer 6. This results in higher carrier density, and therefore, even when Ag reflection film 33 that does not have high work function is arranged as the p-electrode to be in contact with the p-type InGaN layer 32, the contact resistance between Ag reflection film 33 and p-type InGaN layer 32 does not much increase. The driving voltage of the light emitting element of Example S4 of the invention and that of Comparative Example T5 were compared, and the difference was smaller than 0.05V. There was no significant difference.

When a current of 20 mA was applied, Example S4 of the invention attained the optical output of 11.5 mW, while Comparative Example T5 attained 9.6 mW. For reference, Example A of the invention attained 8 mW.

The high optical output is obtained in Example S4 of the invention as described above, because the light from the light generating layer to the p-type semiconductor layer is not absorbed by the Ni/Au electrode layer as the Ni/Au electrode layer is not provided, but reflected by the Ag layer having the reflectance of 88%. In Comparative Example T5, the reflectance of light in the p-electrode is defined as: absorption of 70% by Ni/Au×Ag reflectance×re-absorption of 70%=44%. As a result, in Example S4 of the invention, optical output that can be taken out was 1.2 times higher than Comparative Example T5.

In the present embodiment, an Ag film was used for the p-electrode. It is noted, however, that any material having high reflectance and relatively low contact resistance with the p-type InGaN layer 32 may be used. By way of example, Al and Rh may be used.

Embodiment 13

Figure 50:
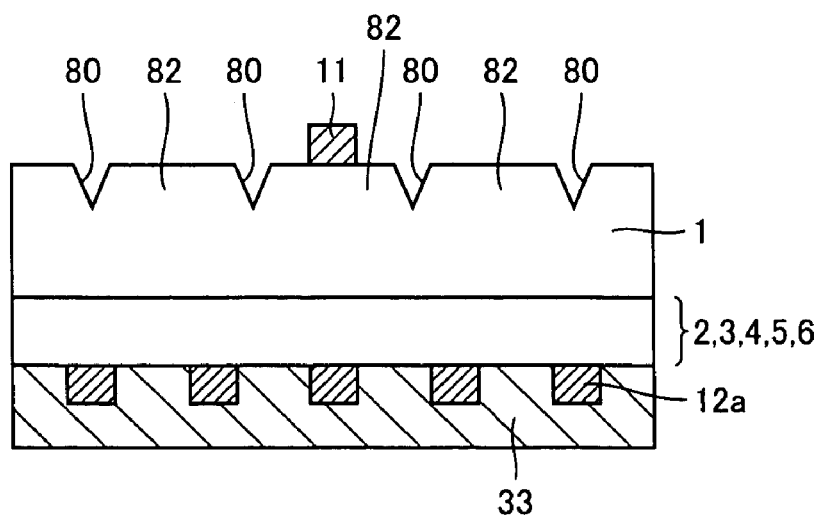
FIG. 50 is a cross sectional view focused on a p-electrode of the light emitting device in accordance with Embodiment 13 of the present invention.
Figure 51:
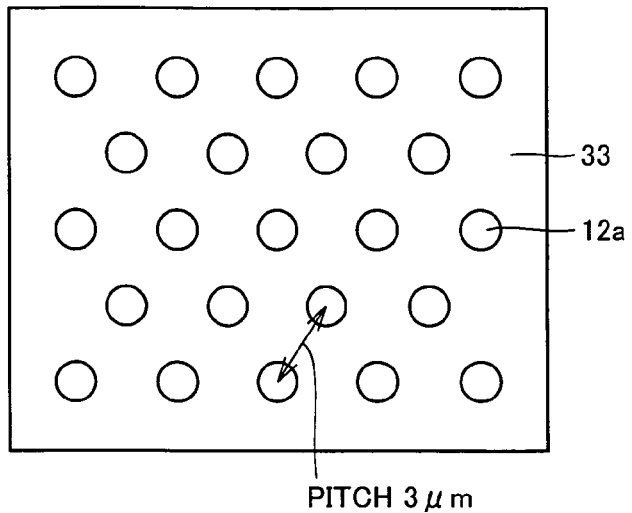
FIG. 51 is a plan view of the light emitting device shown in FIG. 50 with the p-electrodes visualized.

Embodiment 13 of the present invention is characterized in that Ni/Au layers having low contact resistance with the p-type GaN layer are arranged in a discrete manner as p-electrodes, and covered with an Ag film provided to cover and to fill the gaps therebetween, for improved optical output. FIG. 50 is a cross section focusing on the p-electrode. On the bottom surface of the down-faced epitaxial layer, Ni/Au electrode layers 12a are arranged in a discrete manner, at a prescribed pitch. An Ag film 33 is provided to cover the downside bottom surface of the epitaxial layer and to cover the Ni/Au electrodes 12a. FIG. 51 is a plan view showing the p-electrodes, seen through the layers above the p-electrodes.

Typical pitch of discrete Ni/Au electrode layers 12a is 3 μm. The pitch of 3 μm is determined based on the fact that the diameter of the scope of current spread is at most 6 μm in a typical p-type GaN layer or p-type AlGaN clad layer, considering the specific resistance. In other words, when the pitch is set to 3 μm, the current can reach from one discrete electrode to the next. In order to cause the current to flow thoroughly over the electrode layers, the pitch should preferably be at most 3 μm. If the pitch is too small, however, effective amount of light that can be taken out will be reduced, because of the Ni/Au electrodes arranged in a discrete manner.

By way of example, when the area ratio of discrete Ni/Au electrodes is 20%, in the structure of p-type electrode shown in FIGS. 50 and 51, light reflectance will be calculated as: reflectance=reflectance 88%×area ratio 80%+reflectance 40%×area ratio 20%=78% (calculation). Based on this estimation, the p-electrodes having the above-described structure were actually formed and optical outputs were measured. The test samples were as follows.

EXAMPLE S5

Figure 52:
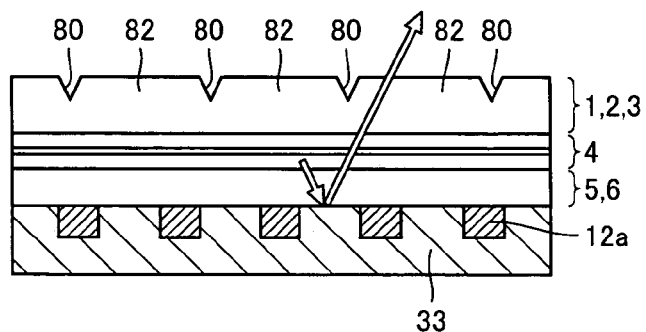
FIG. 52 illustrates light emission and reflection in Example S5 in accordance with Embodiment 13 of the present invention.

The sample was manufactured in accordance with the same manufacturing process as Example A of Embodiment 1, except that in step (a7) for forming the p-electrode, an Ni layer having the thickness of 4 nm was formed in contact with the p-type GaN layer, and an Au layer having the thickness of 4 nm was formed on the entire surface thereof. Thereafter, using a resist mask, patterning was performed to form Ni/Au electrodes distributed in a discrete manner (see FIGS. 50 and 51). Thereafter, heat treatment was performed in an inert gas atmosphere, to attain the contact resistance of 5E-4 Ω·cm². Thereafter, an Ag film was formed on the entire surface to fill the gaps between the Ni/Au electrodes and to cover the Ni/Au electrodes, to provide a reflective electrode. The occupation ratio of Ni/Au layers arranged in a discrete manner on the p-type GaN layer was 20%, and the occupation ratio of Ag was 80%. The pitch of Ni/Au electrode layers 12 was 3 μm (see FIG. 52).

COMPARATIVE EXAMPLE T6

Figure 53:
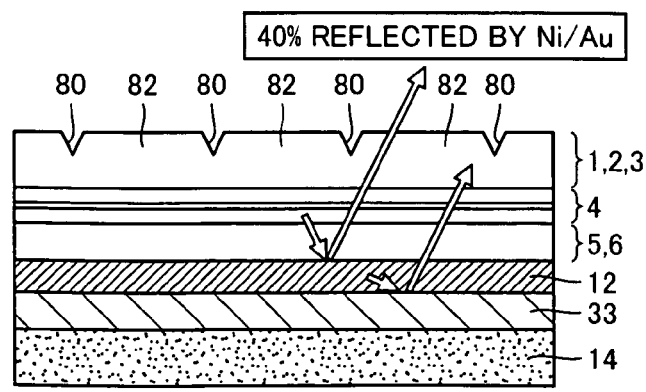
FIG. 53 illustrates light emission and reflection in Comparative Example T6 in accordance with Embodiment 13 of the present invention.

A stacked structure was formed on a GaN substrate in accordance with the same manufacturing process as Example A of Embodiment 1. As the p-electrode, an Ni/Au layer was arranged in contact with and on the entire surface of the p-type GaN layer in accordance with step (a7), and heat-treated. Thereafter, different from the structure of Example A, an Ag layer was formed in contact with and entirely over the Ni/Au layer (see FIG. 53).

Figure 54:
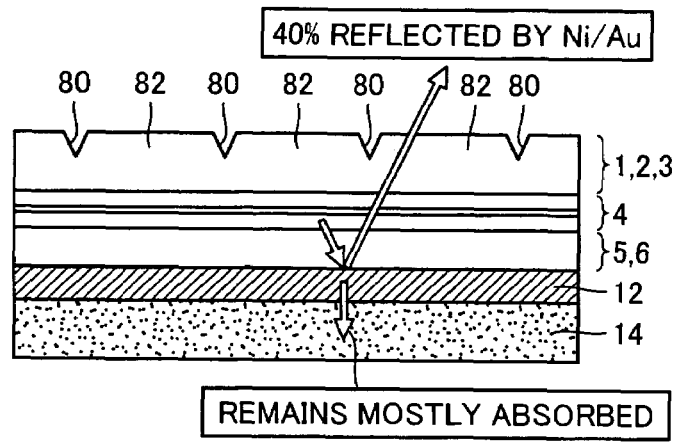
FIG. 54 illustrates light emission and reflection in Example A of the present invention described for comparison in Embodiment 13 of the present invention.

For comparison, the reflection behavior of light going to the down side in the same light emitting device as Example A is shown in FIG. 54.

(Tests and Results): A current of 20 mA was applied to each of the light emitting devices formed in the above-described manner, and optical outputs were measured. In Example S5, optical output of 11.5 mW was attained, while in Comparative Example T6, the optical output was 9.6 mW. The ratio of light that went from the active layer to the mounting side (down side) reflected by the p-electrode and emitted through the light emitting surface was as high as 86% in the example of the invention (see FIG. 52). In contrast, the ratio was 67% in Comparative Example T6 (see FIG. 53). The ratio was 40% in Example A of the invention (see FIG. 54).

In Example S5 of the invention, 80% of light that went to the down side was reflected by Ag occupying 80% of the p-electrode at the reflectance of 88%, and 20% of light was reflected by the Ni/Au layer occupying 20% of the p-electrode at the reflectance exceeding 40% (not simply at the reflectance of 40%). As a result, the ratio mentioned above is 86% in Example S5 of the invention. In Comparative Example T6, the light is further reflected by the Ag layer positioned on the lower (down) side of Ni/Au layer, and by that amount, the ratio is higher than in Example A of the invention.

It is needless to say that Comparative Example T6 is, in the broadest sense, encompassed within the scope of the present invention. It is used as a comparative example for convenience to better describe the present embodiment.

The Ni/Au electrode layer described above may be replaced by a Pt electrode layer or a Pd electrode layer. Further, Ag as the reflective electrode layer may be replaced by a Pt layer or an Rh layer.

Similarly, when the area ratio of the Ni/Au electrode was 10%, the optical output attained with the applied current of 20 mA was 11.8 mW, and when the area ratio of the Ni/Au electrode was 40%, the optical output attained with the applied current of 20 mA was 10.6 mW. Specifically, optical output higher than that of Comparative Example T6 could be attained, in accordance with the area ratio. It is noted, however, that when the area ratio of the Ni/Au electrode was 2% and smaller than 10%, the optical output attained was 9.6 mW, which was the same as that of Comparative Example T6, and it was confirmed by the inventors through experiments that significant unevenness was observed in light emission around the Ni/Au electrode.

Embodiment 14

Figure 55:
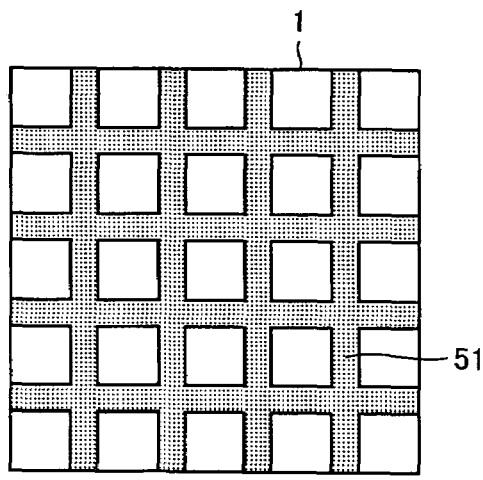
FIG. 55 shows a main surface of the GaN substrate in which plate-shaped crystal inversion regions appear as a lattice, in accordance with Embodiment 14 of the present invention.
Figure 56:
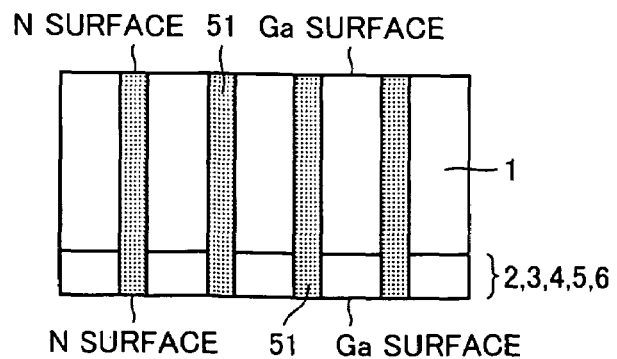
FIG. 56 is a cross section of the GaN substrate representing plate-shaped crystal inversion regions of FIG. 55.

In Embodiment 14 of the present invention, a plurality of parallel plate-shaped crystal inversion regions propagated from the GaN substrate to the epitaxial layer are removed, and the p-electrodes are arranged in every space of the plate-shaped crystal inversion regions. On the main surface GaN substrate, crystal inversion regions appear as stripes distributed parallel to each other in the direction of thickness of the GaN substrate, and the crystal inversion regions propagate to epitaxial layers 2, 3, 4, 5 and 6. In FIGS. 55 and 56, the crystal inversion regions are arranged in a lattice on the main surface. When a nitride semiconductor substrate is formed, in a region where dislocation fluxes (=cores) are concentrated, crystal arrangement is inverted to the crystal arrangement of the surroundings. Therefore, the plate-shaped crystal inversion regions and the dislocation fluxes are the same in that they have the crystal arrangement inverted from that of the surroundings. They differ in that the dislocation fluxes have dislocations collected to a string or thick line and hence the crystal inversion region has a string-shape, while in the plate-shaped crystal inversion regions, dislocations are distributed in high density in a thick, planar areas. Specifically, in the plate-shaped crystal inversion regions, dislocations are distributed in high density in a thick, planar area.

Figure 57:
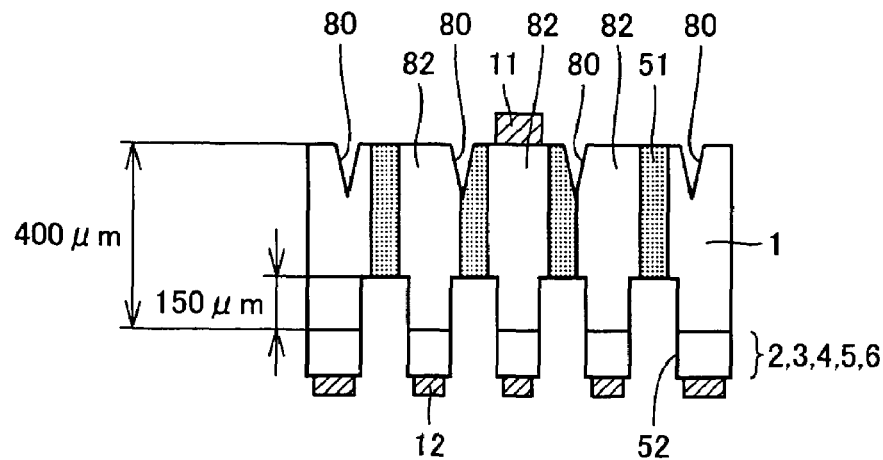
FIG. 57 is a cross section showing Example S6 in accordance with Embodiment 14 of the present invention.

The present embodiment is characterized in that the crystal inversion regions in the epitaxial layers are fully removed and the crystal inversion regions in the GaN substrate are removed to a prescribed depth of the first main surface, so as to separate the epitaxial layers from each other, and in that for each separated epitaxial layer, a p-electrode is provided (see FIG. 57). The plate-shaped crystal inversion regions may be formed as lattice-shaped crystal inversion regions crossing each other on the main surface as shown in FIG. 55, or they may be arranged parallel to each other along a prescribed direction on the main surface, as will be described later.

EXAMPLE S6

In the GaN substrate shown in FIGS. 55 and 56, the first main surface on the side of the epitaxial layer has crystal plane orientation of (0001), that is, it is a c-plane. The crystal inversion region in plane-symmetry to the first main surface is a (000-1) plane, that is, a-c plane, in which the c-axis grows in inversion. The surface of the c-plane is a Ga surface having Ga atoms arranged, while in the crystal inversion region, the surface is an N surface having N atoms arranged. In Example S6 of the invention, a GaN substrate was used in which crystal inversion regions having the width of 30 μm were arranged at every 100 μm in a lattice on the first main surface. The crystal inversion regions are propagated to the epitaxial layers formed on the GaN substrate.

Using the GaN substrate, a stacked structure was formed in accordance with the same manufacturing method as Example A of the invention (see steps (a1) to (a6) of Example A). In the step of forming the p-electrode, in place of step (a7), the following process was performed. Specifically, by applying a mask that covers only the crystal inversion regions propagated as shown in FIG. 56 to the p-type GaN layer, p-electrode layers were formed only on the c-plane areas in the spaces of the mask, and then the mask pattern was removed.

Then, the semiconductor substrate (GaN substrate described above) having the second main surface (back surface) entirely covered with a mask was kept in KOH of 8N (normal) at 80° C., so that the crystal inversion regions on the side of the first main surface were removed by etching through the epitaxial layers such as the p-type GaN layer into the GaN substrate, whereby trenches 52 were formed. The plate-shaped crystal inversion region 51 is a dislocation concentrated region having high dislocation density, and therefore etching with KOH is easy. The depth of etching in the GaN substrate was 150 μm into the GaN substrate from the interface between the epitaxial layer and the GaN layer. Thereafter, the mask was removed, and an insulating film was deposited to fill the trenches 52 (FIG. 57).

(Tests and Results): Example S6 of the invention as described above was used to form a light emitting device, and a current of 20 mA was applied. The optical output was 9.6 mW. This is 1.2 times higher than the optical output of 8 mW attained by Example A of the invention.

Figure 58:
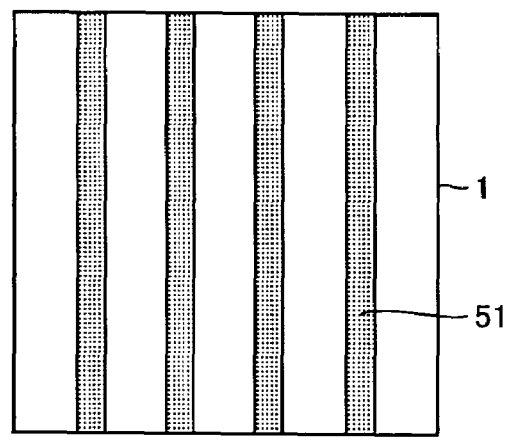
FIG. 58 is a plan view showing plate-shaped crystal regions arranged in parallel, different from FIG. 55, encompassed by Embodiment 14 of the present invention.
Figure 59:
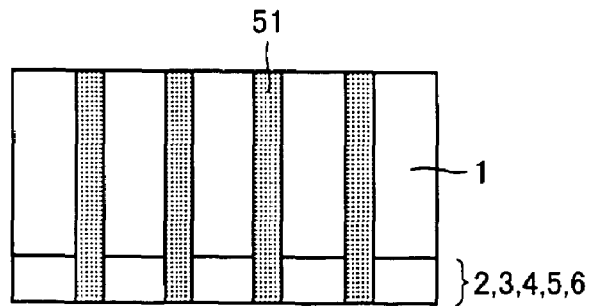
FIG. 59 is a cross section of FIG. 58.

As described above, in Example S6 of the invention, the plate-shaped crystal inversion regions are arranged as a lattice. It is not necessary that the plate-shaped crystal inversion regions are arranged as a lattice, and the regions may be arranged parallel along a prescribed direction on the main surface of the GaN substrate as shown in FIG. 58 (plan view) and FIG. 59 (cross section). Further, when a nitride semiconductor substrate having crystal inversion regions as points (or small circles or planes) existing regularly is used, optical output higher than Example A of the invention can be attained as in Example S6, in accordance with the size or depth of the etching trenches.

Embodiment 15

Figure 60:
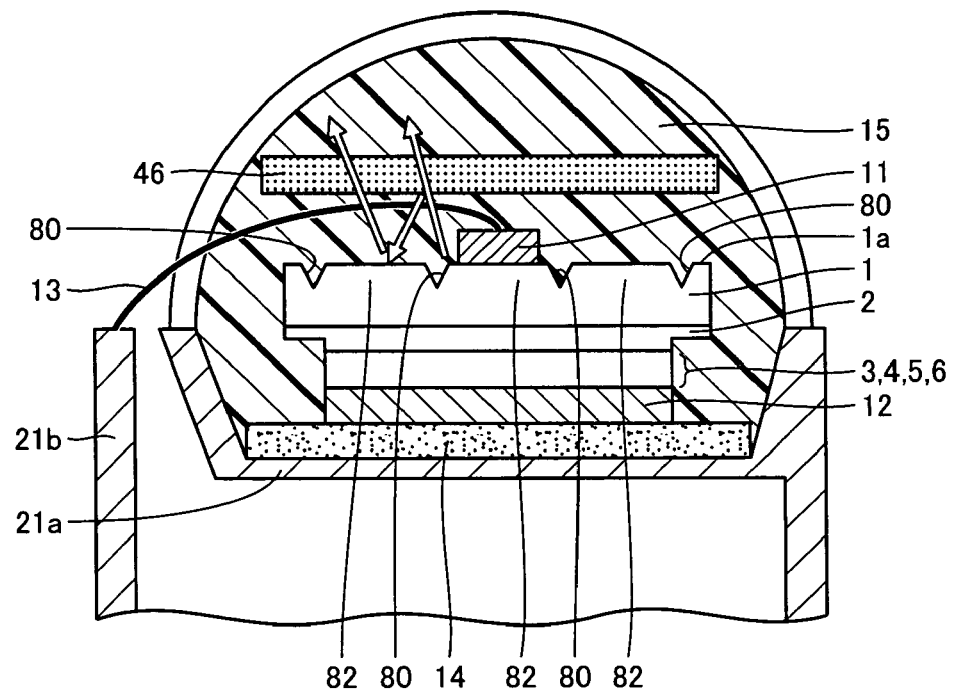
FIG. 60 is a cross section representing light emission and reflection in Example S7 in accordance with Embodiment 15 of the present invention.

Embodiment 15 of the present invention is characterized in that a fluorescent plate 46 is arranged opposite to the GaN substrate 1 above the semiconductor chip and sealed by resin 15, as shown in FIG. 60. It is novel in that the fluorescent plate is arranged facing the GaN substrate that serves as the light emitting surface in a p-down mounted device. The test samples used were Examples S7 and S8 of the invention shown in FIGS. 60 and 61 and Comparative Example T7.

EXAMPLE S7

Example S7 of the invention is basically manufactured in accordance with the process steps of manufacturing Example F of the invention shown in Embodiment 3. As shown in FIG. 60, above the chip mounted with the p-side facing down, fluorescent plate 46 was arranged opposite to the back surface of GaN substrate 1, and the resulting body was sealed with epoxy resin 15 to provide a white light emitting device.

Fluorescent plate 46 was manufactured by the following method. A ZnSSe crystal as a bulk with I (iodine) diffused by halogen transport method was manufactured, and the bulk ZnSSe crystal was heated in Zn, Cu atmosphere, to diffuse Cu in ZnSSe. Then, the bulk ZnSSe crystal was polished to the thickness of 0.5 mm using a rough lapping machine, and then cut to a shape to be fit in the lead frame. The roughness of front and rear surfaces of the fluorescent plate manufactured by the method described above was Rmax=1 μm.

EXAMPLE S8

Figure 61:
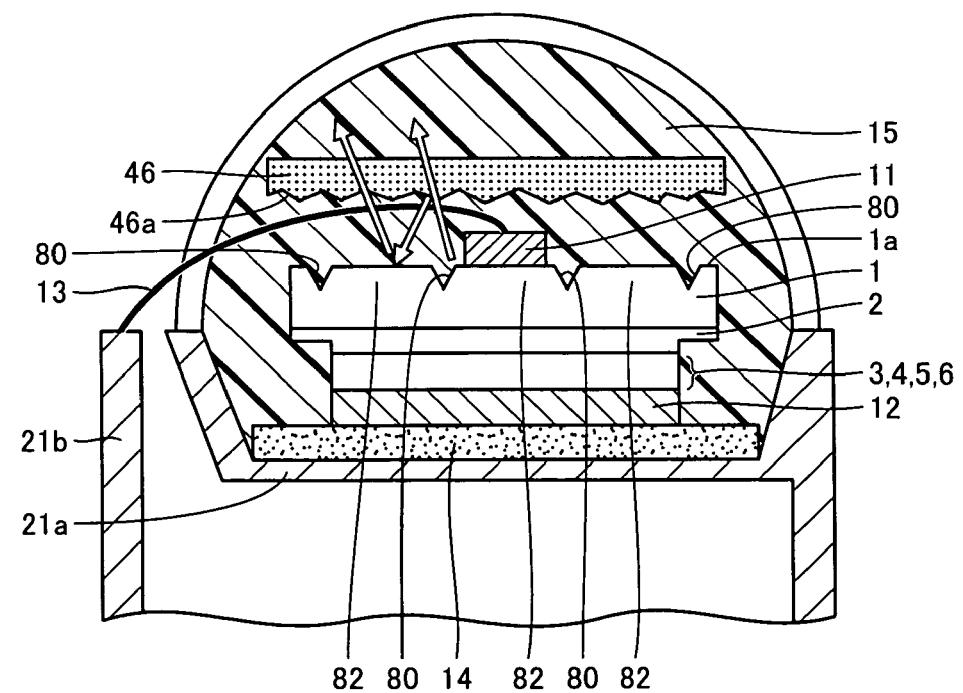
FIG. 61 is a cross section representing light emission and reflection in Example S8 as another example in accordance with Embodiment 15 of the present invention.

In Example 8 of the invention, the surface 46a of fluorescent plate 46 that faces the GaN substrate is adapted to have protrusions and recesses (see FIG. 61). The height of protrusions/recess was 2 μm, and average pitch of protrusions/recess was 5 μm. Except for this point, the structure was the same as Example S7.

COMPARATIVE EXAMPLE 7

Figure 62:
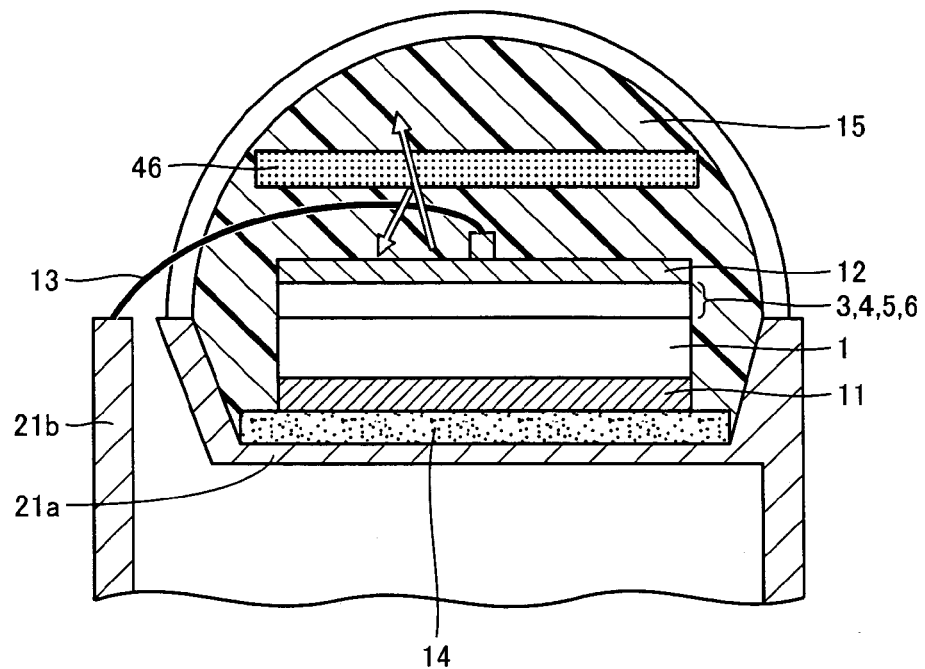
FIG. 62 is a cross section representing light emission and reflection in Comparative Example T7.

As shown in FIG. 62, above the chip mounted with the p-side facing up, fluorescent plate 46 was arranged opposite to the chip, and the resulting body was sealed with epoxy resin 15 to provide a white light emitting device.

(Tests and Results): When a current of 10 A was applied to the light emitting devices formed using the GaN substrate described above, the luminance of light emission was as follows. In Example S7 of the invention, luminance was as high as 800 lm and in Example S8, luminance was as high as 880 lm. In Comparative Example T7, the luminance was 540 lm. The results show that arrangement of the fluorescent plate opposite to the GaN substrate with the p-side mounted face down can ensure higher luminance than arrangement of the fluorescent plate with the p-side mounted face up, and that by making rough the surface of fluorescent plate facing the GaN substrate, luminance can further be improved.

Embodiment 16

Next, the effect of trenches formed on the GaN substrate of the invention was studied. Test samples used for the study were as follows.

EXAMPLE S9

The example basically has the same structure as Example A of the invention. The method of manufacturing Example S9 of the invention is also basically the same as that of Example A. Detailed description will be given in the following.

(S9-1) An off-substrate of GaN shifted off by 0.5° from the c-plane was used. The substrate had oxygen concentration of $5E18/cm^3$, dislocation density of $1E7/cm^2$ and thickness of 400 μm.

(S9-2) By MOCVD (Metal Organic Chemical Vapor Deposition), the following stacked structure was formed on the Ga surface, that is, the first main surface of GaN substrate: (Si-doped n-type GaN layer/Si-doped n-type $Al_{0.2}Ga_{0.8}N$ layer as a clad layer/an MQW (Multi-Quantum Well) having three sets of 2-layered structure of GaN layer and $In_{0.15}Ga_{0.85}N$ layer stacked/Mg-doped p-type $Al_{0.2}Ga_{0.8}N$ layer as a clad layer/Mg-doped p-type GaN layer).

(S9-3) Emission wavelength was 450 nm.

(S9-4) The wafer was activated to reduce resistance of the Mg-doped p-type layer. The carrier concentration measured by holes was $5E17/cm^3$ in the Mg-doped $Al_{0.2}Ga_{0.8}N$ layer and $1E18/cm^3$ in the Mg-doped p-type GaN layer.

(S9-5) The wafer was further subjected to etching with a Cl-based gas, from the side of Mg-doped p-type layer to the Si-doped n-type layer, by photolithography and RIE (Reactive Ion Etching). By this etching, element isolating trenches 25 were formed as shown in FIG. 3, so that elements were separated from each other. The width L3 of the element isolating trench was 100 μm.

(S9-6) On the N surface as the second main surface of GaN substrate, n-electrodes of which two-dimensional shape was a square with each side having the width (D) of 200 μm (200 μm square) were provided at a distance L2=2 mm from each other, by photolithography, vapor deposition and lift-off method (see FIGS. 3 and 4). As the n-electrode, a stacked structure including (Ti layer of 20 nm/Al layer of 100 nm/Ti layer of 20 nm/Au layer of 200 nm) in this order from the lower side was formed in contact with the GaN substrate. The resulting body was heated in a nitrogen ($N_2$) atmosphere, so that contact resistance was made to be at most $1E-5\ \Omega\cdot cm^2$.

(S9-7) As the p-electrode, an Ni layer having the thickness of 4 nm was formed in contact with the p-type GaN layer, and an Au layer having the thickness of 4 nm was formed on the entire surface thereof (see FIGS. 3 and 4). The resulting body was subjected to heat treatment in an inert gas atmosphere, so that the contact resistance was reduced to $5E-4\ \Omega\cdot cm^2$.

(S9-8) Next, on the N surface of the substrate, trenches 80 having a V-shaped cross section were formed by dicing. As shown in FIG. 3, the depth $T_3$ of the trench was 200 μm, the angle formed by the sidewall of trench 80 and the plane parallel to the second main surface of GaN substrate 1 was 60°, and the pitch P between adjacent trenches 80 was 500 μm.

(S9-9) Thereafter, as shown in FIGS. 3 and 4, scribing was performed such that a chip boundary 50 appeared as a side surface, and the resulting chip was provided as the light emitting device. The light emitting device as a chip had a light emitting surface having the shape of a 1.9 mm square (a square each side of which has the length of 1.9 mm) and a light generating layer of a 1.9 mm square. Specifically, in FIG. 4, L1=1.9 mm, and L2=2 mm. The width L3 of the element isolating trench was L3=100 μm, and the width D of one side of n-electrode D=200 μm (n-electrode is a 200 μm square).

(S9-10) Referring to FIG. 1, the chip was mounted such that the side of p-type GaN layer of the chip was in contact with a mounting portion 21a of the lead frame, whereby the light emitting device was formed, By conductive adhesive 14 applied at the mounting portion, the light emitting device and the mount were fixed to each other and conduction was attained.

(S9-11) For better heat radiation characteristic of the light emitting device, the light emitting device was mounted such that the entire surface of p-type GaN layer was in contact with the mounting portion. As conductive adhesive, an Ag-based adhesive having good thermal conductivity was selected, and a lead frame formed of CuW based material having good thermal conductivity was selected. The thermal resistance attained in this manner was 8° C./W.

(S9-12) Then, the n-electrode and the lead portion of lead frame were conducted by wire bonding, and an epoxy-based resin was applied for resin seal, whereby the light emitting device was provided as a lamp.

EXAMPLE S10

This example basically has the same structure as Example S9 of the invention. It is noted, however, that the size and arrangement of n-electrodes 11 and trench pitch are different from Example S9. Specifically, Example S10 of the invention has the same structure as the LED shown in FIG. 5. The n-electrode 11 has a square two-dimensional shape, of which width D of one side is D=100 μm. In one chip of 2 mm×2 mm, four n-electrodes 11 are arranged. The n-electrodes 11 are arranged at four corners. Further, the pitch of the formed trenches 80 is 250 μm. The method of manufacturing Example S10 of the invention will be described in the following.

(S10-1) to (S10-5) Basically, process steps corresponding to (S9-1) to (S9-5) of Example S9 were performed.

(S10-6) This process step is basically the same as step (S9-6), except that four n-electrodes were formed per one chip area, at a distance of 1 mm from each other. The n-electrodes were arranged at four corners of one chip. Each n-electrode had a square two-dimensional shape with each side having the width (D) of 100 μm (100 μm square). Consequently, the area of n-electrodes in Example S9 was the same as the total area of four n-electrodes (total area of n-electrodes per chip) in Example S10.

(S10-7) The process step basically the same as (S9-7) was performed.

Figure 7:
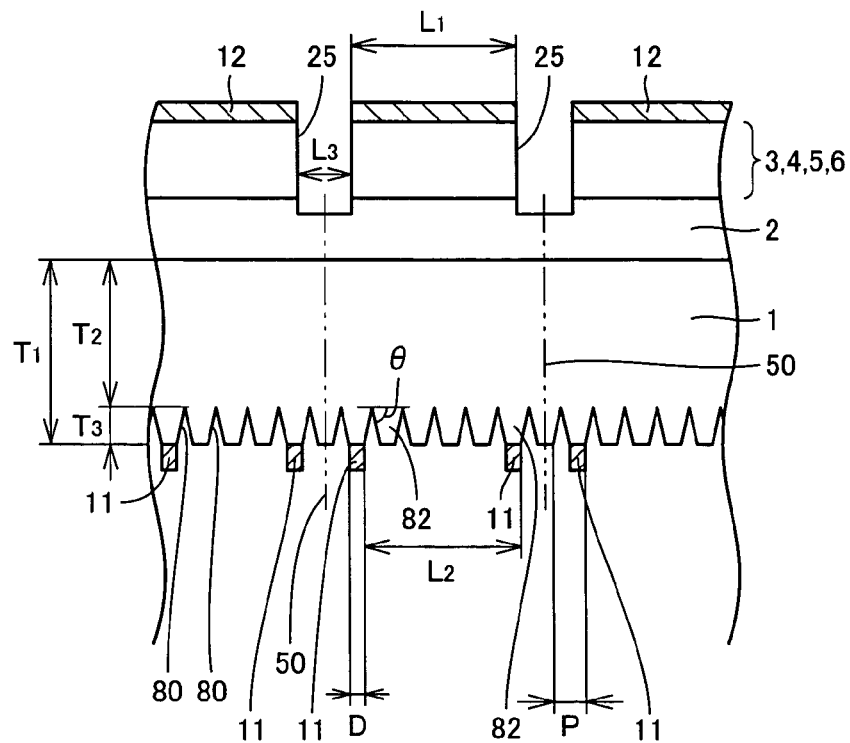
FIG. 7 shows a state of a wafer when a chip having the stacked structure forming the LED shown in FIGS. 5 and 6 is taken from the wafer.

(S10-8) The process step basically the same as (S9-8) was performed, except that the pitch P of trenches (see FIG. 7) was set to 250 μm. At four corners of the chip area, the size of the n-electrode arranged on the flat wafer surface positioned between the trenches was 100 μm square.

(S10-9) to (S10-11) The process steps were basically the same as (S9-9) to (S9-11).

(S10-12) This process step is basically the same as step (S9-12), except that four n-electrodes 11 formed per one chip were all conducted by wire bonding to the lead portions of the lead frame, and resin-sealed by epoxy resin, so that the light emitting device was finished as a lamp.

EXAMPLE S11

This example basically has the same structure as Example S9 of the invention. It is noted, however, that the cross-sectional shape of the formed trench is different from Example S9. Specifically, the sidewall of the trench in Example S11 of the invention has two portions of different angles to the second main surface of the GaN substrate 1 (that is, one side wall has these two portions having different angles to the second main surface formed continuously to each other). In other words, Example S11 of the invention has the same structure as the LED shown in FIG. 8. The method of manufacturing Example S11 of the invention will be described in the following.

(S11-1) to (S10-7) Basically, process steps corresponding to (S9-1) to (S9-7) of Example S9 were performed.

(S11-8) On the N surface of the substrate, trenches 80 were formed by performing dicing twice. The depth $T_3$ of the trench 80 was 200 μm, and the pitch between adjacent trenches 80 was 500 μm. As shown in FIG. 10, bottom-side sidewall 84 and opening-side sidewall 86 forming one sidewall of trench 80 are formed such that the angle formed by bottom-side sidewall 84 and a plane parallel to the second main surface of the GaN substrate is θ1=60° and angle formed by opening-side sidewall 86 and the plane parallel to the second main surface of the GaN substrate is θ2=45°. Such a trench can be formed by performing dicing twice or more by using blades having different cutting edge angles.

(S11-9) to (A11-12): The process steps were basically the same as (S9-9) to (S9-12).

EXAMPLE S12

This example basically has the same structure as Example S9 of the invention. It is noted, however, that the cross-sectional shape of the formed trench is different from Example S9. In Example S12 of the invention, trenches 80 are formed such that convex portions 82 positioned between the trenches come to have semi-spherical shape. Specifically, Example S12 of the invention has the same structure as the LED shown in FIG. 11. The method of manufacturing Example S12 of the invention will be described in the following.

(S12-1) to (S12-7) Basically, process steps corresponding to (S9-1) to (S9-7) of Example S9 were performed.

(S12-8) Trenches 80 were formed such that the convex portions 82 (see FIG. 11) positioned between the trenches 80 come to have the semi-spherical shape. As to the method of forming the trenches 80, arbitrary processing method such as dicing may be used. The pitch of the trenches 80 was set to 500 μm and the height T3 of convex portion 82 was set to 200 μm.

(S12-9) to (S12-12): The process steps were basically the same as (S9-9) to (S9-12).

COMPARATIVE EXAMPLE T9

Figure 63:
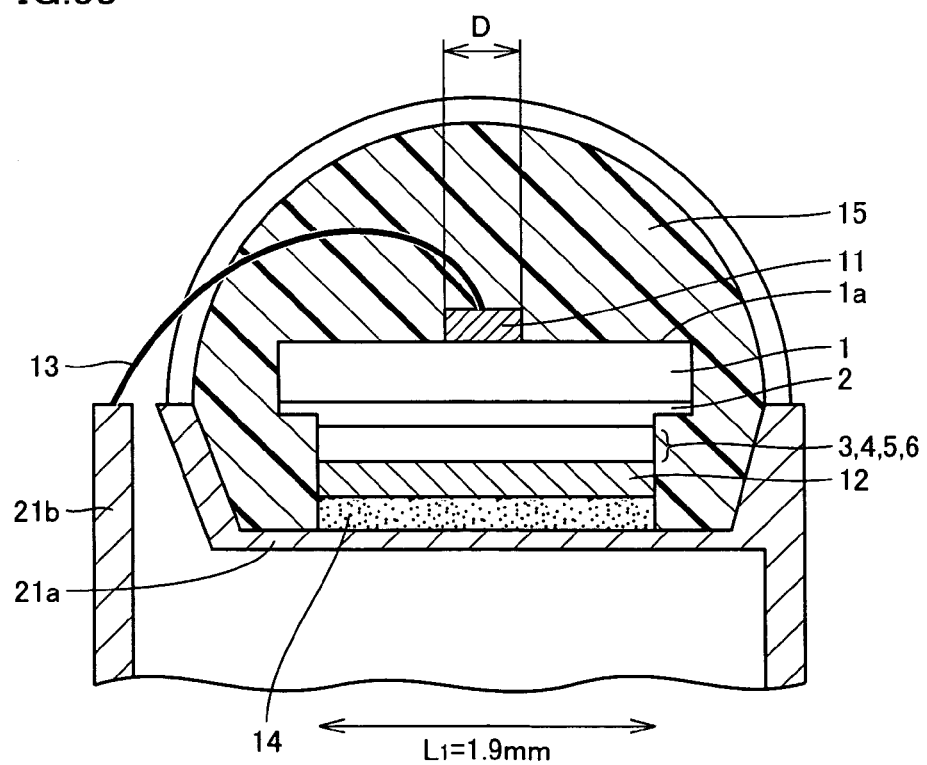
FIG. 63 shows Comparative Example T9 of Embodiment 16 of the present invention.

This example corresponds to the LED structure of Example S9 of the invention, without trenches 80. Specifically, it corresponds to the LED shown in FIG. 63. FIG. 63 shows Comparative Example T9 of Embodiment 16. As shown in FIG. 63, Comparative Example T9 has the same structure as Example S9 of the invention except that the trenches are not formed. The method of manufacturing Comparative Example T9 will be described in the following.

First, process steps similar to steps (S9-1) to (S9-7) were performed. Then, process steps similar to steps (S9-9) to (S9-12) were performed without performing step (S9-8).

(Tests and Results): Examples S9 to S12 of the present invention and Comparative Example T9 were put in an integrating sphere, a prescribed current was applied, and optical output values collected and output from a detector were compared. As a result, Example S9 of the invention attained the optical output of 2.2 W, S10 attained 2.3 W, S11 attained 2.3 W and S12 attained 2.4 W. In contrast, the output of Comparative Example T9 was 1.6 W. As can be understood from the foregoing, devices having trenches 80 on the side of light emitting surface (second main surface) of the GaN substrate to provide protrusions and recesses all come to have relatively large interface area between the GaN substrate and epoxy resin 15, and the interface have various angles to the surface of the light generating layer so that total reflection at the interface tend to be suppressed, and from these reasons, higher optical output could be attained by Examples S9 to S12 of the invention than Comparative Example T9.

Next, referring to FIGS. 64 to 69, the influence of trench depth, pitch of adjacent trenches, the angle θ formed by the sidewall of the trench and the plane parallel to the second main surface of GaN substrate (see FIG. 3) and the shape of a convex portion formed between the trenches on the optical output, studied by the inventors, will be described. The data shown in FIGS. 64 to 67 are obtained by preparing sample LEDs basically having the same structure as Example S9 of the invention with characteristics on the abscissa of the graphs varied, and by making measurements of the samples.

Figure 64:
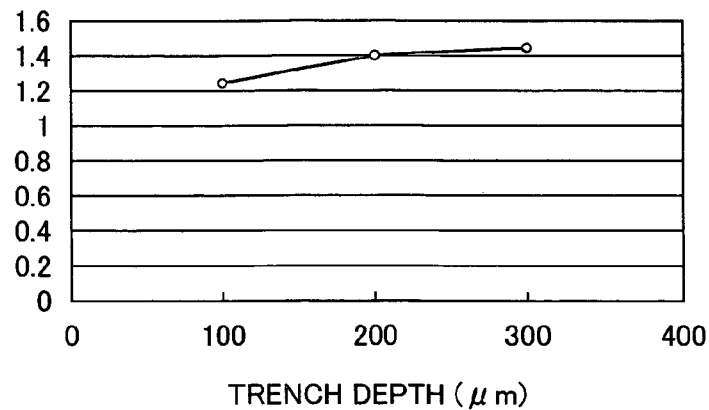
FIG. 64 is a graph representing a relation between trench depth and light extracting magnification.

The abscissa of the graph shown in FIG. 64 represents trench depth (μm), and the ordinate represents magnification of extracted light. The magnification of extracted light on the ordinate is a relative value with the example not having the trench being the reference. As can be seen from FIG. 64, the magnification of extracted light was more than 1.2 times higher when the trench depth was 100 μm, 2001m and 300 μm than when the trench was not formed. It can be seen that larger amount of light can be extracted (larger amount of light is emitted from the substrate) when trenches are formed than when not formed. Further, FIG. 64 shows that the deeper the trench, the larger the magnification of light extraction.

Figure 65:
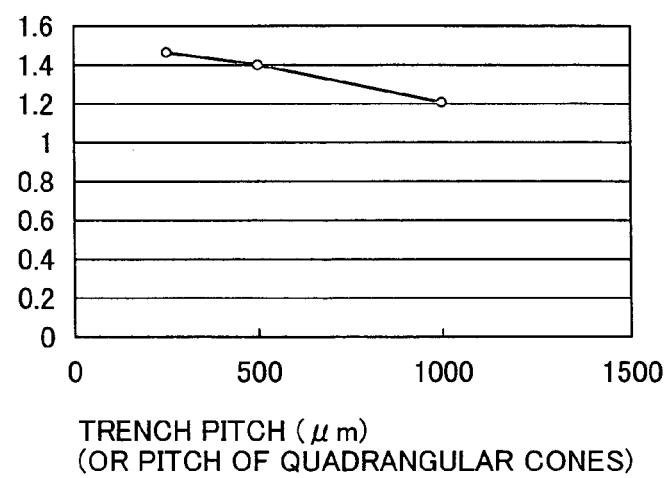
FIG. 65 is a graph representing a relation between the pitch of adjacent trenches and light extracting magnification.

Next, FIG. 65 will be described. The abscissa of FIG. 65 shows the pitch of the trenches (μm), and the ordinate represents magnification of extracted light as in FIG. 64. As can be seen from FIG. 65, the larger the pitch between the trenches, the smaller the magnification of light extraction. When the trench pitch is set to 1000 μm, the magnification of extracted light attains to about 1.2, and therefore, when the pitch is made not wider than 1000 μm, the magnification of light extraction can be made sufficiently larger than when the trenches are not formed.

Figure 66:
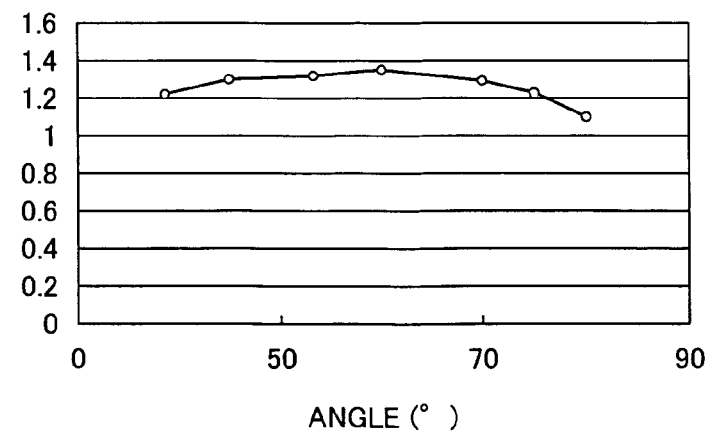
FIG. 66 is a graph representing a relation between the light extracting magnification and an angle θ formed by a trench sidewall and a plane parallel to the second main surface of the GaN substrate.

Next, FIG. 66 will be described. The abscissa of FIG. 66 represents the angle θ formed by the sidewall of the trench and the plane parallel to the second main surface of the GaN substrate. The ordinate of FIG. 66 represents magnification of extracted light as in FIG. 64. As can be seen from FIG. 66, the magnification of light extraction is 1.0 or higher when the angle θ is in the range of 40° to 80°.

Figure 67:
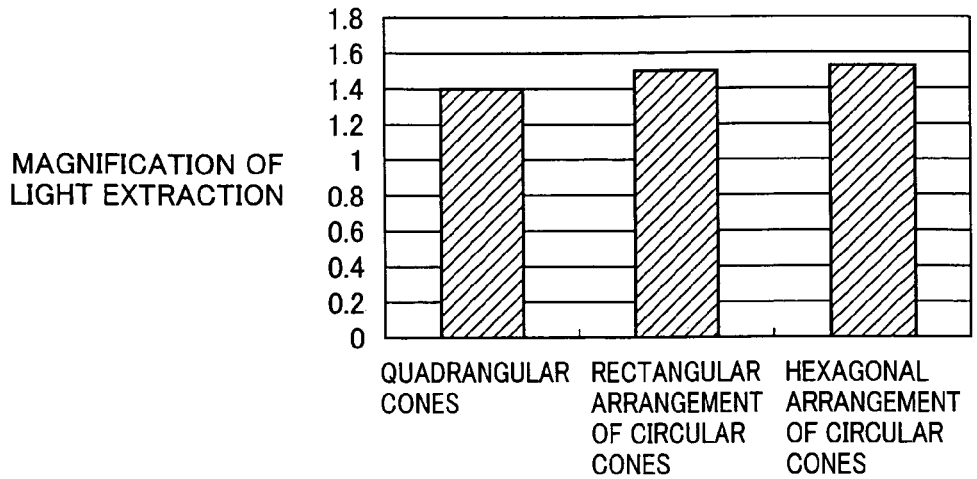
FIG. 67 is a graph representing a relation between the light extracting magnification and the shape and arrangement of convex portions formed between the trenches.
Figure 68:
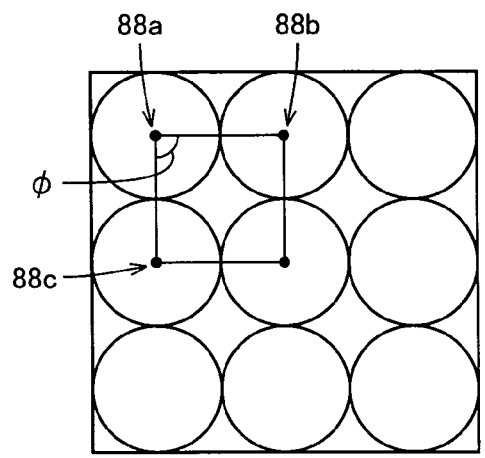
FIG. 68 is a schematic plan view illustrating a quadrangular arrangement of circular cones at the convex portions shown in FIG. 67.
Figure 69:
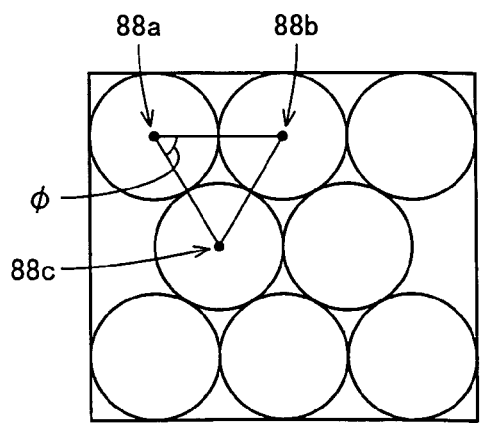
FIG. 69 is a schematic plan view illustrating a hexagonal arrangement of circular cones shown in FIG. 67.
Figure 70:
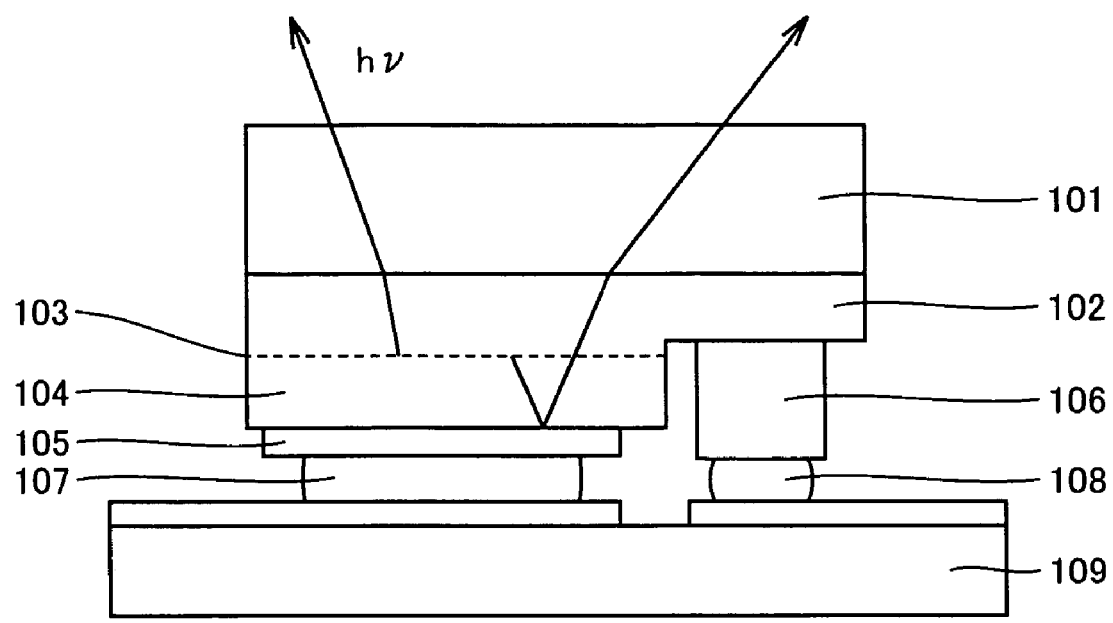
FIG. 70 shows a conventional LED.

Next, FIG. 67 will be described. The abscissa of FIG. 67 represents the shape and types of arrangement of convex portions formed between the trenches. The ordinate of FIG. 67 represents magnification of extracted light as in FIG. 64. Here, "quadrangular pyramid" on the abscissa represents the shape of convex portion 82 shown in FIG. 1. "Rectangular arrangement of circular cones" on the abscissa represents that, as shown in FIG. 68, the concave portion 82 formed between the trenches has a shape of circular cone with a flat top, and that the conical convex portions are arranged in a matrix. In the rectangular arrangement of circular cones, an angle φ at the central point 88a of one convex portion, formed by central points 88b and 88c of adjacent two convex portions, is substantially 90°, as shown in FIG. 68. Further, "hexagonal arrangement of circular cones" on the abscissa represents that, as shown in FIG. 69, the concave portion 82 formed between the trenches has a shape of circular cone with the flat top, and that the conical convex portions are arranged shifted from each other in the lateral direction between the first row and the second row of FIG. 69. In the hexagonal arrangement of circular cones, the angle φ at the central point 88a of one concave portion formed by central points 88b and 88c of adjacent two convex portions is substantially 60°, as shown in FIG. 69.

As can be seen from FIG. 67, when such quadrangular pyramid, rectangular arrangement of circular cones and hexagonal arrangement of circular cones are adopted, the magnification of extracted light is not lower than 1.2 in any of the examples, as shown in FIG. 67. Further, the magnitude relation that hexagonal arrangement of circular cones>rectangular arrangement of circular cones>quadrangular pyramid holds for the magnification of light extraction.

From the foregoing, the inventors found the following: the preferable range of trench depth is at least 0.1 mm and at most 0.3 mm; the preferable range of thickness T2 (see FIG. 3) of the substrate where the trench is not formed is at least 0.2 mm and at most 0.4 mm; the preferable range of the pitch between adjacent trenches is at least 0 mm and at most 1 mm; the preferable range of the angle θ formed by the sidewall of the trench and the plane parallel to the second main surface of the GaN substrate is at least 40° and at most 80°; the preferable shapes of the convex portion include quadrangular pyramid or quadrangular pyramid with steps such as shown in FIG. 8, hexagonal cone or other polygonal cone, circular cone and semi-sphere.

Further, through experiments, the inventors found that in order to realize the trench depth and the substrate thickness where trench is not formed within the ranges described above, preferable oxygen concentration and device size should be in the following numerical ranges: the oxygen concentration of the substrate must be at least 2E18/cm$^3$ and at most 2E19/cm$^3$, and the device size is at least 1 mm×1 mm and at most 4 mm×4 mm.

Here, if there is too much oxygen in the substrate, transmittance of light emitted from the light generating layer in the substrate becomes smaller, and therefore, the obtained optical output becomes smaller. On the other hand, if the amount of oxygen in the substrate is too small, the specific resistance of the substrate becomes small. Further, if the thickness T2 of the substrate (see FIG. 3: the thickness of the portion of substrate 80 where the trench is not formed) is too small as compared with the device size, uniform light emission becomes impossible. As a result, the optical output also becomes small, as described above.

In the following, the characteristics of the embodiments in accordance with the present invention will be summarized, though some descriptions may be accumulative.

The present invention provides a light emitting device including: a nitride semiconductor substrate (GaN substrate 1) and, on a first main surface of the nitride semiconductor substrate, an n-type nitride semiconductor layer (n-type Al$_x$Ga$_{1-x}$N layer 3), a p-type nitride semiconductor layer (p-type Al$_x$Ga$_{1-x}$N layer 5) positioned further than the n-type nitride semiconductor layer viewed from the nitride semiconductor substrate, and a light generating layer (quantum well (MQW: Multi-quantum Well) 4) positioned between the n-type nitride semiconductor layer and the p-type nitride semiconductor layer. In the light emitting device, specific resistance of nitride semiconductor substrate is at most 0.5 Ω·cm, the side of p-type nitride semiconductor layer is mounted face-down, and the light is emitted from the second main surface that is opposite to the first main surface of the nitride semiconductor substrate. The second main surface of nitride semiconductor substrate has trenches 80 formed therein.

In this arrangement, the n-type electrode 11 is provided on the back surface (second main surface) of the nitride semiconductor substrate (GaN substrate 1) having low electrical resistance, and therefore, even when the n-electrode 11 is formed with small coverage ratio or large aperture ratio, it is possible to cause current to flow uniformly and entirely through the nitride semiconductor substrate. Therefore, the ratio of light absorbed at the emitting surface can be reduced and light emission efficiency can be increased. Needless to say, the light may be emitted not only from the second main surface but also from side surfaces. This is the same in the light emitting devices described in the following.

Further, the side of p-type nitride semiconductor layer having high electrical resistance does not serve as a light emitting surface, and therefore, the p-type electrode layer (p-electrode 12) can be formed entirely on the surface of the p-type nitride semiconductor layer. Thus, a structure suitable for causing large current flow, suppressing heat generation and releasing the generated heat by conduction can be obtained. Specifically, limitations imposed by thermal requirements can be reduced significantly. Consequently, it is unnecessary to form the p- and n-electrodes in a complicated comb-shape.

As the GaN substrate 1 has superior conductivity, a protection circuit against surge voltage becomes unnecessary, and superior withstanding characteristic can be attained.

Complicated process steps are not involved, and therefore, manufacturing cost can easily be reduced.

Further, trenches 80 are formed on the second main surface as the light emitting surface of the nitride semiconductor substrate, light can be taken out also from the side surfaces of the trenches 80. As a result, efficiency of use of light from the light emitting device can be improved.

In the light emitting device described above, the nitride semiconductor substrate may be formed of GaN or $Al_xGa_{1-x}N$ ($0<x\leq1$). In that case, if GaN substrate 1 is used as the nitride semiconductor substrate, a large current density can be attained, and therefore, light of high luminance (and large flux) can be emitted from the light emitting device. When the nitride semiconductor substrate is formed of GaN or $Al_xGa_{1-x}N$ ($0\leq x\leq1$), an LED as a light emitting device can be formed using a nitride semiconductor device having high thermal conductivity, that is, superior heat radiation. Therefore, even when a large current density is applied, heat can sufficiently be radiated, and thermal damage to the LED can be suppressed. Accordingly, a light emitting device can be provided that emits light stably for a long period of time.

In the light emitting device described above, as shown in FIG. 1, the trench 80 may have a V-shaped cross-section. In that case, on the second main surface 1a of the nitride semiconductor substrate, the trench 80 has inclined sidewall. Therefore, as compared with the sidewall approximately vertical to the second main surface 1a, the light coming from the sidewall can more efficiently be emitted to the direction normal to the second main surface 1a (direction vertical to the second main surface). Consequently, efficiency of use of the light can be improved.

In the light emitting device, it is preferred that the angle θ (see FIG. 3) formed by the sidewall of trench 80 with the second main surface 1a (plane parallel to the second main surface 1a) of the nitride semiconductor substrate is in the range of 40° to 80°. With the angle being in this range, the efficiency of use of the light emitted from the second main surface can be improved. If the angle is smaller than 40° or exceeds 80°, by contrast, the amount of light taken out from the sidewall of trench 80 becomes smaller.

In the light emitting device described above, on the second main surface 1a of nitride semiconductor substrate, in a direction parallel to the extension of trench 80, other trench or trenches 80 may be formed, and the pitch P between the trenches (see FIG. 3) in the direction vertical to the direction of extension of the trenches may be not smaller than 0 mm and at most 1 mm.

Here, assuming that the angle formed by the sidewall of trench 80 with the second main surface 1a of nitride semiconductor substrate is constant, the depth of trench 80 becomes deeper when the pitch P is larger, and as a result, the sidewall comes to have larger area. Consequently, the amount of light emitted from the second main surface 1a can be increased. When the pitch P is made too large and the width of trench 80 becomes too large, the area of flat portions between the trenches 80 becomes smaller. On the flat portion, n-electrode 11 must be arranged. Therefore, if the area of the flat portion becomes smaller, the size of n-electrode 11 also becomes smaller. If the size of n-electrode 11 is small, contact resistance at the contact portion between n-electrode 11 and the nitride semiconductor substrate becomes larger, and hence voltage drop at the contact portion becomes lager. It may become necessary to arrange the n-electrodes 11 at a plurality of portions on the second main surface in order to alleviate the influence of the voltage drop. In that case, wire bonding to each of the plurality of n-electrodes 11 becomes necessary, increasing the number of process steps for manufacturing the light emitting device. As a result, the cost of manufacturing the light emitting device increases. When the pitch is within the aforementioned range, the amount of light taken out from the device can be increased while suppressing the problems described above.

In the light emitting device described above, the depth T3 (see FIG. 3) of trench 80 may be at least 0.1 mm and at most 0.3 mm, and the thickness T2 (see FIG. 3) of the nitride semiconductor substrate in the thickness direction where the trench is not formed may be at least 0.2 mm and at most 0.4 mm. With the depth and thickness being in these ranges, uniform light emission from the second main surface is realized and sufficiently large amount of light can be taken out from the second main surface. It is noted that if the trench 80 is made deeper, the area of trench sidewall increases, and therefore, the amount of light taken out from the second main surface becomes larger, whereas the thickness T2 where the trench is not formed becomes thinner. When the thickness T2 of the portion where the trench 80 is not formed becomes thinner, it might become impossible to attain uniform light emission at the second main surface, dependent on the size or oxygen concentration of the nitride semiconductor substrate. When the depth T3 of trench 80 and the thickness T2 of the portion where the trench 80 is not formed are set within the numerical ranges described above, such problems can be avoided.

In the light emitting device described above, preferably, the nitride semiconductor substrate is a GaN substrate 1, the GaN substrate 1 is adapted to have n-type conductivity by oxygen doping, and the oxygen concentration is in the range of $2E18/cm^3$ to $2E19/cm^3$. Here, it is possible to cause a current to flow uniformly over the GaN substrate 1, and therefore, sufficient light can be emitted from approximately the entire second main surface of GaN substrate 1 of the light emitting device.

In the light emitting device described above, the two-dimensional shape of the nitride semiconductor substrate is a square, and preferably, the length of one side of the two-dimensional shape of the nitride semiconductor substrate is at least 1 mm and at most 4 mm. With this size, sufficient light can reliably be emitted from approximately the entire second main surface of GaN substrate 1 of the light emitting device.

In the light emitting device described above, on the second main surface of the nitride semiconductor substrate, trenches 80b extending in a direction crossing trenches 80a may be formed as shown in FIG. 4, and a portion of the second main surface of the nitride semiconductor substrate sectioned by the trenches 80a and 80b (the convex portion 82 shown in FIG. 3) may have a shape selected from the group consisting of a polygonal cone (such as quadrangular pyramid shown in FIG. 1, hexagonal cone and the like), circular cone, and semi-sphere shown in FIG. 11. The polygonal cone may be formed by simple processing such as dicing. It is noted that the amount of light emitted from the second main surface increases when the shape of this portion of the second main surface comes closer to a semi-sphere.

As shown in FIGS. 8 to 10, in the light emitting device described above, the sidewall of trench 80 may include a sidewall portion continuous from the bottom of the trench (bottom-side sidewall 84) and another sidewall portion positioned on the sidewall portion (opening-side sidewall 86). Preferably, the angle $\theta 1$ formed by the sidewall portion and the second main surface is different from the angle $\theta 2$ formed by said another sidewall portion and the second main surface. Here, it follows that the sidewall of trench 80 comes to have a plurality of portions whose angles to the second main surface differ from each other. As the sidewall of the trench 80 is stepped in this manner, the portion having the sidewall of trench 80 as its side (where there are a plurality of trenches, the convex portion 82 positioned between the trenches) comes to have a shape closer to a semi-sphere (the area of the sidewall of trench 80 can be increased).

In the light emitting device described above, preferably, the nitride semiconductor substrate is a GaN substrate 1, the GaN substrate 1 is adapted to have n-type conductivity by oxygen doping, and the oxygen concentration is in the range of $2E18/cm^3$ to $2E19/cm^3$. The two-dimensional shape of the nitride semiconductor substrate may be a rectangle, and, the length of one side of the two-dimensional shape of the nitride semiconductor substrate may be at least 1 mm and at most 4 mm. The trench 80 may have a V-shaped cross-section, and the angle $\theta$ formed by the sidewall of the trench with the second main surface of the nitride semiconductor substrate may be in the range of 40° to 80°. The depth T3 of the trench may be at least 0.1 mm and at most 0.3 mm, and the thickness T2 of the nitride semiconductor substrate in the thickness direction where the trench is not formed may be at least 0.2 mm and at most 0.4 mm. Preferably, on the second main surface of the nitride semiconductor substrate, at least one, another trench 80a extending in the same direction as the trench 80a, and at least one trench 80b of different direction extending in a direction crossing trenches 80a are formed. The pitch P between the trench 80a and another trench 80a in the direction vertical to the direction of extension of the trench 80a may be not smaller than 0 mm and at most 1 mm, and a portion of the second main surface of the nitride semiconductor substrate sectioned by the trench 80a, another trench 80a and the trench 80b of different direction (the convex portion 82) may have a shape selected from the group consisting of a polygonal cone, circular cone, and semi-sphere. By such structure, sufficient amount of light can be taken out from the second main surface.

In the light emitting device described above, preferably, the oxygen concentration is $5E18/cm^3$, and one side of the two-dimensional shape of the nitride semiconductor substrate is 2 mm. Further, it is preferred that the angle $\theta$ formed by the sidewall of trench 80 with the second main surface of nitride semiconductor substrate is 60°, and that the thickness T2 of the portion of the nitride semiconductor substrate in the thickness direction where the trench is not formed is 0.2 mm. The pitch between one trench and another trench is, preferably, at least 0.25 mm and at most 0.5 mm. The portion of the second main surface of the nitride semiconductor substrate sectioned by the trench, another trench and the trench of different direction (the convex portion 82) preferably has a quadrangular pyramid shape. By this structure, the amount of light taken out from the second main surface can reliably be increased.

In the light emitting device described above, at least a portion of the second main surface of the nitride semiconductor substrate (GaN substrate 1) may be made rough. By such roughening, the light generated from the light generating layer is prevented from being totally reflected and from being confined within the nitride semiconductor substrate, and hence, degradation of efficiency can be avoided.

According to another aspect, the present invention provides a light emitting device including a GaN substrate 1 as a nitride semiconductor substrate and, on a first main surface of the GaN substrate, an n-type $Al_xGa_{1-x}N$ layer 3 ($0 \leq x \leq 1$) as an n-type nitride semiconductor layer, a p-type $Al_xGa_{1-x}N$ layer 5 ($0 \leq x \leq 1$) positioned further than the n-type $Al_xGa_{1-x}N$ layer viewed from the GaN substrate, and a light generating layer (quantum well (MQW: Multi-quantum Well) 4) positioned between n-type $Al_xGa_{1-x}N$ layer 3 and p-type $Al_xGa_{1-x}N$ layer 5. In the light emitting device, dislocation density of GaN substrate 1 is at most $10^8/cm^2$, the device is mounted with the side of p-type $Al_xGa_{1-x}N$ layer 5 facing down, and the light is emitted from the second main surface 1a that is opposite to the first main surface of the GaN substrate 1. On the second main surface 1a of GaN substrate as the nitride semiconductor substrate, trenches 80 are formed.

In this structure, it is the basic understanding that the GaN substrate 1 of the invention is conductive and electric resistance can easily be decreased. Therefore, in addition to the functions and effects of the light emitting device described above, optical output from the second main surface can further be improved as the substrate has high crystal characteristic as represented by the dislocation density of $10^8/cm^2$ and has high aperture ratio. Further, light is also emitted from the side surface. Further, as continuity of refractive index is maintained, the above-described problem of total reflection can be avoided.

The present invention provides, according to a still further aspect, a light emitting device including a conductive AlN substrate as a nitride semiconductor substrate in place of the GaN substrate described above, and on a first main surface of the AlN substrate, an n-type $Al_xGa_{1-x}N$ layer 3 ($0 \leq x \leq 1$) as an n-type nitride semiconductor layer, a p-type $Al_xGa_{1-x}N$ layer 5 ($0 \leq x \leq 1$) positioned further than the n-type $Al_xGa_{1-x}N$ layer viewed from the AlN substrate, and a light generating layer (quantum well 4) positioned between n-type $Al_xGa_{1-x}N$ layer 3 and p-type $Al_xGa_{1-x}N$ layer 5. Thermal conductivity of the AN substrate is at least 100 W/(m·K), the device is mounted with the side of p-type $Al_xGa_{1-x}N$ layer 5 facing down, and the light is emitted from the second main surface opposite to the first main surface of the AlN substrate. On the second main surface of the AlN substrate, trenches are formed.

As AlN has very high thermal conductivity and has superior heat radiation characteristic, heat can be transmitted from the p-type $Al_xGa_{1-x}N$ layer to the lead frame and the like, and temperature increase in the light emitting device can be suppressed. Further, heat can also be radiated from the AlN substrate, which also contributes to suppression of temperature increase. It is assumed that the AlN substrate is made conductive by introducing an impurity. As the trenches are formed on the second main surface of the AlN substrate, the amount of light emitted from the second main surface can be increased.

The GaN substrate described above is adapted to have n-type conductivity by oxygen doping, the oxygen concentration may be in the range of $1E17/cm^3$ to $2E19/cm^3$, and the thickness of the GaN substrate may be 100 μm to 600 μm.

By setting the oxygen concentration to be at least $1E17/cm^3$, specific resistance of the GaN substrate can be improved, the current introduced from the p-electrode can sufficiently spread over the GaN substrate, and the light can be generated fully utilizing the width of the active layer. By setting the oxygen concentration to at most $2E19/cm^3$, transmittance of at least 60% can be ensured for the light having the wavelength of 450 nm, so that transmittance of the GaN substrate as the light emitting surface can be improved and high optical output is obtained. The above-described range of oxygen concentration is particularly effective when the thickness of GaN substrate is in the range of 100 μm to 600 μm in the structure mounted with the p-side facing down.

Further, it is possible to set the oxygen concentration to be in the range of $5E18/cm^3$ to $2E19/cm^3$, the thickness of the GaN substrate to be in the range of 200 μm to 400 μm, and both sides of the rectangular light emitting surface of the second main surface to have the length of at most 10 mm.

By this structure, light emission from the entire light emitting surface is realized, and sufficient optical output can be attained.

Further, the oxygen concentration may be in the range of $3E18/cm^3$ to $5E18/cm^3$, the thickness of the GaN substrate may be in the range of 400 μm to 600 μm, and both sides of the rectangular light emitting surface of the second main surface may have the length of at most 3 mm. Alternatively, the oxygen concentration may be in the range of $5E18/cm^3$ to $5E19/cm^3$, the thickness of the GaN substrate may be in the range of 100 μm to 200 μm, and both sides of the rectangular light emitting surface of the second main surface may have the length of at most 3 mm.

By appropriately selecting the oxygen concentration and the chip size in accordance with the thickness of the GaN substrate, more suitable GaN substrate can be set in view of performance (uniform emission from entire surface, emission efficiency), in accordance with the chip size. Further, most desirable conditions can be set in view of manufacturing cost.

In order to improve crystal characteristic of most of the regions of the GaN substrate described above, a GaN substrate having dislocation fluxes distributed at the density of at most $4E6/cm^2$ in average over the first main surface of the GaN substrate may be used, with the dislocation flux formed by concentrating dislocations, which are generated unavoidably when the substrate is formed, discretely as strings and distributing along the thickness of the substrate.

By this structure, light emitting devices having optical output of a prescribed value or higher can be manufactured with high production yield.

The dislocation fluxes may be distributed at the density of at most $4E2/cm^2$ in average over the first main surface, and both sides of the rectangular light emitting surface of the second main surface may have the length of at least 200 μm and at most 400 μm.

In a small light emitting device as described above, when dislocation fluxes exist, characteristics of the device degrades inevitably, directly resulting in lower production yield. By lowering the density of dislocation fluxes as described above, the production yield can be maintained in a practically tolerable range.

Further, a structure may be used in which between the GaN substrate and the n-type $Al_xGa_{1-x}N$ layer 3 ($0 \leq x \leq 1$), an n-type AlGaN buffer layer is positioned in contact with the GaN substrate, an n-type GaN buffer layer is positioned in contact with this n-type AlGaN buffer layer and an n-type $Al_xGa_{1-x}N$ layer ($0 \leq x \leq 1$) is positioned in contact with the n-type GaN buffer layer.

In the hetero epitaxial stacked structure such as described above, between the GaN substrate and the n-type $Al_xGa_{1-x}N$ layer ($0 \leq x \leq 1$) as a clad layer of the active layer, the n-type AlGaN buffer layer and the n-type GaN buffer layer may be arranged as described above.

By adding not only the n-type GaN buffer layer but also the n-type AlGaN buffer layer between the GaN substrate and the clad layer, a hetero epitaxial stacked structure having good crystal characteristic can be formed.

It is particularly preferable to use the stacked structure described above when the GaN substrate has a region where the off-angle is 0.10° or smaller and a region where the off-angle is 1.0° or larger.

By this structure, even when the GaN substrate is warped and the off-angle fluctuates as described above, a hetero epitaxial stacked structure having superior crystal characteristic can be obtained by arranging the n-type AlGaN buffer layer in addition to the n-type GaN layer.

A structure may be possible that dislocation fluxes are distributed in the GaN substrate while the dislocation fluxes are not propagated to the epitaxial layer positioned on the n-type GaN buffer layer positioned in contact with the n-type AlGaN buffer layer, and the n-type AlGaN buffer layer.

By this structure, even when a GaN substrate having high dislocation flux density is used, production yield can be increased significantly. Specifically, as the n-type AlGaN buffer layer and the n-type GaN buffer layer are arranged, the dislocation flux can substantially be eliminated in the epitaxial stacked structure including the light generating layer. Specifically, by the n-type AlGaN buffer layer and the n-type GaN buffer layer, the dislocation flux can be terminated in the GaN substrate or near the layer immediately thereabove.

A p-type GaN buffer layer positioned in contact with and on the down side of the p-type $Al_xGa_{1-x}N$ layer ($0 \leq x \leq 1$), and a p-type InGaN contact layer positioned in contact with the p-type GaN buffer layer may be provided.

By this structure, a p-type InGaN contact layer having superior electric conductivity can be arranged as an underlying layer where the p-electrode is mounted, and therefore, it becomes less necessary to select the material of the p-electrode considering work function and the like as the most important factors. Therefore, it becomes possible, for example, to select the material of the p-electrode considering reflectance as the most important factor.

The Mg concentration of the p-type InGaN contact layer may be set within the range of $1E18/cm^3$ to $1E21/cm^3$.

By this structure, sufficient electric conduction can be attained, and the current introduced to the p-electrode can be spread fully over the epitaxial film.

A structure may be employed in which a p-electrode formed of Ag, Al or Rh is provided in contact with the p-type InGaN contact layer.

By this structure, reflectance at the mounting portion, that is, the bottom portion of the light emitting device can be increased and the loss of light can be reduced, whereby optical output can be increased.

The GaN substrate described above may have a plate-shaped crystal inversion region extending continuously in the thickness direction and in the plane of the GaN substrate, the plate-shaped crystal inversion region in the GaN substrate and the plate-shaped crystal inversion region propagated to the n-type and p-type nitride semiconductor layers formed on the GaN substrate may be removed from the side of the p-type nitride semiconductor layer through the n-type nitride semiconductor layer to reach the GaN substrate, and in contact with the p-type nitride semiconductor layer left after the removal, a p-electrode may be formed for each p-type nitride semiconductor layer.

By this structure, the surface from which light is taken out can be increased, and hence, optical output can be improved.

In the foregoing, the plate-shaped crystal inversion region may be removed to a position in the GaN substrate using a KOH solution.

When the plate-shaped crystal inversion region is removed by the KOH solution, a photo mask is unnecessary, and this process can advantageously be performed simultaneously with the process of roughening the second main surface of the nitride semiconductor substrate. Therefore, the manufacturing cost of the structure can be reduced by using the KOH solution.

First p-electrodes arranged in a discrete manner in contact with and over the surface of the above-described p-type nitride semiconductor layer, and second p-electrodes formed of Ag, Al or Rh filling the space between the first p-electrodes and covering the p-type nitride semiconductor layer and the first p-electrodes may be provided.

By this structure, the current introduced to the p-electrodes can sufficiently be spread in the plane, and the optical output can be improved with enhanced reflectance.

The ratio of coverage of the first p-electrodes arranged in the discrete manner covering the surface of p-type nitride semiconductor layer may be in the range of 10% to 40%.

By this structure, the introduced current can be spread in the plane while ensuring sufficient electric conduction. If the ratio of coverage is smaller than 10%, it is impossible to cause the current flow entirely over the epitaxial layer. If the ratio exceeds 40%, undesirable influence of the p-electrode layers arranged in a discrete manner on the efficiency of taking out light would not be negligible.

By arranging a fluorescent plate immediately above the nitride semiconductor substrate serving as the light emitting portion of a device mounted with p-side facing down, the light reflected by the back surface of the fluorescent plate is again reflected by the surface of the nitride semiconductor substrate and directed toward the fluorescent plate, and as a result, optical output can be improved.

The surface of the fluorescent plate opposite to the second main surface of the nitride semiconductor substrate may be processed to have protrusions and recesses.

This structure further improves efficiency of taking out light.

The light emitting device may have electrostatic discharge resistance of 3000V or higher.

The nitride semiconductor substrate described above may function as a grounding member releasing the electric power to the ground, for a transient voltage or electrostatic discharge. The nitride semiconductor substrate having high electric conductivity may function as a grounding member for grounding a high voltage, in order to protect the light emitting device against the high voltage, such as the transient voltage or electrostatic discharge applied between the nitride semiconductor substrate and the p-type $Al_xGa_{1-x}N$ layer mounted with the p side facing down. Therefore, a protection circuit such as a power shunt circuit including a zenner diode to cope with the transient voltage or electrostatic discharge becomes unnecessary. The transient voltage and electrostatic discharge are main causes of malfunctions of circuits based on III group nitride semiconductors, and if the nitride semiconductor substrate has high electric conductivity as described above, it may be used as a grounding member, whereby the number of manufacturing steps can significantly be reduced and the manufacturing cost can be reduced.

The light emitting device described above is adapted to emit light when a voltage up to 4 V is applied. By using a nitride semiconductor substrate having high electric conductivity, that is, small electric resistance, it becomes possible to introduce current sufficient to cause light emission by applying a low voltage, and to attain light emission. Therefore, the number of necessary cells can be reduced, which leads to reduction in size, weight and cost of the illuminating apparatus incorporating the light emitting device. It is also effective to suppress power consumption.

The thickness of the nitride semiconductor substrate may be at least 50 μm.

In this structure, when electrons are caused to flow through an n-electrode as a point or having a small area, the electrons dissipate from the surface and wider to the inside of the n-type nitride semiconductor substrate. Therefore, a thick GaN substrate or the n-type nitride semiconductor substrate is desirable. If the thickness of the substrate is smaller than 50 μm and the area of n-electrode is made small, the current can not sufficiently spread when reaching the active layer of the quantum well structure, and in the active layer, some portions would not emit light, or emit light insufficiently. When the thickness of the substrate is made 50 μm or more, because of low electric resistance, the current spreads sufficiently in the substrate even when the area of n-electrode is made small, and light emitting portion in the active layer can sufficiently be enlarged. Thickness of at least 75 μm is more preferable. When the substrate is made too thick, however, absorption by the substrate would not be negligible, and therefore, the thickness should be at most 500 μm.

On the second main surface of the nitride semiconductor substrate, electrodes may be provided at the aperture ratio of at least 50%.

By this structure, efficiency of light emission from the second main surface can be improved. The larger the aperture ratio, the higher the optical output, as the amount of light absorbed by the n-electrodes decreases. Therefore, aperture ratio should more preferably be at least 75% and most preferably at least 90%.

The contact area between the electrode formed on the nitride semiconductor substrate and the nitride semiconductor substrate may be set to 0.055 mm² or larger.

Further, the bonding wire electrically connecting the electrode to the lead frame may have a cross-sectional area of at least 0.002 mm².

By this structure, the device can be operated without any influence of heat generation at the wire portion, up to the current of 2 A.

The bonding wire electrically connecting the electrode to the lead frame may have a cross-sectional area of at least 0.07 mm².

By this structure, the device can be operated without any influence of heat generation at the wire portion, up to the current of about 70 A.

The electrodes may be positioned separately at two or more corners of the nitride semiconductor substrate, the total contact area between the electrodes and the nitride semiconductor substrate may be at least 0.055 mm² and total cross-sectional area of the bonding wires connecting the lead frame to the electrodes positioned at the corners may be at least 0.002 mm².

In this arrangement, there is almost no portion that would hinder emission of light, when the light is taken out from the semiconductor chip.

The total cross-sectional area of the bonding wires electrically connecting the lead frame to the electrodes positioned at the corners may be at least 0.07 mm².

This arrangement improves efficiency of optical output, while almost eliminating any portion that hinders extraction of light.

The area of the portion emitting light of the second main surface may be at least 0.25 mm².

With this size, it becomes possible to arrange a prescribed number of light emitting devices described above, to be applied widely as replacement of existing illumination apparatus. If the area of light emitting portion is smaller than 0.25 mm², the number of light emitting devices to be used would be too large, and hence, it is difficult to use the device as a replacement of an existing illumination apparatus. The light emitting portion of the embodiment of the present invention is a nitride compound semiconductor substrate, which should desirably be as large as possible, as long as the current can spread sufficiently widely. This means that when the electrical resistance becomes lower, the light emitting area can be made wider. By way of example, when the nitride compound semiconductor substrate has specific resistance of 0.01 $\Omega \cdot cm$, the size can be set to about 8 mm×8 mm, as in Example F of the invention.

Further, the size of the portion emitting light of the second main surface of nitride semiconductor substrate described above may be at least 1 mm×1 mm. The size of the portion emitting light of the second main surface of nitride semiconductor substrate described above may be 3 mm×3 mm or larger. Further, size of the portion emitting light of the second main surface of nitride semiconductor substrate described above may be 5 mm×5 mm or larger.

As described above, by enlarging the area of light emitting surface, the number of light emitting devices mounted on an illumination apparatus can be reduced, and therefore, the number of process steps, the number of parts and components and power consumption can be reduced. Here, the size of "at least 1 mm×1 mm" includes "1 mm×1 mm."

The efficiency of light emission of the light emitting device lowers when temperature increases, and when temperature increases excessively, the light emitting device would be damaged. Therefore, temperature or heat resistance is an important design factor. Conventionally, heat resistance has been set at approximately 60° C./W (Japanese Patent Laying-Open No. 2003-8083 described above). By setting the heat resistance at 30° C./W as described above, however, the efficiency of light emission is not significantly degraded or the light emitting device is not damaged even when sufficient power is input to the light emitting device. It becomes possible for the first time to reduce the heat resistance by half as described above, by using the GaN substrate having low specific resistance as described above.

Further in the light emitting device, the temperature of the portion where the temperature increases most in continuously light emitting state can be set to 150° C. or lower.

By this structure, sufficiently high efficiency of light emission can be ensured with the temperature of the portion where the temperature increases most in continuously light emitting state, that is, the portion of light generating layer kept at 150° C. or lower. Further, life of the device can be made significantly longer than a conventional light emitting device.

Preferably, the thickness of the n-type nitride semiconductor layer is at most 3 μm.

The n-type nitride semiconductor layer is epitaxially grown on the nitride semiconductor layer, and if it is made too thick, it takes a long time for film formation and material cost increases. By setting the thickness of n-type nitride semiconductor layer to at most 3 μm as described above, the cost can significantly be reduced. More preferably, the thickness should be at most 2 μm.

Portions of the second main surface of the nitride semiconductor substrate that are not covered by the electrodes may be made rough.

This prevents the problem that the light generated in the light generating layer is confined within the substrate because of total reflection, lowering efficiency of light emission. The side surfaces of the stacked structure may also be made rough.

The surface to be made rough may be roughened by using at least one alkali solution including potassium hydroxide (KOH) solution, sodium hydroxide (NaOH) solution, ammonia ($NH_3$) solution and so on.

By the roughening described above, only the N surface of the GaN substrate can be processed to have large protrusions and recesses with high efficiency. The Ga surface is not etched.

The surface to be made rough may be roughened by using at least one acid solution including sulfuric acid ($H_2SO_4$) solution, hydrochloric acid (HCl) solution, phosphoric acid ($H_3PO_4$) solution, hydrofluoric acid (HF) solution and so on.

Further, the surface to be made rough may be roughened by reactive ion etching (RIE). Thus, rough surface with superior dimensional accuracy in its area can be obtained through a dry process. Further, by combining RIE as dry etching or wet etching using alkali solution with photolithography technique, prescribed spaces between the protrusions and recesses can be attained.

The electrode formed on the p-type nitride semiconductor layer may be formed of a material having the reflectance of at least 0.5.

A fluorescent plate may be arranged to cover the second main surface of the nitride semiconductor substrate described above. Further, in the light emitting device described above, the fluorescent plate may be arranged opposite to and spaced from the second main surface of the nitride semiconductor substrate. Further, the surface of the fluorescent plate facing the second main surface of the nitride semiconductor substrate may be processed to have protrusions and recesses. Further, either an impurity or defects that cause fluorescence may be included in the nitride semiconductor substrate.

These structures all provide white LEDs.

The light emitting device in accordance with the present invention may include two or more of the light emitting devices described above, and the light emitting devices may be connected in series.

By the structure described above, a lighting apparatus can be obtained, which has a plurality of highly efficient light emitting devices mounted on a lead frame or the like. By way of example, a car battery voltage is about 12 V, and therefore, four or more stages of the light emitting devices of the present invention can be connected in series for light emission.

Another light emitting device in accordance with the present invention may include two or more of the light emitting devices described above, and the light emitting devices may be connected in parallel.

By the structure described above, a lighting apparatus including a plurality of highly efficient light emitting devices can be obtained, which uses a high current source.

A structure including still another light emitting devices of the present invention and a power supply circuit for causing emission of light from the light emitting devices may be possible, in which two or more parallel units each including two or more light emitting devices connected in parallel are connected in series to the power supply circuit.

By this structure, it becomes possible to adjust the balance between the capacity of lighting apparatus and the capacity of power supply, while light emitting condition for each light emitting device is satisfied. In the power supply circuit described above, for variable capacity adjustment of the lighting apparatus, a parallel/serial switching portion may be provided, which parallel/serial switching portion switches the line of application to the light emitting devices.

The light emitting device in accordance with the present invention uses a nitride semiconductor substrate having high electrical conductivity and employs a structure having trenches and mounted with the p-side facing down, and as a result, the following effects are attained: (1) the device comes to have superior heat radiation so that high output of light emission can be attained without the necessity of providing complicated electrode structure; (2) the device comes to have superior electric conductivity, so that protection circuit for protecting the light emitting device from transient voltage or electrostatic discharge becomes unnecessary, while light emission from large area becomes possible and high electrostatic discharge resistance can be attained; (3) there is no discontinuity of refractive index from high to low from the light generating layer to the substrate, so that total reflection is unlikely from the light generating layer to the emitting layer, and hence, decrease of efficiency or degradation of resin at a side surface derived from the total reflection can be avoided; (4) the device emits light with low voltage, so that a large capacity power source is unnecessary, and hence it is particularly suitable for a lighting apparatus for a car; (5) the device has a simple structure, and therefore, it is inexpensive and easy to manufacture, and maintenance is also easy. Therefore wide application to various and many lighting and illumination apparatuses including a lighting apparatus for a car is expected.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A light emitting device, comprising:
    a nitride semiconductor substrate and, on a first main surface of said nitride semiconductor substrate, an n-type nitride semiconductor layer, a p-type nitride semiconductor layer positioned further than said n-type nitride semiconductor layer viewed from said nitride semiconductor substrate, and a light generating layer positioned between said n-type nitride semiconductor layer and said p-type nitride semiconductor layer;
    wherein specific resistance of said nitride semiconductor substrate is at most 0.5 Ω·cm;
    the side of said p-type nitride semiconductor layer is mounted face-down and the light is emitted from a second main surface that is opposite to the first main surface of said nitride semiconductor substrate;
    a trench is formed in the second main surface of said nitride semiconductor substrate;
    said nitride semiconductor substrate is adapted to have n-type conductivity by oxygen doping, and an oxygen concentration in the range of $2E18/cm^3$ to $2E19/cm^3$;
    a two-dimensional shape of said nitride semiconductor substrate is a rectangle;
    a length of one side of the two-dimensional shape of said nitride semiconductor substrate is at least 1 mm and at most 4 mm;
    said trench has a V shaped cross section;
    a depth of said trench is at least 0.1 mm and at most 0.3 mm;
    a thickness of said nitride semiconductor substrate in the thickness direction where said trench is not formed is at least 0.2 mm and at most 0.4 mm; and
    n-electrodes are disposed only at four corners of the second main surface of the nitride semiconductor substrate.

2. The light emitting device according to claim 1, wherein an angle formed by a sidewall of said trench and said second main surface of said nitride semiconductor substrate is at least 40° and at most 80°.

3. The light emitting device according to claim 1, wherein on said second main surface of said nitride semiconductor substrate, another trench is formed extended in the same direction as the direction of extension of said trench; and
    pitch between said trench and said another trench in the direction vertical to the direction of extension of the trenches is at most 1 mm.

4. The light emitting device according to claim 1, wherein sidewall of said trench includes a sidewall portion continuous from the bottom of said trench and another sidewall portion positioned on said sidewall portion; and
    an angle formed by the sidewall portion and said second main surface is different from an angle formed by said another sidewall portion and said second main surface.

5. The light emitting device according to claim 1, wherein said nitride semiconductor substrate is a GaN substrate;
    on said second main surface of said nitride semiconductor substrate, at least one, another trench extended in the same direction as the direction of extension of said trench and at least one trench of different direction extending in a direction crossing said trench are formed;
    pitch between said trench and said another trench in the direction vertical to the direction of extension of the trenches is at most 1 mm; and
    a portion of said second main surface of said nitride semiconductor substrate sectioned by said trench, said another trench and said trench of different direction has a shape selected from the group consisting of polygonal cone, a circular cone, and a semi-sphere.

6. The light emitting device according to claim 1, wherein at least a portion of said second main surface of said nitride semiconductor substrate has recesses.

* * * * *